US009022293B2

(12) United States Patent
Osada et al.

(10) Patent No.: US 9,022,293 B2
(45) Date of Patent: May 5, 2015

(54) SEMICONDUCTOR DEVICE AND POWER RECEIVING DEVICE

(75) Inventors: Takeshi Osada, Isehara (JP); Hikaru Tamura, Isehara (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 853 days.

(21) Appl. No.: 11/896,006

(22) Filed: Aug. 29, 2007

(65) Prior Publication Data

US 2008/0210762 A1 Sep. 4, 2008

(30) Foreign Application Priority Data

Aug. 31, 2006 (JP) ................................. 2006-237047

(51) Int. Cl.
*G06K 19/06* (2006.01)
*G06K 19/07* (2006.01)
*G06K 19/077* (2006.01)

(52) U.S. Cl.
CPC ........ *G06K 19/0723* (2013.01); *G06K 19/0701* (2013.01); *G06K 19/0705* (2013.01); *G06K 19/0724* (2013.01); *G06K 19/07767* (2013.01); *G06K 19/07779* (2013.01); *G06K 19/07783* (2013.01)

(58) Field of Classification Search
USPC ................................................. 235/487, 492
See application file for complete search history.

(56) References Cited

U.S. PATENT DOCUMENTS 4,717,905 A * 1/1988 Morrison et al. ............. 340/447
5,300,875 A * 4/1994 Tuttle ............................ 320/138
6,127,799 A    10/2000 Krishnan
6,223,990 B1   5/2001 Kamei
6,509,217 B1   1/2003 Reddy
6,615,074 B2 * 9/2003 Mickle et al. ................. 600/509
6,624,743 B1   9/2003 Ikefuji et al.

(Continued)

FOREIGN PATENT DOCUMENTS

EP     1 022 677      7/2000
JP     07-236204 A    9/1995

(Continued)

OTHER PUBLICATIONS

Search Report (Application No. 07016907.3) dated Dec. 8, 2009.

*Primary Examiner* — Paultep Savusdiphol
(74) *Attorney, Agent, or Firm* — Eric J. Robinson; Robinson Intellectual Property Law Office, P.C.

(57) ABSTRACT

An object is to provide a semiconductor device that is capable of wireless communication, such as an RFID tag, which can transmit and receive individual information without checking remaining capacity of a battery or changing batteries due to deterioration with time in the battery for a drive power supply voltage, and maintain a favorable a transmission/reception state even when electric power of an electromagnetic wave from a reader/writer is not sufficient. The semiconductor device includes a signal processing circuit, a first antenna circuit connected to the signal processing circuit, an antenna circuit group, a rectifier circuit group and a battery connected to the signal processing circuit. The first antenna circuit transmits and receives a signal for transmitting data stored in the signal processing circuit and drives a power supply circuit, and each antenna circuit of the antenna circuit group receives a signal for charging the battery and includes an antenna which has a different corresponding frequency.

12 Claims, 37 Drawing Sheets

(56) References Cited

U.S. PATENT DOCUMENTS

| | | |
|---|---|---|
| 6,737,302 B2 | 5/2004 | Arao |
| 6,946,950 B1 * | 9/2005 | Ueno et al. ............... 340/10.1 |
| 7,373,133 B2 | 5/2008 | Mickle et al. |
| 7,434,739 B2 * | 10/2008 | Matsuura et al. ............ 235/492 |
| 7,440,780 B2 | 10/2008 | Mickle et al. |
| 7,518,267 B2 | 4/2009 | Baarman |
| 7,564,340 B2 | 7/2009 | Kowalski et al. |
| 7,567,824 B2 | 7/2009 | Mickle et al. |
| 7,768,405 B2 * | 8/2010 | Yamazaki et al. ......... 340/572.7 |
| 2002/0049714 A1 | 4/2002 | Yamazaki et al. |
| 2003/0032993 A1 * | 2/2003 | Mickle et al. .................. 607/60 |
| 2003/0199778 A1 * | 10/2003 | Mickle et al. ................ 600/509 |
| 2004/0128246 A1 | 7/2004 | Takayama et al. |
| 2004/0145454 A1 | 7/2004 | Powell et al. |
| 2005/0068009 A1 * | 3/2005 | Aoki .............................. 323/205 |
| 2005/0068019 A1 * | 3/2005 | Nakamura et al. ........... 323/355 |
| 2005/0126623 A1 * | 6/2005 | Rogler et al. ................. 136/253 |
| 2005/0162131 A1 | 7/2005 | Sennami et al. |
| 2005/0192727 A1 * | 9/2005 | Shostak et al. ................. 701/37 |
| 2005/0215119 A1 | 9/2005 | Kaneko |
| 2005/0254183 A1 * | 11/2005 | Ishida et al. .................... 361/18 |
| 2006/0009251 A1 | 1/2006 | Noda et al. |
| 2006/0128345 A1 | 6/2006 | Ootaka et al. |
| 2006/0151620 A1 * | 7/2006 | Usami et al. .................. 235/492 |
| 2006/0160517 A1 * | 7/2006 | Yoon ............................. 455/299 |
| 2006/0232419 A1 * | 10/2006 | Tomioka et al. ........... 340/572.7 |
| 2006/0237544 A1 * | 10/2006 | Matsuura et al. ............. 235/492 |
| 2006/0255945 A1 * | 11/2006 | Egbert ........................ 340/572.7 |
| 2007/0216348 A1 | 9/2007 | Shionoiri et al. |
| 2007/0229281 A1 | 10/2007 | Shionoiri et al. |
| 2008/0055047 A1 | 3/2008 | Osada et al. |
| 2008/0058029 A1 | 3/2008 | Sato et al. |
| 2008/0311850 A1 | 12/2008 | Ootaka et al. |
| 2009/0098915 A1 | 4/2009 | Mickle et al. |

FOREIGN PATENT DOCUMENTS

| | | |
|---|---|---|
| JP | 09-001968 | 1/1997 |
| JP | 10-307898 | 11/1998 |
| JP | 11-345292 A | 12/1999 |
| JP | 2000-090221 A | 3/2000 |
| JP | 2001-102839 A | 4/2001 |
| JP | 2002-231545 | 8/2002 |
| JP | 2002-236891 A | 8/2002 |
| JP | 2002-291176 A | 10/2002 |
| JP | 2003-006592 | 1/2003 |
| JP | 2003-070187 | 3/2003 |
| JP | 2003-218624 | 7/2003 |
| JP | 2003-299255 | 10/2003 |
| JP | 2004-343410 | 12/2004 |
| JP | 2005-150022 | 6/2005 |
| JP | 2005-210843 | 8/2005 |
| JP | 2005-293485 A | 10/2005 |
| JP | 2005-316724 | 11/2005 |
| JP | 2005-352434 | 12/2005 |
| JP | 2005-354888 | 12/2005 |
| JP | 2006-024087 | 1/2006 |
| JP | 2006-503376 | 1/2006 |
| JP | 2006-127363 A | 5/2006 |
| JP | 2006-185050 A | 7/2006 |
| JP | 2006-519580 | 8/2006 |
| WO | WO 97/00493 | 1/1997 |
| WO | WO 2004/021467 | 3/2004 |
| WO | WO 2004/034317 | 4/2004 |
| WO | WO-2004/073176 | 8/2004 |

* cited by examiner

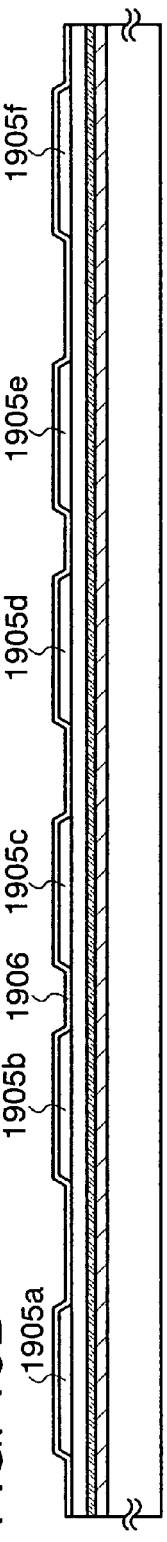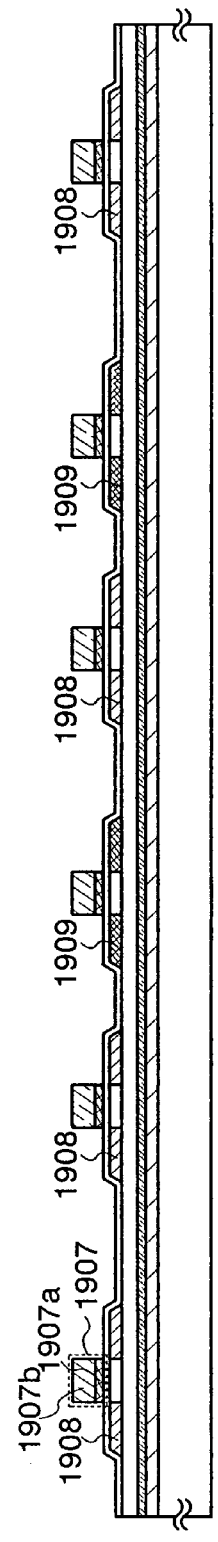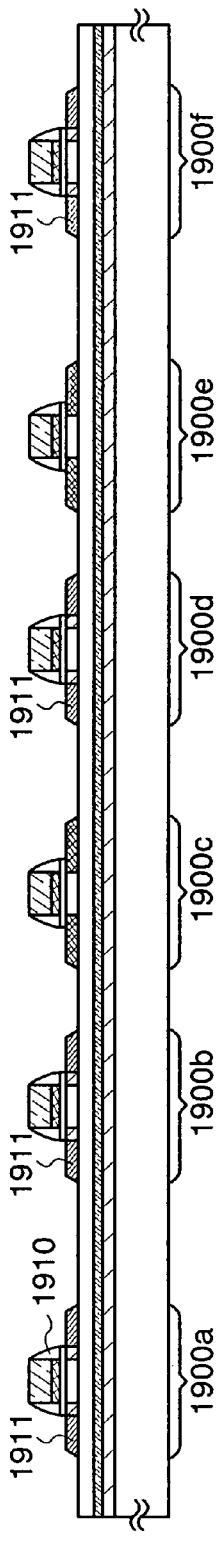

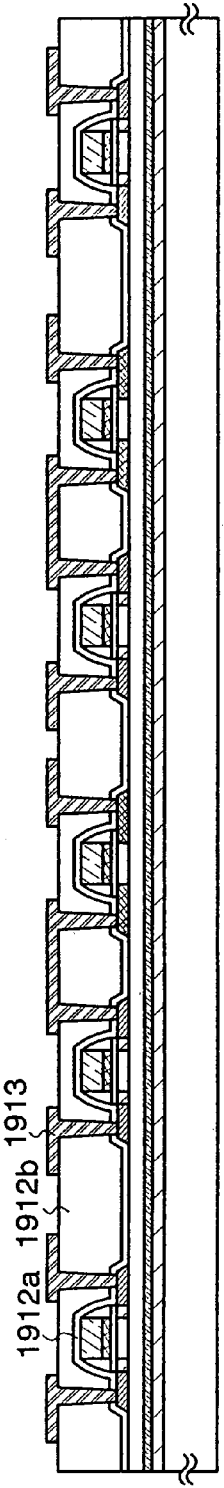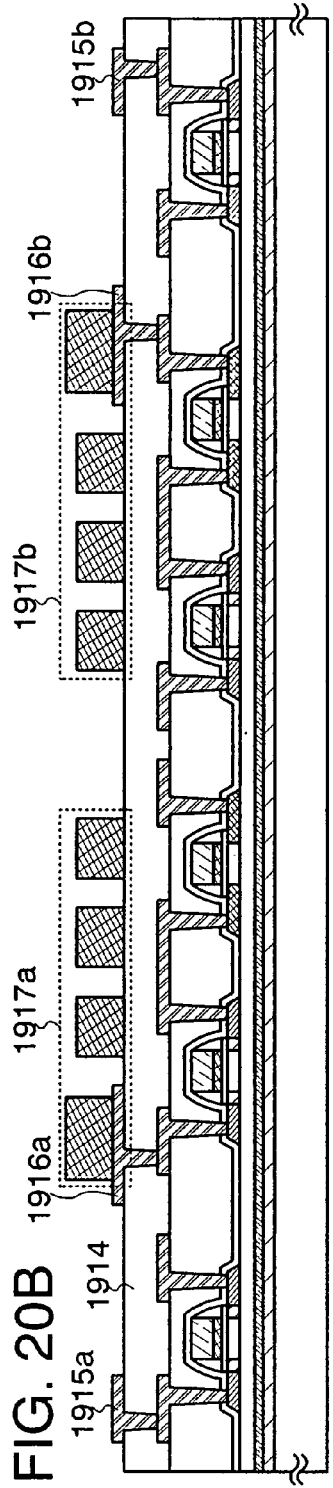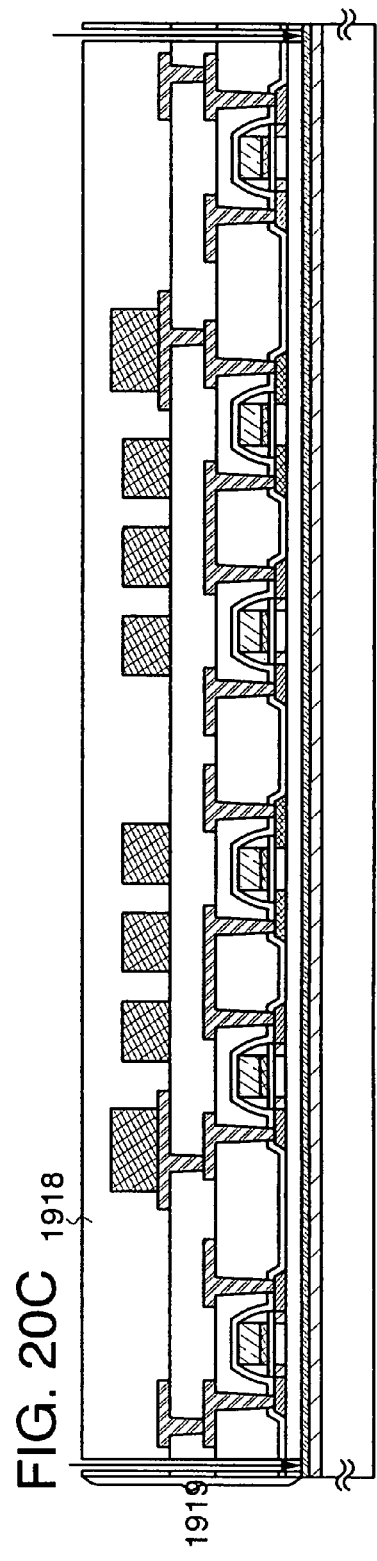

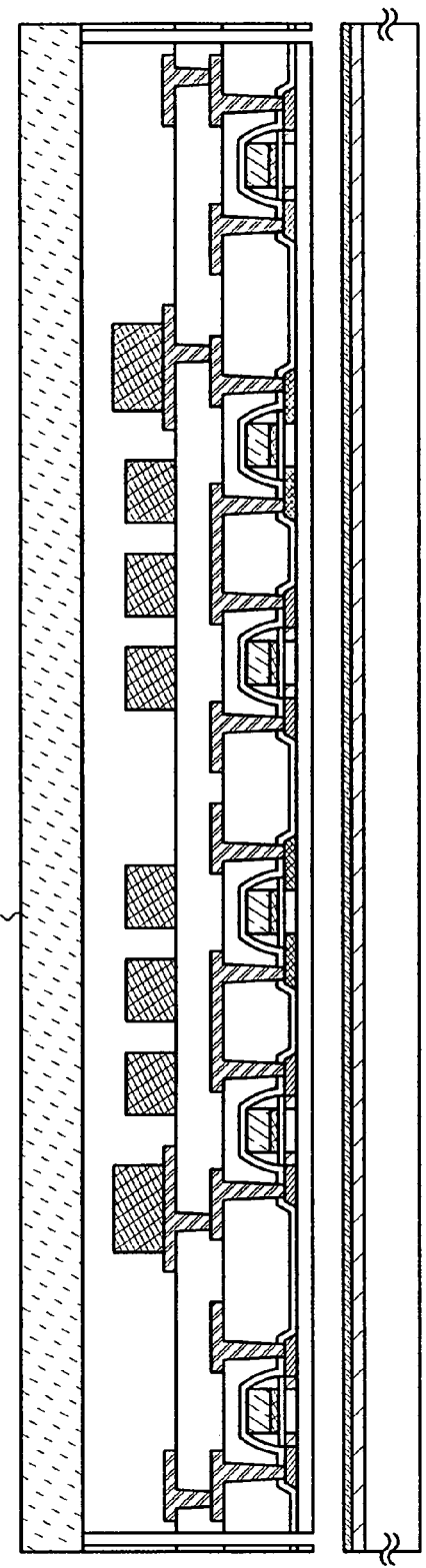
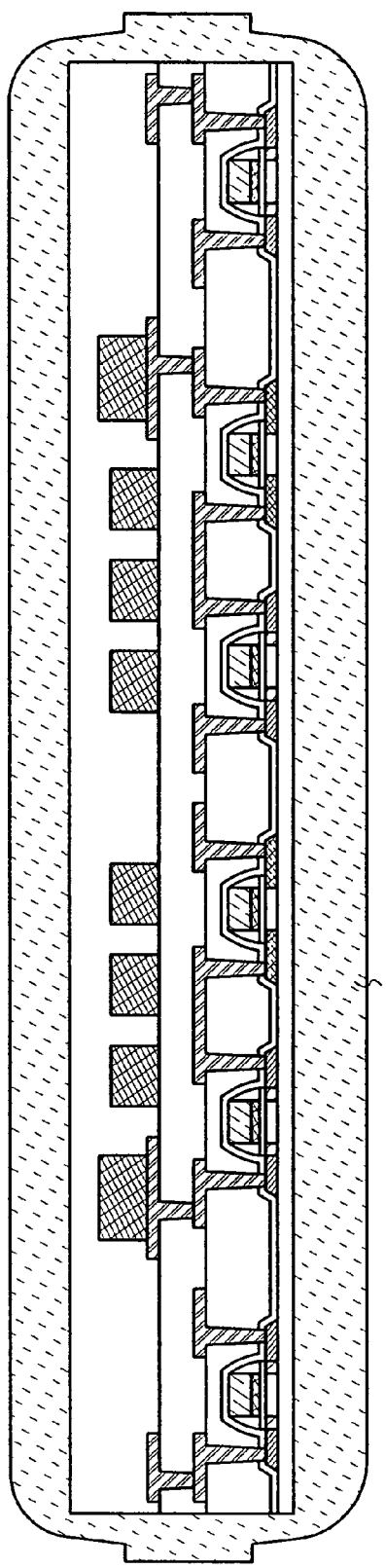
FIG. 21A
FIG 21B

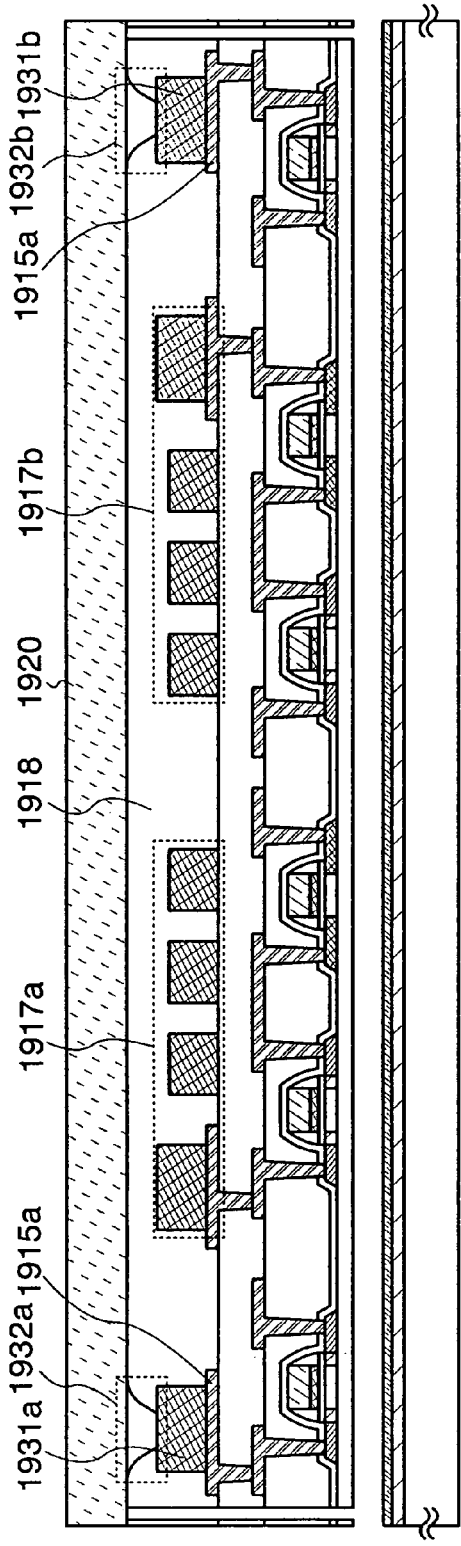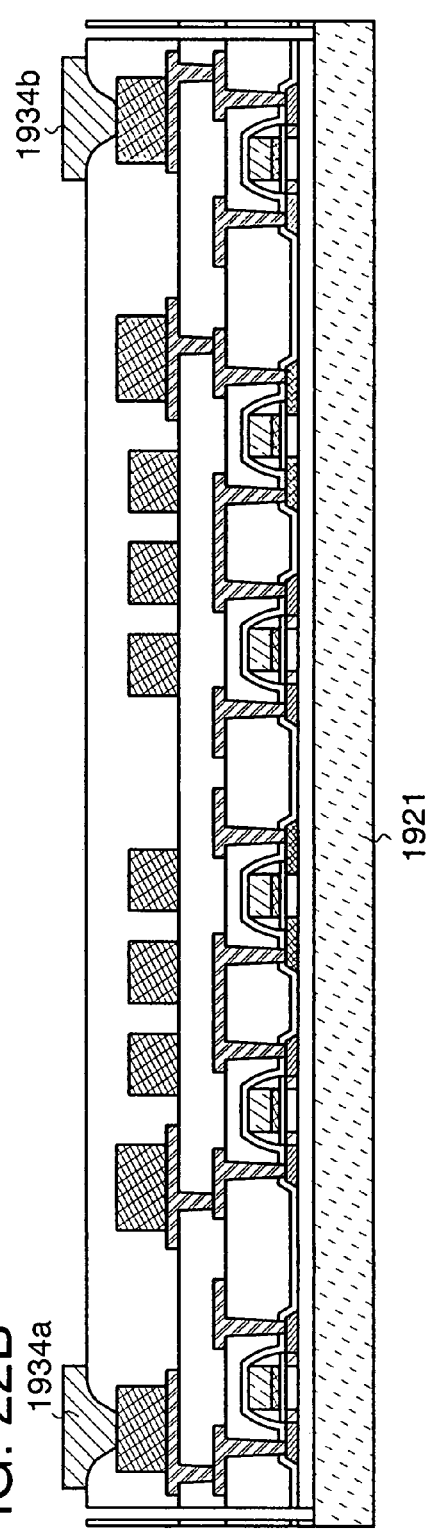

US 9,022,293 B2

SEMICONDUCTOR DEVICE AND POWER RECEIVING DEVICE

BACKGROUND OF THE INVENTION

1. Field of the Invention

The present invention relates to a semiconductor device and a power receiving device. In particular, the present invention relates to a semiconductor device and a power receiving device that transmit and receive data through a radio wave and wirelessly receive electric power.

2. Description of the Related Art

In recent years, an individual identification technology utilizing wireless communication such as radio waves or electromagnetic waves has attracted attention. In particular, as a semiconductor device which transmits and receives data by wireless communication, an individual identification technology utilizing an RFID (Radio Frequency Identification) tag has attracted attention. The RFID tag is also referred to as an IC (Integrated Circuit) tag, an IC chip, an RF (Radio Frequency) tag, a wireless tag, or an electronic tag. The individual identification technology utilizing an RFID tag or the like has started to be utilized for production, management, individual identification, or the like of individual objects.

RFID tags can be broadly classified into two types depending on whether a power supply is incorporated therein or power supply voltage is supplied from outside, that is, an active-type RFID tag incorporating a power supply capable of transmitting radio waves or electromagnetic waves including information on the RFID tag, and a passive-type RFID tag which is driven with the utilization of electric power of radio waves or electromagnetic waves (carrier waves) from outside (as for the active-type RFID, see Patent Document 1: Japanese Published Patent Application No. 2005-316724 and as for the passive-type RFID, see Patent Document 2: Japanese Translation of PCT International Application No. 2006-503376). Of them, the active-type RFID tag incorporates a power supply for driving the RFID tag and includes a battery as the power supply. As for the passive-type RFID tag, a structure is realized in which power supply voltage for driving the RFID tag is generated with the utilization of electric power of radio waves or electromagnetic waves (carrier waves) from outside and a battery is not provided.

FIG. 3 is a block diagram illustrating a specific structure of an active-type RFID tag (semiconductor device 3100). In the active-type semiconductor device 3100 shown in FIG. 3, a signal received by an antenna circuit 3101 is inputted to a demodulation circuit 3105 and an amplifier 3106 in a signal processing circuit 3102. A communication signal is usually transmitted after carrier waves with 13.56 MHz or 915 MHz are processed by ASK modulation or PSK modulation. It is to be noted that, in ASK modulation, a digital signal is expressed in difference in amplitude and modulated. In PSK modulation, a digital signal is expressed in difference in a phase of a carrier wave with a constant frequency and modulated. Here, an example of using a carrier wave with 13.56 MHz as a signal is described. In FIG. 3, a clock signal which functions as a reference is needed for processing the signal, and a carrier wave with 13.56 MHz is used as a clock signal. The amplifier 3106 amplifies the carrier wave with 13.56 MHz and supplies it to a logic circuit 3107 as a clock signal. In addition, the ASK-modulated signal or the PSK-modulated signal is demodulated by the demodulation circuit 3105. The demodulated signal is transmitted to the logic circuit 3107 to be analyzed. The signal analyzed by the logic circuit 3107 is transmitted to a memory control circuit 3108, a memory circuit 3109 is controlled by the memory control circuit 3108 based on this signal, and data stored in the memory circuit 3109 is extracted to be transmitted to the logic circuit 3110. The data is amplified by the amplifier 3111 after being encoded by the logic circuit 3110, and a carrier wave is modulated by the modulation circuit 3112 based on the signal. On the other hand, electric power of the semiconductor device 3100 in FIG. 3 is supplied through a power supply circuit 3104 by a battery 3103 provided outside the signal processing circuit 3102. Then, the power supply circuit 3104 supplies electric power to the amplifier 3106, the demodulation circuit 3105, the logic circuit 3107, the memory control circuit 3108, the memory circuit 3109, the logic circuit 3110, the amplifier 3111, the modulation circuit 3112, and the like.

FIG. 4 is a block diagram illustrating a specific structure of a passive-type RFID tag (semiconductor device 3200). In the passive-type semiconductor device 3200 shown in FIG. 4, a signal received by an antenna circuit 3201 is inputted to a demodulation circuit 3205 and an amplifier 3206 in a signal processing circuit 3202. A communication signal is usually transmitted after carrier waves with 13.56 MHz or 915 MHz are processed by ASK modulation or PSK modulation. Here, an example of using a carrier wave with 13.56 MHz as a signal is described. In FIG. 4, a clock signal which functions as a reference is needed for processing the signal, and a carrier wave with 13.56 MHz is used as a clock signal. The amplifier 3206 amplifies the carrier wave with 13.56 MHz and supplies it to a logic circuit 3207 as a clock signal. In addition, the ASK-modulated signal or the RSK-modulated signal is demodulated by the demodulation circuit 3205. The demodulated signal is transmitted to the logic circuit 3207 to be analyzed. The signal analyzed by the logic circuit 3207 is transmitted to a memory control circuit 3208, a memory circuit 3209 is controlled by the memory control circuit 3208 based on this signal, and data stored in the memory circuit 3209 is extracted to be transmitted to the logic circuit 3210. The data is amplified by the amplifier 3211 after being encoded by the logic circuit 3210, and a carrier wave is modulated by the modulation circuit 3212 based on the signal. On the other hand, electric power of the semiconductor device 3200 in FIG. 4 is supplied in such a manner that a signal inputted to a rectifier circuit 3203 is rectified and inputted to a power supply circuit 3204. Then, the power supply circuit 3204 supplies electric power to the amplifier 3206, the demodulation circuit 3205, the logic circuit 3207, the memory control circuit 3208, the memory circuit 3209, the logic circuit 3210, the amplifier 3211, the modulation circuit 3212, and the like.

On the other hand, various electronic devices are coming into wide use, and a wide variety of products are in the marketplace. In particular, in recent years, the spread of portable electronic devices has been marked. For example, mobile phones, digital video cameras, and the like have become very convenient because of high-definition display portions, increased durability of batteries, and further reduction in power consumption of the batteries. A portable electronic device has a structure in which a battery that is a power receiving means is incorporated as a power supply for driving the portable electronic device, and electric power is secured by the battery. As matters now stand, as a battery, a secondary battery (hereinafter referred to as a battery) such as a lithium ion battery is used, and the battery is charged from an AC adaptor which is plugged into a household AC power supply that is a power supply means (see Patent Document 3: Japanese Published Patent Application No. 2005-150022).

It is to be noted that an electronic device provided with a battery includes a bicycle, a motor vehicle (including electric vehicles and other transportation devices driven by electric power regardless of four-wheel vehicles or two-wheel vehicles), or the like that is a transportation device.

SUMMARY OF THE INVENTION

However, as shown in FIG. 3, there has been a problem in that, in an active-type RFID tag, a battery is exhausted with time according to transmission and reception of individual information or strength setting of a radio wave that is needed for transmission and reception thereof, and eventually, electric power that is needed for transmission and reception of individual information cannot be generated. Therefore, there has been a problem in that remaining capacity of a battery is needed to be checked or changing of batteries is needed for a semiconductor device such as an active-type RFID tag.

In addition, as shown in FIG. 4, there has been a problem in that, in a passive-type RFID tag, transmission to and reception from a long distance or securing of electric power for transmitting radio waves which is needed for transmission and reception of a signal is difficult and realization of a favorable transmission state and reception state is difficult. Therefore, there has been a problem in that the use of a semiconductor device such as a passive-type RFID tag is limited to the case where distance from an antenna of a reader/writer that is a power supply voltage supply means is close so that supply of electric power can be sufficiently secured by radio waves or electromagnetic waves (carrier waves) from outside.

On the other hand, frequency in use of movable electronic devices such as mobile phones and digital video cameras has been increasing; however, capacitance of a battery corresponding to used hours and improvement of durability and reduction in power consumption are limited. Furthermore, for charging a battery that is a power supply incorporated into a mobile phone and a digital video camera, there has not been any methods other than charging from a charger through an AC adaptor via a household AC power supply or from a commercially available primary battery. Therefore, charging is complicated for users and users need to move carrying an AC adaptor or a primary battery that is a power feeding means.

In addition, in motor vehicles which are movable electronic devices, battery charging is performed by a combustion engine. However, ignition of a spark plug by electric power charged to a battery is needed to start up the combustion engine. Therefore, when the battery is gone flat due to the motor vehicle not being used for a certain period of time, ignition of the spark plug cannot be performed, and in order to start up the combustion engine, it is necessary to conduct direct supply of electric power from outside the vehicle with the use of a cable, which is disadvantageous in terms of safety and convenience.

Furthermore, for charging by a household AC power supply using an AC adaptor or charging by a commercially available primary battery, it is necessary to provide a relay terminal as a portion which conducts electricity to the battery in a movable electronic device. Therefore, the relay terminal is exposed to outside or the relay terminal is exposed to outside through a protective portion. Accordingly, there has been a problem in that malfunction occurs when the relay terminal is broken or defective.

The present invention provides a semiconductor device such as an RFID tag that is capable of reducing deterioration with time of a battery used for a driving power supply, transmitting and receiving individual information, and favorably maintaining a transmission state and reception state of individual information even in the case where electric power of electromagnetic waves (carrier waves) from outside is not sufficient.

According to the present invention, in order to solve the above-described problems, a power storage portion including a battery (also referred to as a secondary battery) or a capacitor is provided as a power supply that supplies electric power, in a semiconductor device such as an RFID tag. Furthermore, according to the present invention, as a means of supplying electric power to the power storage portion including the battery or the capacitor, a plurality of antennas for wirelessly charging the power storage portion including the battery or the capacitor is provided, separately from an antenna for transmitting and receiving individual information to and from outside and a rectifier circuit corresponding to each antenna is provided.

According to one feature of the present invention, a semiconductor device that is capable of wireless communication includes a signal processing circuit, a first antenna circuit that is connected to the signal processing circuit, a second antenna circuit, and a power storage portion that is connected to the signal processing circuit, where the signal processing circuit includes a first rectifier circuit that is connected to the first antenna circuit and a second rectifier circuit that is connected to the second antenna circuit; the first antenna circuit transmits a signal including data stored in the signal processing circuit or receives a signal including data to be stored in the signal processing circuit; the second antenna circuit receives electric power for charging the power storage portion; the second rectifier circuit is connected to a charging circuit; and the first antenna circuit and the second antenna circuit have different corresponding frequency bands.

According to another feature of the present invention, a semiconductor device that is capable of wireless communication includes a signal processing circuit, a first antenna circuit that is connected to the signal processing circuit, a second antenna circuit, and a power storage portion that is connected to the signal processing circuit, where the signal processing circuit includes a first rectifier circuit that is connected to the first antenna circuit and a second rectifier circuit that is connected to the second antenna circuit; the first antenna circuit transmits a signal including data stored in the signal processing circuit and receives a signal including data to be stored in the signal processing circuit; the second rectifier circuit is connected to a charging circuit; and the second antenna circuit receives electric power for charging the power storage portion and includes an antenna with a length that is different from that included in the first antenna circuit.

According to another feature of the present invention, a semiconductor device that is capable of wireless communication includes a signal processing circuit, a first antenna circuit that is connected to the signal processing circuit, an antenna circuit group including a plurality of antenna circuits, and a power storage portion that is connected to the signal processing circuit, where the signal processing circuit includes a first rectifier circuit that is connected to the first antenna circuit and a plurality of rectifier circuits each of which is connected to each of the plurality of antenna circuits of the antenna circuit group, where one of the plurality of antenna circuits is connected to one of the plurality of rectifier circuits and one of the plurality of rectifier circuits is connected to one of the plurality of antenna circuits; the first antenna circuit transmits a signal including data stored in the signal processing circuit and receives a signal including data to be stored in the signal processing circuit; the plurality of rectifier circuits is connected to a charging circuit; the antenna circuit group receives electric power for charging the power storage portion and includes antennas each of which has a different length.

According to another feature of the present invention, a semiconductor device that is capable of wireless communication includes a signal processing circuit, a first antenna circuit that is connected to the signal processing circuit, an antenna circuit group including a plurality of antenna circuits, and a power storage portion that is connected to the signal processing circuit, where the signal processing circuit includes a first rectifier circuit that is connected to the first antenna circuit and a plurality of rectifier circuits each of which is connected to each of the plurality of antenna circuits of the antenna circuit group, where one of the plurality of antenna circuits is connected to one of the plurality of rectifier circuits and one of the plurality of rectifier circuits is connected to one of the plurality of antenna circuits; the first antenna circuit transmits a signal including data stored in the signal processing circuit to a reader/writer and receives a signal including data to be stored in the signal processing circuit from the reader/writer; the plurality of rectifier circuits is connected to a charging circuit; and the antenna circuit group receives electric power for charging the power storage portion from an outside wireless signal and includes antennas each of which has a different length.

According to another feature of the present invention, a semiconductor device that is capable of wireless communication includes a signal processing circuit, a first antenna circuit that is connected to the signal processing circuit, an antenna circuit group including a plurality of antenna circuits, and a power storage portion that is connected to the signal processing circuit, where the signal processing circuit includes a first rectifier circuit that is connected to the first antenna circuit and a plurality of rectifier circuits each of which is connected to each of the plurality of antenna circuits of the antenna circuit group; one of the plurality of antenna circuits is connected to one of the plurality of rectifier circuits and one of the plurality of rectifier circuits is connected to one of the plurality of antenna circuits; the first antenna circuit transmits a signal including data stored in the signal processing circuit to a reader/writer and receives a signal including data to be stored in the signal processing circuit from the reader/writer; the plurality of rectifier circuits is connected to a charging circuit; the antenna circuit group receives electric power for charging the power storage portion from an outside wireless signal; and the first antenna circuit and each of the antenna circuits included in the antenna circuit group have different corresponding frequency bands.

According to another feature of the present invention, a semiconductor device that is capable of wireless communication includes a signal processing circuit, a first antenna circuit that is connected to the signal processing circuit, an antenna circuit group including a plurality of antenna circuits, and a power storage portion that is connected to the signal processing circuit, where the signal processing circuit includes a first rectifier circuit that is connected to the first antenna circuit and a plurality of rectifier circuits each of which is connected to each of the plurality of antenna circuits of the antenna circuit group; one of the plurality of antenna circuits is connected to one of the plurality of rectifier circuits and one of the plurality of rectifier circuits is connected to one of the plurality of antenna circuits; the first antenna circuit transmits a signal including data stored in the signal processing circuit and receives a signal including data to be stored in the signal processing circuit; the plurality of rectifier circuits is connected to a charging circuit; the charging circuit is connected to a power storage portion through a charging/discharging circuit; and the antenna circuit group receives electric power for charging the power storage portion and includes antennas each of which has a different length.

According to another feature of the present invention, a semiconductor device that is capable of wireless communication includes a signal processing circuit, a first antenna circuit that is connected to the signal processing circuit, an antenna circuit group including a plurality of antenna circuits, and a power storage portion that is connected to the signal processing circuit, where the signal processing circuit includes a first rectifier circuit that is connected to the first antenna circuit and a plurality of rectifier circuits each of which is connected to each of the plurality of antenna circuits of the antenna circuit group; one of the plurality of antenna circuits is connected to one of the plurality of rectifier circuits and one of the plurality of rectifier circuits is connected to one of the plurality of antenna circuits; the first antenna circuit transmits a signal including data stored in the signal processing circuit to a reader/writer and receives a signal including data to be stored in the signal processing circuit from the reader/writer; the plurality of rectifier circuits is connected to a charging circuit; the charging circuit is connected to the power storage portion through a charging/discharging circuit; and the antenna circuit group receives electric power for charging the power storage portion from an external wireless signal and includes antennas each of which has a different length.

According to another feature of the present invention, a semiconductor device that is capable of wireless communication includes a signal processing circuit, a first antenna circuit that is connected to the signal processing circuit, an antenna circuit group including a plurality of antenna circuits, and a power storage portion that is connected to the signal processing circuit, where the signal processing circuit includes a first rectifier circuit that is connected to the first antenna circuit and a plurality of rectifier circuits each of which is connected to each of the plurality of antenna circuits of the antenna circuit group; one of the plurality of antenna circuits is connected to one of the plurality of rectifier circuits and one of the plurality of rectifier circuits is connected to one of the plurality of antenna circuits; the first antenna circuit transmits a signal including data stored in the signal processing circuit to a reader/writer and receives a signal including data to be stored in the signal processing circuit from the reader/writer; the plurality of rectifier circuits is connected to a charging circuit; the charging circuit is connected to the power storage portion through a charging/discharging circuit; the antenna circuit group receives electric power for charging the power storage portion from an external wireless signal; and the first antenna circuit and each of the antenna circuits included in the antenna circuit group have different corresponding frequency bands.

It is preferable that, in the present invention employing the above-described structure, the power storage portion supply electric power to a power supply circuit included in the signal processing circuit.

It is preferable that, in the present invention employing the above-described structure, the first antenna circuit and any of the plurality of antenna circuits receive a signal by an electromagnetic induction method.

It is preferable that, in the present invention employing the above-described structure, the power storage portion include any one of or both a battery and a capacitor.

According to another feature of the present invention, a power receiving device includes a plurality of antenna circuits, a signal processing circuit, and a power storage portion, where the signal processing circuit includes a plurality of rectifier circuits each of which is connected to each of the plurality of antenna circuits; the plurality of antenna circuits wirelessly receives electric power for charging the power storage portion through the signal processing circuit; and the plurality of rectifier circuits is connected to a charging circuit.

According to another feature of the present invention, a power receiving device includes a plurality of antenna circuits, a signal processing circuit, and a power storage portion, where the signal processing circuit includes a plurality of rectifier circuits each of which is connected to each of the plurality of antenna circuits; the plurality of antenna circuits wirelessly receives electric power for charging the power storage portion through the signal processing circuit; the plurality of rectifier circuits is connected to a charging circuit; and electric power is supplied by a power feeder, so that the power receiving is performed.

According to another feature of the present invention, a power receiving device includes a plurality of antenna circuits, a signal processing circuit, and a power storage portion, where the signal processing circuit includes a plurality of rectifier circuits each of which is connected to each of the plurality of antenna circuits; the plurality of antenna circuits wirelessly receives electric power for charging the power storage portion through the signal processing circuit; the plurality of rectifier circuits is connected to a charging circuit; and the charging circuit is connected to the power storage portion through a charging/discharging circuit.

It is preferable that, in the present invention employing the above-described structure, any of the plurality of antenna circuits receive a signal by an electromagnetic induction method.

It is preferable that, in the present invention employing the above-described structure, the charging storage portion include any one of or both a battery and a capacitor.

It is preferable that, in the present invention employing the above-described structure, the battery be any of a lithium battery, a nickel metal hydride battery, a nickel cadmium battery, or an organic radical battery.

It is to be noted that description "being connected" in the present invention includes electrical connection and direct connection. Therefore, in structures disclosed in the present invention, another element capable of electrical connection (e.g., a switch, a transistor, a capacitor, an inductor, a resistor, a diode, or the like) may be interposed between elements having a predetermined connection relation. Alternatively, the elements may be directly connected without another element interposed therebetween. It is to be noted that the state where the connection is directly performed without any element capable of electrical connection interposed therebetween, which is the state including only the state of direct connection except for the state where the connection is electrically performed, is described as "being directly connected". It is to be noted that description "being electrically connected" includes either the state where the connection is electrically performed or the state where the connection is directly performed.

It is to be noted that a transistor in the present invention can employ various modes. Thus, types of transistors applicable to the present invention are not limited. Therefore, a thin film transistor (TFT) using a non-single crystal semiconductor film typified by an amorphous silicon film or a polycrystalline silicon film, a transistor formed using a semiconductor substrate or an SOI substrate, a MOS transistor, a junction transistor, or a bipolar transistor, a transistor using a compound semiconductor such as ZnO or a-InGaZnO, a transistor using an organic semiconductor or a carbon nanotube, or another transistor can be employed. In addition, hydrogen or halogen may be contained in a non-single crystal semiconductor film. Moreover, as a substrate which is used for forming a transistor is provided, various types of substrates can be used without limitation to a specific type. Therefore, a transistor can be formed using, for example, a single crystal substrate, an SOI substrate, a glass substrate, a quartz substrate, a plastic substrate, a paper substrate, a cellophane substrate, a stone substrate, or the like. In addition, a transistor may be formed using one substrate, and then, the transistor may be transferred to another substrate.

As a structure of a transistor applied to a semiconductor device of the present invention, for example, a multi-gate structure may be employed. With the multi-gate structure, off current can be reduced, reliability can be improved by improvement in withstand voltage of the transistor, and change in drain-source current can be reduced even if a drain-source voltage changes when operating in a saturation region. In addition, a structure in which gate electrodes are formed above and below a channel may be used. With such a structure in which gate electrodes are formed above and below a channel, the area of a channel region can be enlarged to increase the value of current, and a depletion layer can be easily formed to decrease the S value. It is to be noted, here, the S value refers to the value of a gate voltage in a subthreshold region, which is required for changing drain current by one digit at a constant drain voltage. In addition, any of the following structures may be employed: a structure where a gate electrode is formed above a channel; a structure where a gate electrode is formed below a channel; a staggered structure; an inversely staggered structure; and a structure where a channel region is divided into a plurality of regions and connected in parallel or in series. In addition, a channel (or part of it) may overlap with a source electrode or a drain electrode. With a structure in which a channel (or part of it) overlaps with a source electrode or a drain electrode, unstable operation caused by charge accumulated in part of the channel can be prevented. In addition, an LDD region may be provided. When the LDD region is provided, off current can be reduced, reliability can be improved by improvement in withstand voltage of the transistor, and change in drain-source current can be reduced even if a drain-source voltage changes when operating in a saturation region.

It is to be noted that various types of transistors can be used as a transistor applied to a semiconductor device of the present invention and formed using various substrates as described above. Accordingly, all circuits may be formed over a glass substrate, a plastic substrate, a single crystal substrate, or an SOI substrate. When all the circuits included in the semiconductor device are formed over the same substrate, cost can be reduced by reduction in the number of components and reliability can be improved by reduction in the number of connection points with circuit components. Alternatively, one part of the circuits may be formed over one substrate and the other part of the circuits may be formed over another substrate. In other words, all circuits may not necessarily be formed over the same substrate. For example, one part of the circuits may be formed over a glass substrate, with the use of a transistor while the other part of the circuits may be formed as an IC chip over a single crystal substrate, and the IC chip may be connected to the glass substrate by COG (Chip On Glass). Alternatively, the IC chip may be connected to the glass substrate with the use of TAB (Tape Automated Bonding) or a printed circuit board. In this manner, when part of the circuits are formed over the same substrate, cost can be reduced by reduction in the number of components and reliability can be improved by reduction in the number of connection points with circuit components. In addition, a portion with high drive voltage or a portion with high drive frequency consumes a large amount of electric power. Thus, when these circuits are not formed over the same substrate, increase in electric power consumption can be prevented.

It is to be noted that a semiconductor device mentioned in this specification refers to a general device that can function by utilizing semiconductor characteristics. It is to be noted that a corresponding frequency band refers to a frequency band in which electric power received by an antenna circuit is greater than or equal to 90% and electric power reflected by the antenna circuit is less than or equal to 10%.

In this specification, a battery provided with an antenna, a circuit which charges a battery with electromotive force generated by an electromagnetic wave received by the antenna, and medium which supplies the electromotive force is referred to as an RF battery or a radio wave battery.

It is to be noted that, as for a radio wave or an electromagnetic wave that can be utilized for the present invention, frequency of a signal of 125 kHz, 13.56 MHz, 915 MHz, 2.45 GHz, and the like are given, and each of which is prescribed by the ISO standard. However, the frequency is not limited thereto, and any of the following can be used: a submillimeter wave of 300 GHz to 3 THz; a millimeter wave of 30 GHz to 300 GHz; a microwave of 3 GHz to 30 GHz; an ultrashort wave of 300 MHz to 3 GHz; a very short wave of 30 MHz to 300 MHz; a short wave of 3 MHz to 30 MHz; a medium wave of 300 kHz to 3 MHz; a long wave of 30 kHz to 300 kHz; and a very long wave of 3 kHz to 30 kHz.

It is to be noted that, in this specification, a battery is referred to as a secondary battery or a storage battery and refers to a device that converts electric energy obtained from an external power supply into chemical energy and extracts the energy again as electric power, according to need. In addition, a capacitor refers to a device in which two insulated conductors are close to each other, and one of the conductors is positively charged and the other conductor is negatively charged, so that charge is stored by attraction between the electricity thereof.

A semiconductor device and a power receiving device of the present invention each include a power storage portion, and thus, shortage of electric power for transmitting and receiving individual information, due to deterioration of a battery with time, can be prevented.

In addition, a semiconductor device and a power receiving device of the present invention include a plurality of antennas and a plurality of rectifier circuits for wirelessly supplying electric power to a power storage portion. Therefore, the power storage portion for supplying electric power for driving the semiconductor device and the power receiving device can be charged by an external electromagnetic wave, without directly connecting the semiconductor device and the power receiving device to a charger. As a result, unlike a conventional active-type RFID tag or the like, it is not necessary to check remaining capacity of a battery or change batteries, so that the semiconductor device and the power receiving device can be continued to be used for long periods of time and over the long term. In addition, electric power for driving an electronic device or the like equipped with the semiconductor device and the power receiving device is constantly held in a battery, so that enough electric power for driving the semiconductor device and the power receiving device can be obtained and a communication distance between a reader/writer and a power feeder can be increased.

Moreover, a semiconductor device and a power receiving device of the present invention are each provided with a plurality of antennas having different corresponding frequency bands. The plurality of antennas is connected to a power storage portion, so that the power storage portion is charged. Accordingly, electromagnetic waves having various frequency bands can be used as electric power and charging can be performed using radio waves efficiently.

Furthermore, one rectifier circuit is included corresponding to one antenna, so that impedance matching corresponding to each antenna can be easily performed. In addition, return loss is reduced, and thus, the battery can be efficiently charged.

BRIEF DESCRIPTION OF THE DRAWINGS

In the accompanying drawings:

FIGS. 19A to 19D are diagrams illustrating an example of a method for manufacturing a semiconductor device of the present invention;

FIGS. 20A to 20C are diagrams illustrating an example of a method for manufacturing a semiconductor device of the present invention;

FIGS. 21A and 21B are diagrams illustrating an example of a method for manufacturing a semiconductor device of the present invention;

FIGS. 22A and 22B are diagrams illustrating an example of a method for manufacturing a semiconductor device of the present invention;

DETAILED DESCRIPTION OF THE INVENTION

Embodiment Modes

Figure 1:
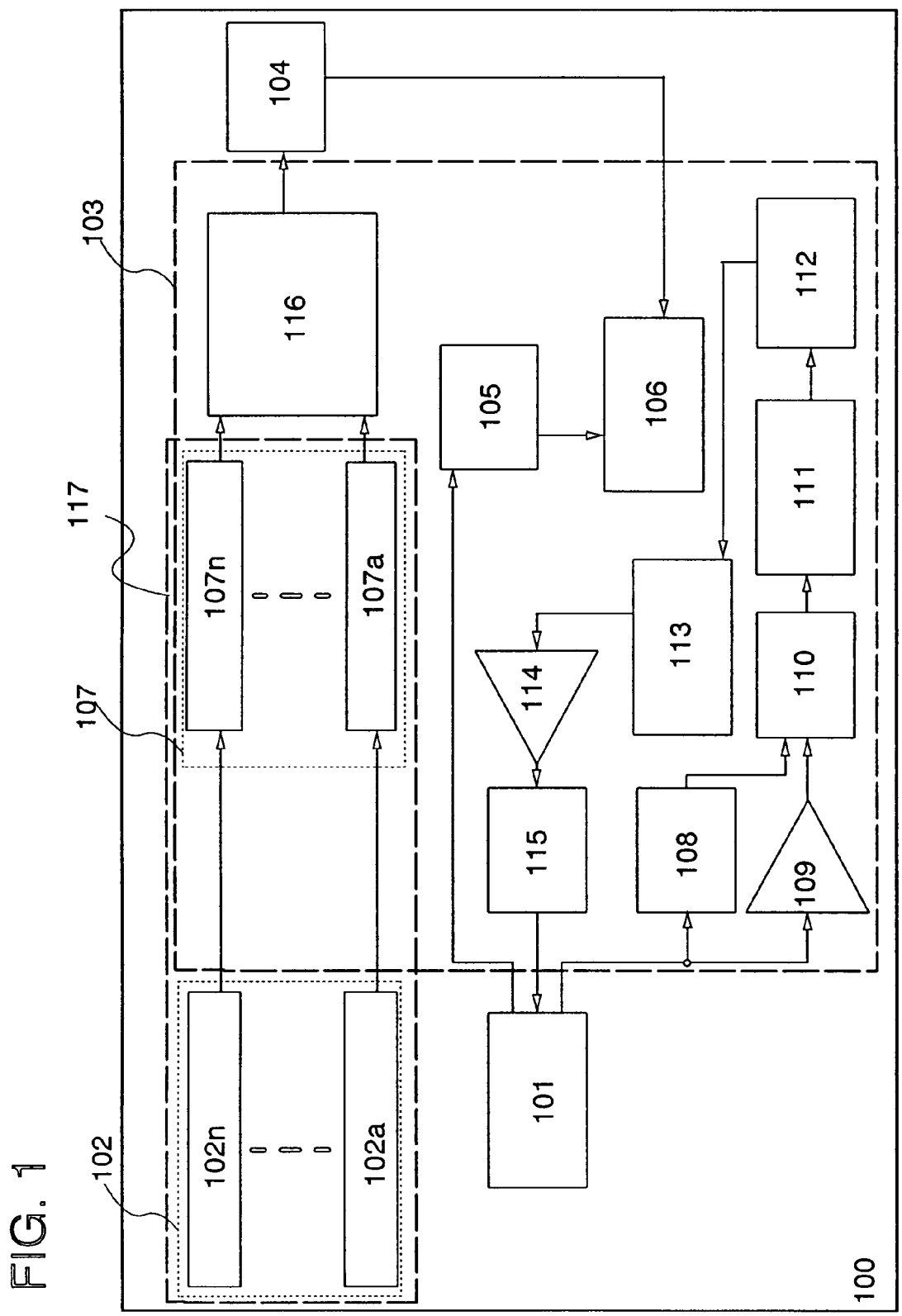
FIG. 1 is a diagram illustrating one structural example of a semiconductor device of the present invention.

Embodiment modes of the present invention will be hereinafter explained with reference to the accompanying drawings. However, the present invention can be carried out in many different modes, and it is easily understood by those skilled in the art that modes and details of the present invention can be modified in various ways without departing from the purpose and the scope of the present invention. Therefore, the present invention should not be interpreted as being limited to the description of Embodiment Modes. It is to be noted that, in structures of the present invention hereinafter described, the same portions or portions having similar functions are denoted by the same reference numerals, and repeated explanation thereof will be omitted.

Embodiment Mode 1

One structural example of a semiconductor device of the present invention will be explained with reference to block diagrams shown in FIGS. 1 and 2. It is to be noted that, in this embodiment mode, the case of utilizing a semiconductor device as an RFID tag or the like will be explained.

A semiconductor device 100 shown in FIG. 1 includes a first antenna circuit 101, a signal processing circuit 103, a battery 104, a charging circuit 116, and an antenna-rectifier circuit group 117. The signal processing circuit 103 includes a first rectifier circuit 105, a power supply circuit 106, a demodulation circuit 108, an amplifier 109, a logic circuit 110, a memory control circuit 111, a memory circuit 112, a logic circuit 113, an amplifier 114, and a modulation circuit 115. The antenna-rectifier circuit group 117 includes a pair of N-1 antenna-rectifier circuits including a pair of a second antenna circuit 102a and a second rectifier circuit 107a, or an antenna circuit group 102 and a rectifier circuit group 107. These antenna circuits and rectifier circuits are represented to be denoted by an N-th antenna circuit 102n and an N-th rectifier circuit 107n, respectively.

Figure 2:
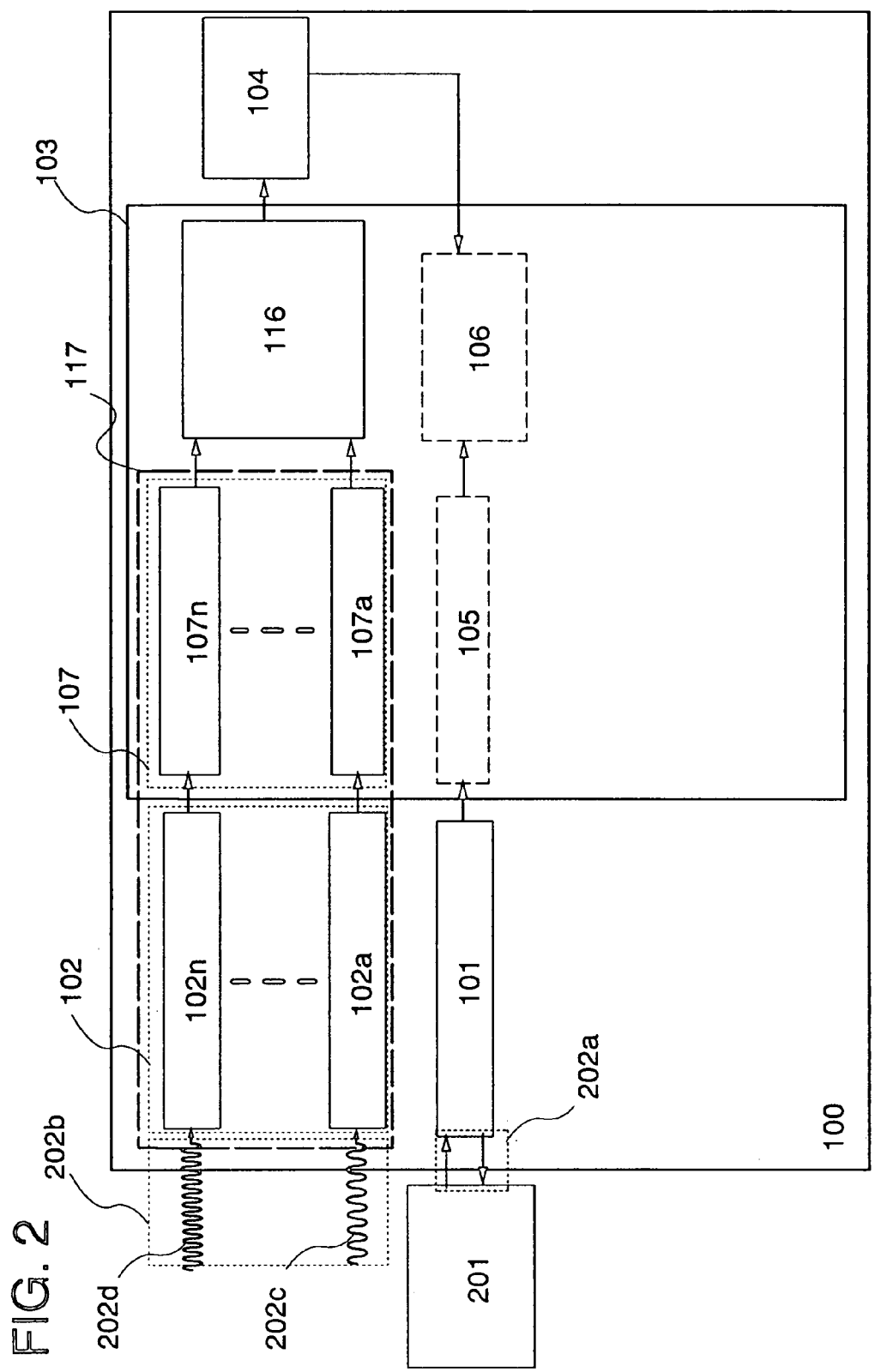
FIG. 2 is a diagram illustrating one structural example of a semiconductor device of the present invention.
Figure 3:
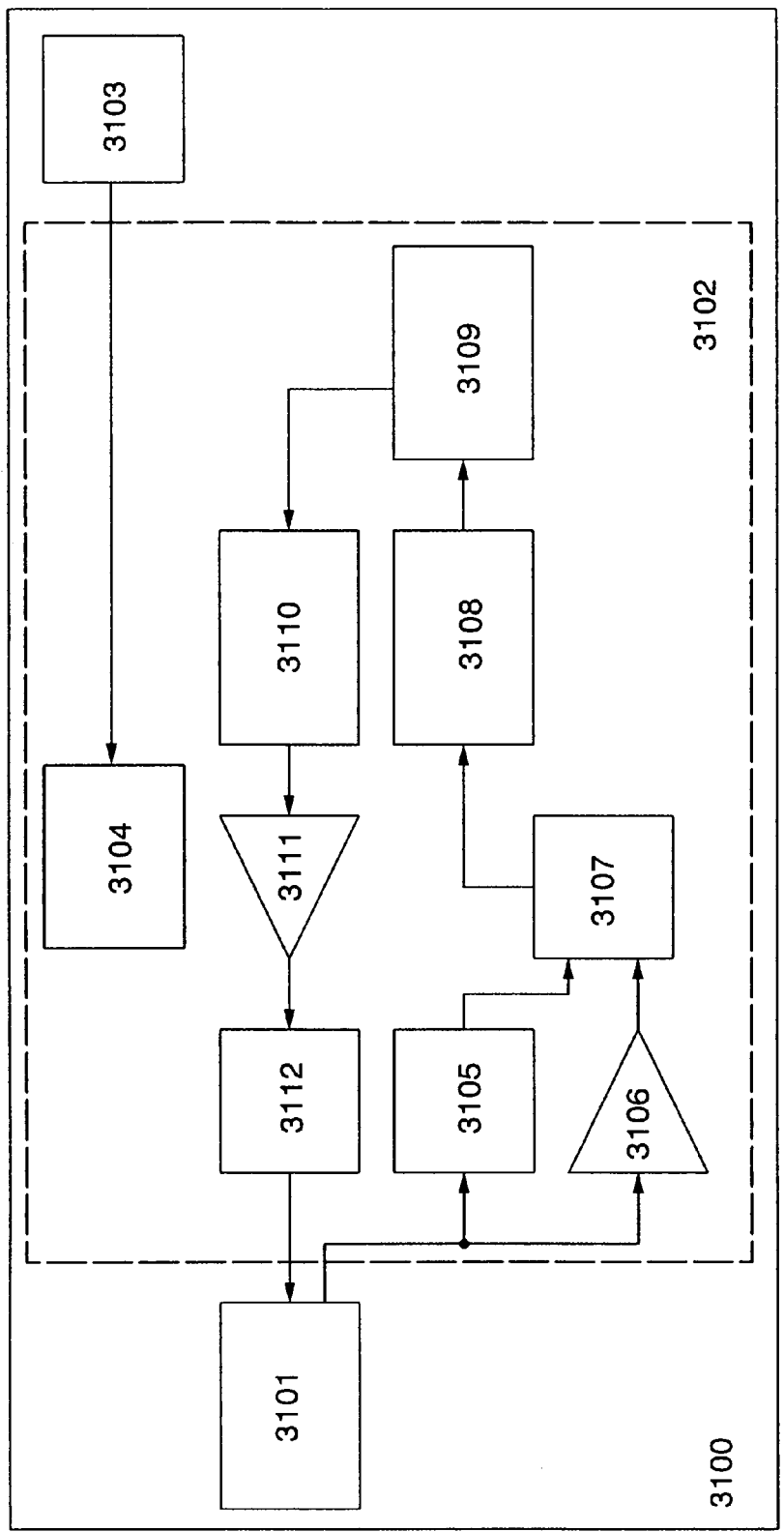
FIG. 3 is a diagram illustrating a structural example of a conventional semiconductor device.
Figure 4:
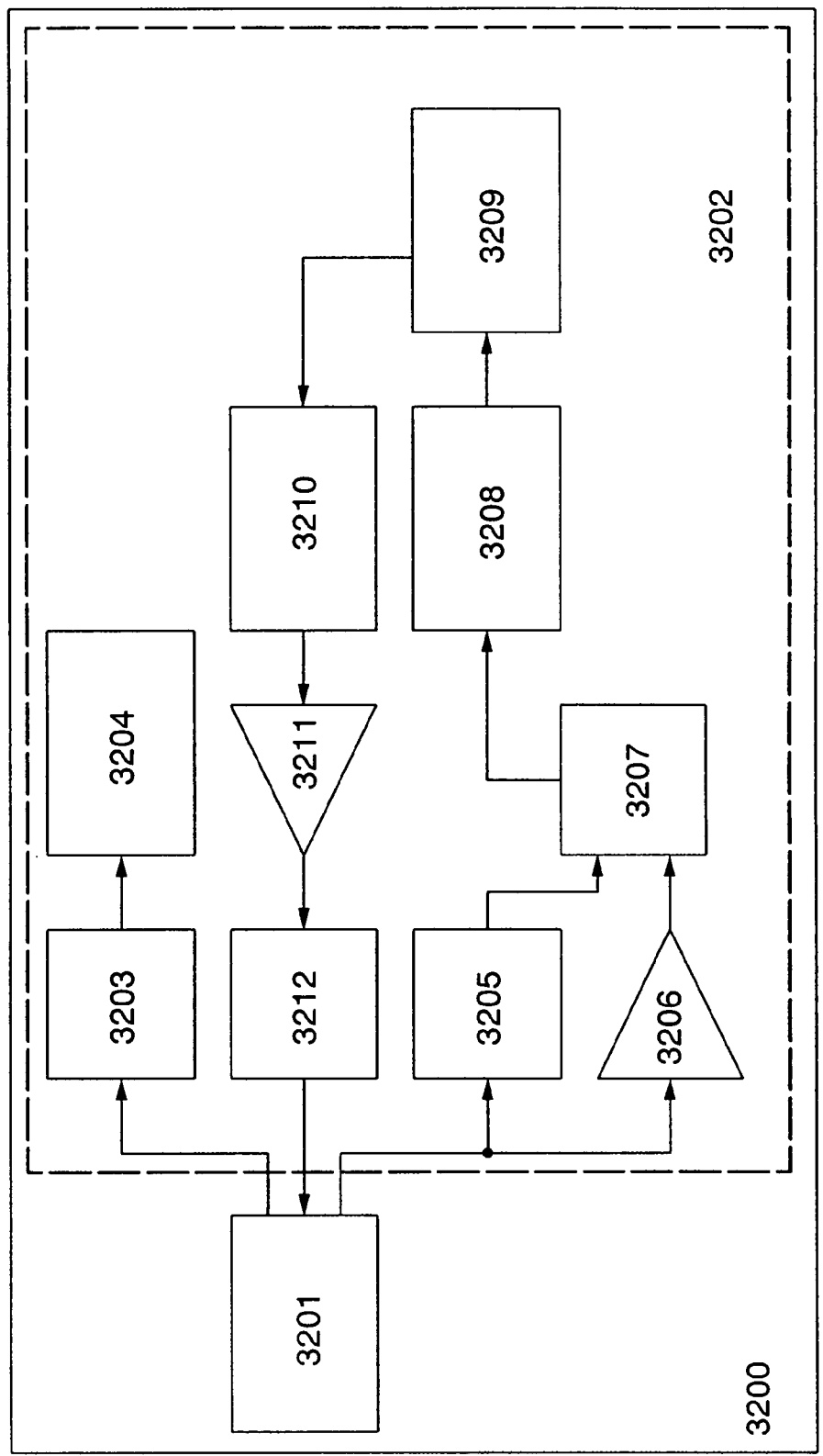
FIG. 4 is a diagram illustrating a structural example of a conventional semiconductor device.

FIG. 2 is a block diagram illustrating how the first antenna circuit 101 receives a radio wave 202a from a reader/writer 201, the first antenna circuit 101 transmits the radio wave 202a to the reader/writer 201, and the N-th antenna circuit 102n in the antenna-rectifier circuit group 117 receives an external radio wave 202b. In FIG. 2, the radio wave 202a received by the first antenna circuit 101 is inputted to the power supply circuit 106 through the first rectifier circuit 105 to supply electric power, and at the same time, data included in the radio wave 202a is extracted from the demodulation circuit 108 or the like (see FIG. 1). In addition, each of the radio waves 202b (a radio wave 202c or a radio wave 202d) received by the antenna-rectifier circuit group 117 is inputted to the charging circuit 116 through the N-th rectifier circuit 107n, and the battery 104 is charged.

In the semiconductor device 100 described in this embodiment mode, the external radio wave 202b received by the N-th antenna circuit 102n is inputted to the charging circuit 116 through the N-th rectifier circuit 107n and the battery 104 is charged, so that electric power is appropriately supplied to the power supply circuit 106 from the battery 104, according to need. That is, the battery 104 is wirelessly charged.

It is to be noted that the semiconductor device 100 described in this embodiment mode is characterized in that the external radio wave 202b (hereinafter, also referred to as a "wireless signal") is utilized as a radio wave received by the N-th antenna circuit 102n in order to charge the battery 104. For an external wireless signal, a radio wave of relay stations of mobile phones (800 to 900 MHz band, 1.5 GHz band, 1.9 to 2.1 GHz band, and the like); a radio wave generated from mobile phones; a radio wave of a radio wave clock (40 kHz and the like), a noise of a home AC power supply (60 Hz and the like), a radio wave randomly generated from another reader/writer (reader/writer which does not directly communicate with the semiconductor device 100), or the like can be used. Moreover, a plurality of antenna circuits including antennas with different lengths and different shapes is provided as the N-th antenna circuit 102n so that a frequency band of each antenna is different, and rectifier circuits corresponding to the plurality of antenna circuits are provided; accordingly, various wireless signals can be utilized for charging the battery 104.

In addition, the semiconductor device 100 does not need a separate charger, because the battery is charged utilizing an external wireless signal, whereby the semiconductor device can be operated at low cost. A plurality of antennas with various lengths and shapes which easily receive wireless signals are provided for the N-th antenna circuit 102n. The plurality of antennas with different lengths and shapes are provided, so that radio waves with various frequency bands can be received and electric power can be supplied. The first antenna circuit and any one of the N-th antenna circuits may receive a radio wave with the same frequency band.

Figure 5A:
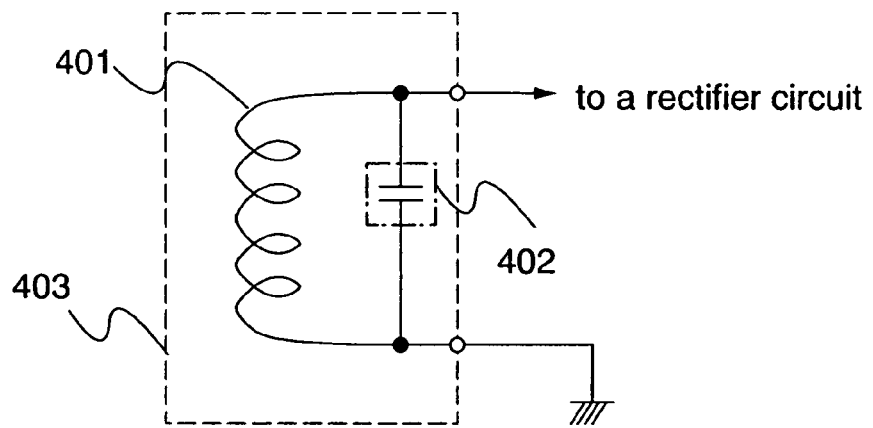
FIGS. 5A and 5B are diagrams each illustrating one example of an antenna circuit included in a semiconductor device of the present invention.
Figure 5B:
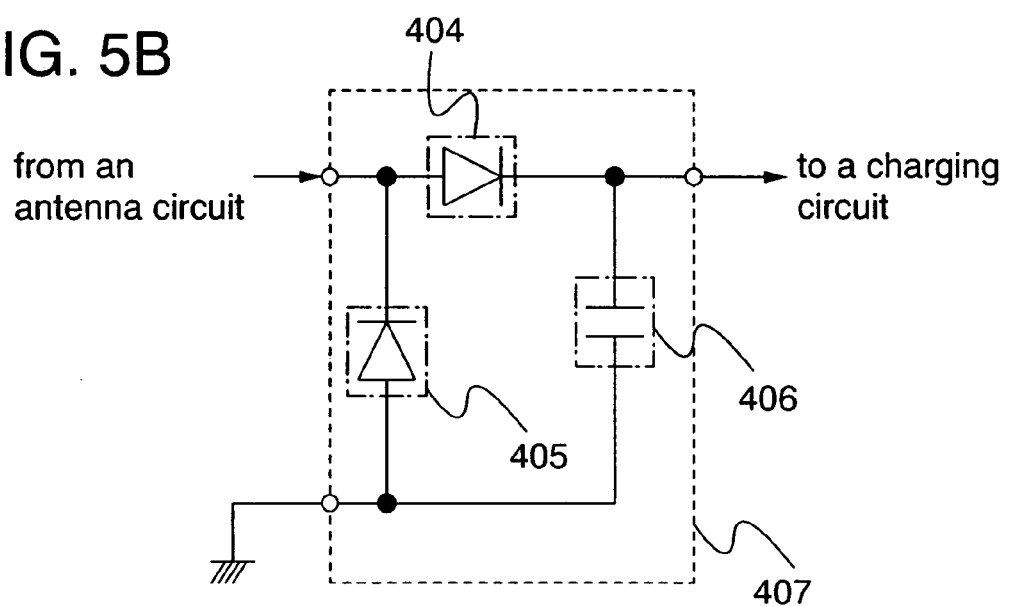

It is to be noted that the first antenna circuit 101 and each of the antenna circuits of the antenna circuit group 102 includes an antenna 401 and a resonance capacitor 402 as shown in FIG. 5A. In this specification, the combination of the antenna 401 and the resonance capacitor 402 is referred to as an antenna circuit 403. In addition, the first rectifier circuit 105 and each of the rectifier circuits in the rectifier circuit group 107 may be a circuit which converts an AC signal induced by an electromagnetic wave received by an antenna connected to each rectifier circuit (e.g., the N-th antenna circuit 102n which is connected to the N-th rectifier circuit 107n) into a DC signal. For example, as shown in FIG. 5B, a rectifier circuit 407 may include diodes 404 and 405 and a smoothing capacitor 406.

In addition, a shape of an antenna provided in the first antenna circuit 101 is not particularly limited. That is, a transmission method of a signal that is applied to the first antenna circuit 101 in the semiconductor device 100 can employ an electromagnetic coupling method, an electromagnetic induction method, a microwave method, and the like. The transmission method may be appropriately selected by a practitioner in consideration of an intended use. An antenna with an optimal length and shape may be provided in accordance with the transmission method.

In the case of employing, for example, an electromagnetic coupling method or an electromagnetic induction method (e.g., a 13.56 MHz band) as the transmission method, electromagnetic induction caused by a change in magnetic field density is used. Therefore, a conductive film functioning as an antenna is formed in an annular shape (e.g., a loop antenna) or a spiral shape (e.g., a spiral antenna).

In the case of employing a microwave method (e.g., a UHF band (860 to 960 MHz band), a 2.45 GHz band, or the like) as the transmission method, a length or a shape of the conductive film functioning as an antenna may be appropriately set in consideration of a wavelength of an electromagnetic wave used for signal transmission. The conductive film functioning as an antenna can be formed in, for example, a linear shape (e.g., a dipole antenna), a flat shape (e.g., a patch antenna), and the like. The shape of the conductive film functioning as an antenna is not limited to a linear shape, and the conductive film functioning as an antenna may be formed in a curved-line shape, a meander shape, or a combination thereof, in consideration of a wavelength of an electromagnetic wave.

Figure 6A:
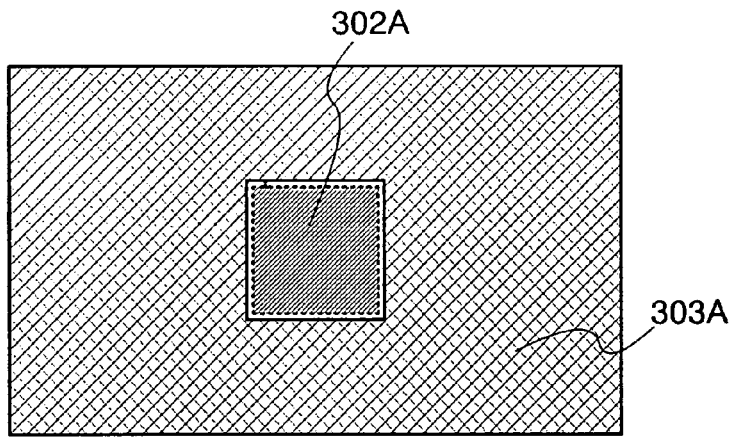
FIGS. 6A to 6E are diagrams each illustrating one example of a shape of an antenna included in a semiconductor device of the present invention.
Figure 6B:
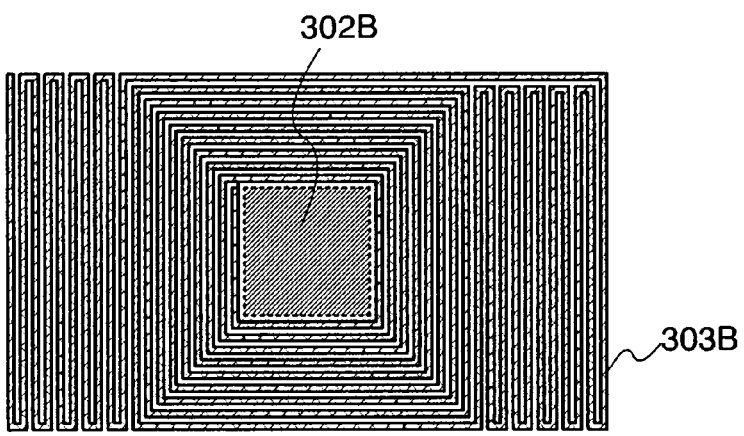
Figure 6C:
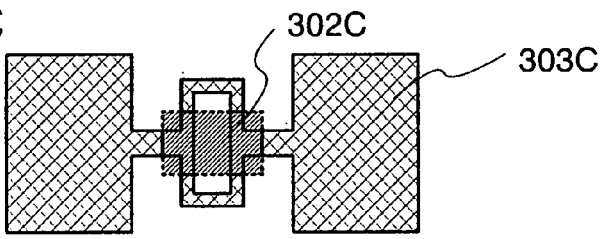
Figure 6D:
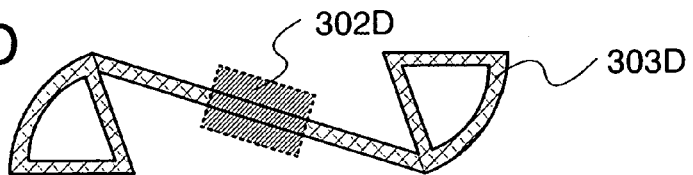
Figure 6E:
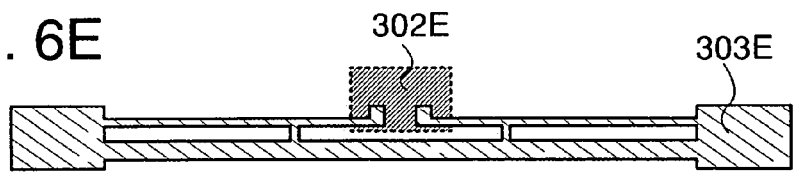

Here, examples of shapes of the antenna provided for the first antenna circuit 101 and each of the antenna circuits in the antenna circuit group 102 are shown in FIGS. 6A to 6E. For example, as shown in FIG. 6A, an antenna 303A may be provided all around a chip 302A provided with a signal processing circuit. As shown in FIG. 6B, a thin antenna 303B may be provided so as to be around a chip 302B provided with a signal processing circuit. As shown in FIG. 6C, an antenna 303C may have a shape for receiving a high-frequency electromagnetic wave with respect to a chip 302C provided with a signal processing circuit. As shown in FIG. 6D, an antenna 303D may have a shape which is 180° omnidirectional (capable of receiving signals in any direction) with respect to a chip 302D provided with a signal processing circuit. As shown in FIG. 6E, an antenna 303E may have a shape which is extended to be long like a stick with respect to a chip 302E provided with a signal processing circuit. The first antenna circuit and each of the antenna circuits in the antenna circuit group 102 may be used in combination with antennas with these shapes.

In FIGS. 6A to 6E, there is no particular limitation on a connection method of the chip 302A or the like provided with the signal processing circuit to the antenna 303A or the like. Using FIG. 6A as an example, a method in which the antenna 303A is connected to the chip 302A provided with the signal processing circuit by wire bonding connection or bump connection, or a method in which part of the chip is made to function as an electrode and is attached to the antenna 303A may be employed. In this method, the chip 302A can be attached to the antenna 303A with the use of ACF (Anisotropic Conductive Film). The appropriate length which is needed for the antenna depends on a frequency used for reception. For example, in the case where the frequency is 2.45 GHz, the length of antenna may be approximately 60 mm (½ wavelength) or approximately 30 mm (¼ wavelength).

It is to be noted that the battery 104 is charged by an external wireless signal inputted from the antenna circuit group 102 through each of the rectifier circuits of the rectifier circuit group 107, so that electric power can be supplied to the power supply circuit 106 in FIGS. 1 and 2 by the electric power charged in the battery 104. Using the electric power charged in the battery 104 makes it possible to supply electric power to the power supply circuit 106 and operate the semiconductor device 100 even in the case where sufficient electric power cannot be obtained from the first antenna circuit 101 in the semiconductor device 100 when a communication distance is increased.

An example of a circuit configuration of the power supply circuit 106 in FIGS. 1 and 2 is explained with reference to FIG. 7. The power supply circuit 106 includes a reference voltage circuit and a buffer amplifier. The reference voltage circuit includes a resistor 1001 and diode-connected transistors 1002 and 1003, and generates a reference voltage which is twice as high as a source-gate voltage $V_{GS}$ of each transistor. The buffer amplifier includes a differential circuit formed of transistors 1005 and 1006, a current mirror circuit formed of transistors 1007 and 1008, and a common source amplifier formed of a current supply resistor 1004, a transistor 1009, and a resistor 1010.

Figure 7:
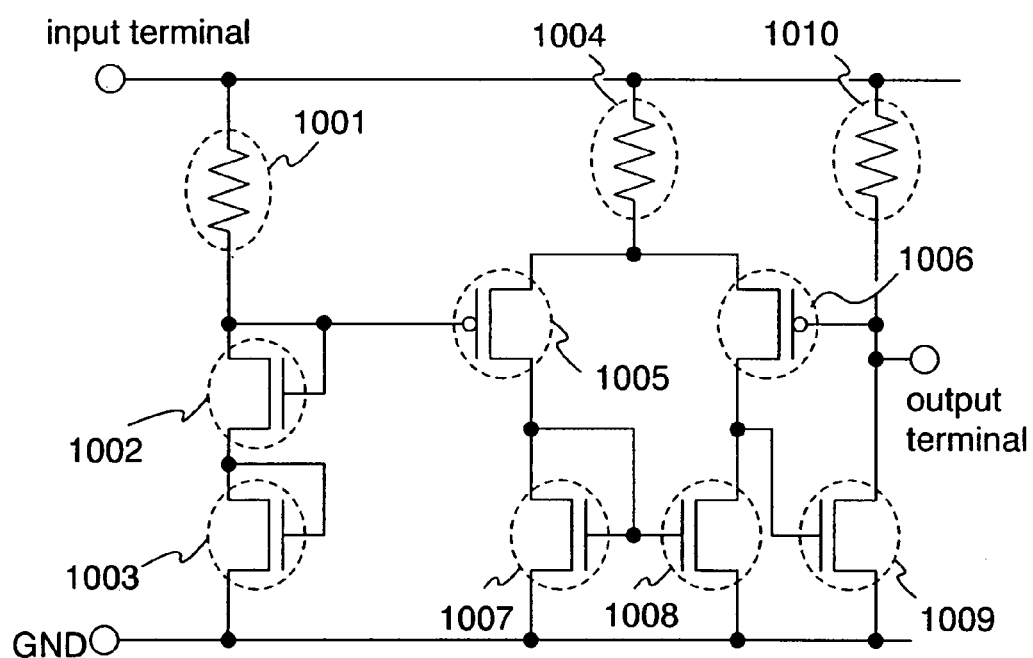
FIG. 7 is a diagram illustrating one structural example of a power supply circuit included in a semiconductor device of the present invention.

The power supply circuit shown in FIG. 7 operates in such a manner that, when the amount of current flowing from an output terminal is large, the amount of current flowing to the transistor 1009 is reduced; when the amount of current flowing from the output terminal is small, the amount of current flowing to the transistor 1009 is increased; and current flowing to the resistor 1010 is almost constant. Potential of the output terminal has approximately the same value as that of the reference voltage circuit. Although the power supply circuit including the reference voltage circuit and the buffer amplifier is shown here, a power supply circuit used in the present invention is not limited to that of FIG. 7, and it may be a circuit having another structure.

It is to be noted that, in the present invention, a battery refers to a battery whose continuous operating time can be restored by charging. It is to be noted that a battery formed in a sheet-like form is preferably used. For example, reduction in size is possible with the use of a lithium battery, preferably a lithium polymer battery that uses a gel electrolyte, a lithium ion battery, or the like. Needless to say, the battery is not limited to these as long as charging of electric power is possible, and a battery that can be charged and discharged, such as a nickel metal hydride battery or a nickel cadmium battery, may be used. Alternatively, a high-capacity capacitor or the like may be used.

Next, operation in writing data to the semiconductor device 100 shown in FIGS. 1 and 2 by the reader/writer 201 is explained below. A signal received by the first antenna circuit 101 is half-wave rectified and then smoothed by the first rectifier circuit 105. The signal which has been half-wave rectified and smoothed by the first rectifier circuit 105 is inputted to the power supply circuit 106. The power supply circuit 106 supplies a stabilized voltage of the signal to the amplifier 109, the logic circuit 110, the memory control circuit 111, the memory circuit 112, the logic circuit 113, the amplifier 114, and the modulation circuit 115.

The signal received by the first antenna circuit 101 is inputted as a clock signal to the logic circuit 110 through the amplifier 109. In addition, the signal inputted from the first antenna circuit 101 is demodulated by the demodulation circuit 108, and then inputted as data to the logic circuit 110.

In the logic circuit 110, the inputted data is decoded. The reader/writer 201 encodes data by using a transform mirror code, an NRZ-L code, or the like to transmit the data, and then the logic circuit 110 decodes the data. When the decoded data is transmitted to the memory control circuit 111, the data stored in the memory circuit 112 is read. It is necessary that the memory circuit 112 is a nonvolatile memory circuit which can hold data even when a power supply is shut off, and thus, mask ROM, flash memory, or the like is used.

In the case where the reader/writer 201 reads the data stored in the memory circuit 112 in the semiconductor device 100 shown in FIGS. 1 and 2, the semiconductor device 100 operates as described below. The signal received by the first antenna circuit 101 is half-wave rectified and then smoothed by the first rectifier circuit 105. The signal which has been half-wave rectified and smoothed by the first rectifier circuit 105 is inputted to the power supply circuit 106. The power supply circuit 106 supplies a stabilized voltage of the signal to the amplifier 109, the logic circuit 110, the memory control circuit 111, the memory circuit 112, the logic circuit 113, the amplifier 114, and the modulation circuit 115.

An AC signal received by the first antenna circuit 101 is inputted to the logic circuit 110, and logic operation is conducted. Then, the signal from the logic circuit 110 is used to control the memory control circuit 111, and the data stored in the memory circuit 112 is called up. After the data called by the memory circuit 112 is processed in the logic circuit 113 and then amplified in the amplifier 114, the modulation circuit 115 is operated. Data is processed in accordance with a method prescribed by ISO14443, ISO15693, ISO18000, or the like. A method prescribed by another standard may be used as long as consistency with a reader/writer can be ensured.

When the modulation circuit 115 operates, impedance of the first antenna circuit 101 varies. Accordingly, a signal of the reader/writer 201, which is reflected in the first antenna circuit 101, is changed. The change is read by the reader/writer, which makes it possible to know data stored in the memory circuit 112 of the semiconductor device 100. Such a modulation method is referred to as a load modulation method.

It is to be noted that transistors of various modes can be applied to a transistor provided for the signal processing circuit 103. Therefore, types of transistors applicable to the present invention are not limited.

Next, operation in performing charging of electric power to the semiconductor device 100 shown in FIG. 1 by an external wireless signal is explained below. An external wireless signal received by the N-th antenna circuit 102n is half-wave rectified and smoothed by the N-th rectifier circuit 107n. The signal which has been half-wave rectified and smoothed by the N-th rectifier circuit 107n is supplied as electric power to the battery 104 through the charging circuit 116. The electric power held in the battery 104 is used as electric power to be supplied to the power supply circuit 106.

One structural example of the semiconductor device of this embodiment mode is explained below. It is to be noted that, here, the case where an antenna provided for the first antenna circuit 101 has a coil shape, and a plurality of antenna circuits which includes antennas with different lengths and shapes is provided for the N-th antenna circuit 102 is explained.

The semiconductor device 100 in this embodiment mode may employ, in consideration of the function and size thereof, a layout in which the first antenna circuit, the second antenna circuit, the signal processing circuit, and the battery are stacked or arranged in parallel over a substrate. In addition, the signal processing circuit 103 can be divided into a circuit accompanying the first antenna circuit and a circuit accompanying the second antenna circuit.

A semiconductor device shown in FIG. 8 includes, over a substrate 701, a first antenna circuit 704; an antenna circuit group including antenna circuits 705a and 705b; a chip 702 including the signal processing circuit 103, the charging circuit 116, and the rectifier circuit group 107 which have been explained with reference to FIG. 1; and a battery 703. It is to be noted that the first antenna circuit 704 is connected to the signal processing circuit 103, and the antenna circuits 705a and 705b are connected to the rectifier circuit group 107.

A radio wave received by the first antenna circuit 704 is inputted to a power supply circuit through a first rectifier circuit in the first signal processing circuit formed in the chip 702 to generate power, and at the same time, a signal included in the radio wave is extracted by a demodulation circuit. The battery 703 is connected to the charging circuit 116 and the antenna-rectifier circuit group 117 formed in the chip 702, and a radio wave received by the antenna circuits 705a and 705b is inputted to the battery 703 through each of the rectifier circuits in the rectifier circuit group 107.

Here, a pattern diagram of the case where a radio wave transmitted from a reader/writer 706 is received by the first antenna circuit 704, and an external wireless signal 707 is received by the antenna circuits 705a and 705b. That is, this semiconductor device transmits and receives data to and from the reader/writer 706 through the first antenna circuit 704, and charges the battery 703 through the antenna circuits 705a and 705b. In addition, a rectifier circuit corresponding to each of the antenna circuits 705a and 705b is connected to each of the antenna circuits 705a and 705b, so that impedance matching corresponding to each antenna can be easily performed. Moreover, return loss is reduced, and thus, the battery can be efficiently charged.

In addition, the battery 703 is electrically connected to the signal processing circuit 103 provided in the chip 702 as well, and electric power is appropriately supplied from the battery 703 to the power supply circuit in the signal processing circuit 103. The connection of the battery 703 to the signal processing circuit 103 or the antenna-rectifier circuit group 117 is not particularly limited. For example, the battery 703 can be connected to the signal processing circuit 103 or the antenna-rectifier circuit group 117 by wire bonding connection or bump connection. In addition, the signal processing circuit 103 or the antenna-rectifier circuit group 117 may be attached to a connecting terminal with the battery 703 with part of the signal processing circuit 103 or the antenna-rectifier circuit group 117 as an electrode, and in this case, they can be attached to each other using an anisotropic conductive film or the like.

Figure 8:
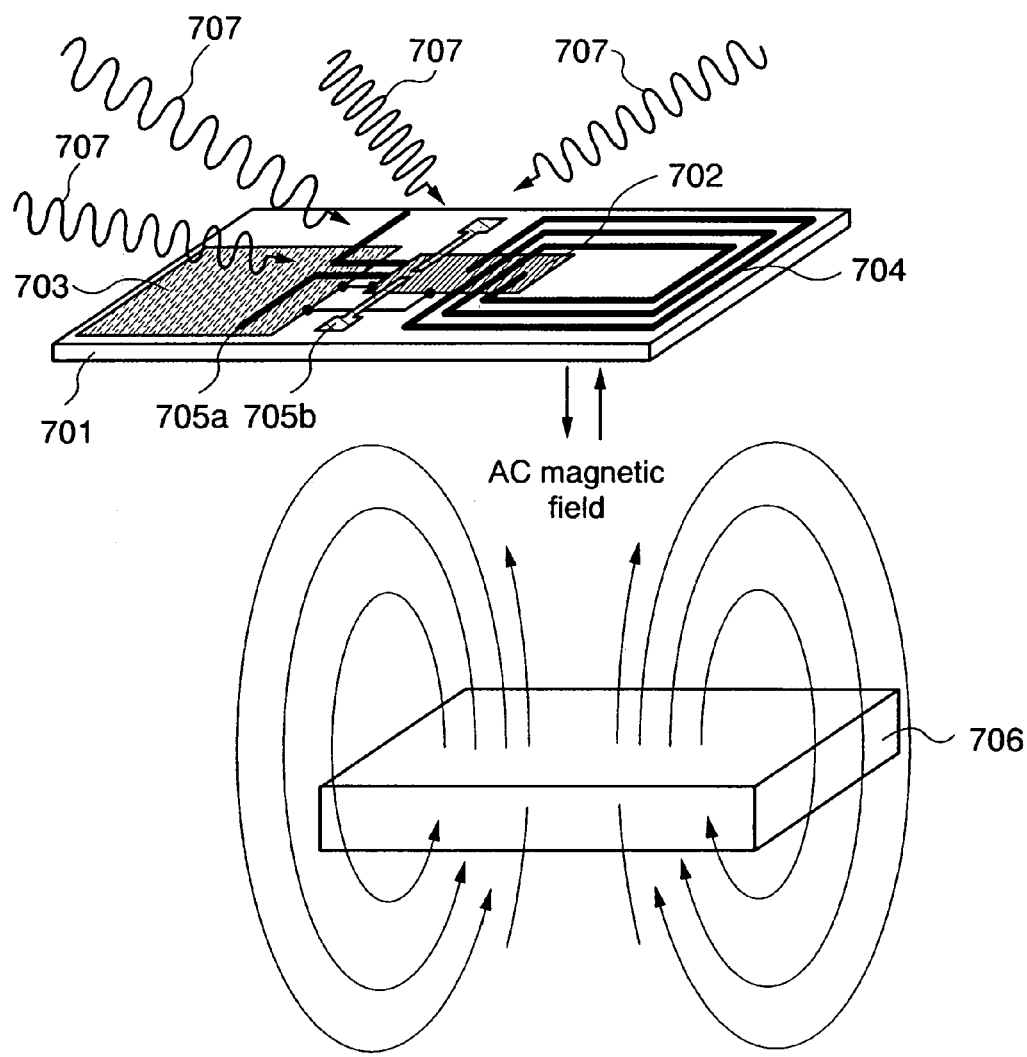
FIG. 8 is a diagram illustrating one structural example of a semiconductor device of the present invention.

It is to be noted that an example of the reader-writer 706 in FIG. 8 is explained with reference to FIG. 9. The reader/writer 706 in FIG. 9 includes a receiving portion 501, a transmitting portion 502, a control portion 503, an interface portion 504, and an antenna circuit 505. The control portion 503 controls the receiving portion 501 and the transmitting portion 502 with respect to a data processing order and a data processing result by control of a higher-level device 506 through the interface portion 504. The transmitting portion 502 modulates a data processing order to be transmitted to the semiconductor device 100, and then outputs it as an electromagnetic wave from the antenna circuit 505. The receiving portion 501 demodulates a signal received by the antenna circuit 505, and then outputs it as a data processing result to the control portion 503.

Figure 9:
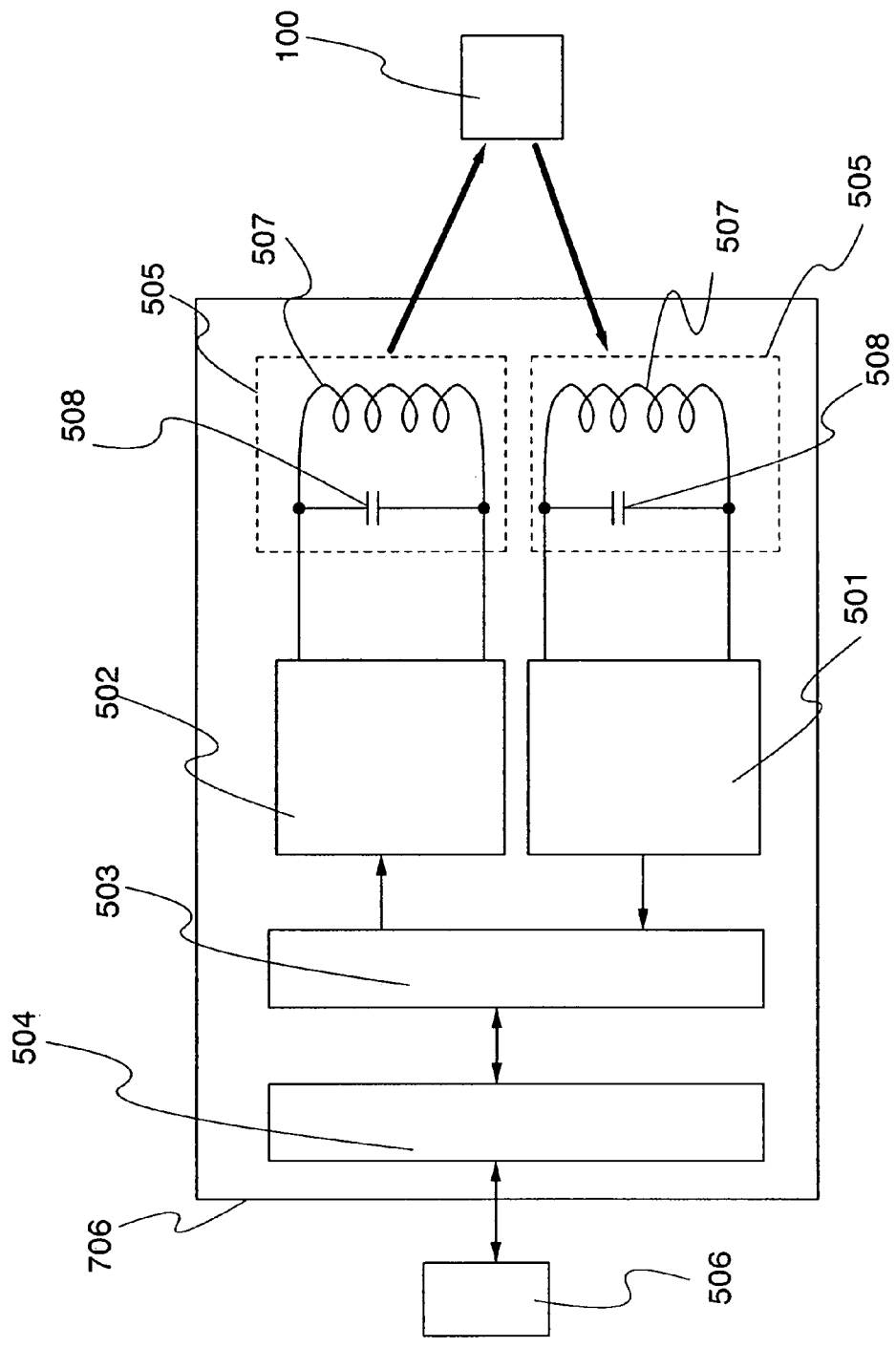
FIG. 9 is a diagram illustrating one structural example of a reader/writer that transmits data to and receives data from a semiconductor device of the present invention.

In this embodiment mode, the antenna circuit 505 of the reader/writer 706 shown in FIG. 9 is connected to the receiving portion 501 and the transmitting portion 502, and includes an antenna 507 and a resonance capacitor 508 that forms an LC parallel resonant circuit. The antenna circuit 505 receives, as an electric signal, an electromotive force which is induced to the antenna circuit 505 by a signal outputted from the semiconductor device 100. Furthermore, the antenna circuit 505 is supplied with an induced current to transmit a signal to the semiconductor device 100.

The lengths and shapes of the second antenna circuits 705*a* and 705*b* used for charging the battery 703 are not limited to those shown in FIG. 8. Here, an example is shown, in which linear antennas having different lengths (dipole antennas) are provided as antennas of the second antenna circuits 705*a* and 705*b*. Alternatively, for example, a combination of a dipole antenna and a coiled antenna or a combination of a dipole antenna and a patch antenna may be used. Thus, a plurality of antennas having different lengths and shapes are provided as antennas used for charging the battery 703, whereby wireless signals with various wavelengths can be received. Accordingly, charging efficiency can be improved. In particular, when a combination of antennas having different shapes such as a patch antenna and a dipole antenna is provided (for example, a folded-dipole antenna is provided around a patch antenna), it becomes possible to utilize a limited space effectively. Moreover, since a corresponding plurality of antennas with different frequency bands is provided, electromagnetic waves with various frequency bands can be used as electric power and charging can be performed utilizing radio waves efficiently. Furthermore, one rectifier circuit is provided corresponding to one antenna, and thus, impedance matching corresponding to each antenna can be easily performed. Also, return loss is reduced, and thus, the battery can be efficiently charged.

In addition, the first antenna circuit 704 used for transmitting and receiving a signal to and from the reader/writer 706 is not limited to a structure shown in FIG. 8. As described above, antennas with various lengths and shapes can be used depending on a transmission method to be applied.

For example, as for the frequency of a signal transmitted and received between the first antenna circuit 704 and the reader/writer 706, 125 kHz, 13.56 MHz, 915 MHz, 2.45 GHz, and the like are given, and each of which is prescribed by the ISO standard. Needless to say, the frequency of a signal transmitted and received between the first antenna circuit 704 and the reader/writer 706 is not limited to them, and any of the following may be employed: a submillimeter wave of 300 GHz to 3 THz; a millimeter wave of 30 GHz to 300 GHz; a microwave of 3 GHz to 30 GHz; an ultrashort wave of 300 MHz to 3 GHz; a very short wave of 30 MHz to 300 MHz; a short wave of 3 MHz to 30 MHz; a medium wave of 300 kHz to 3 kHz; a long wave of 30 kHz to 300 kHz; and a very long wave of 3 kHz to 30 kHz. In addition, a signal transmitted and received between the first antenna circuit 704 and the reader/writer 706 is a signal obtained by modulation of a carrier wave. A carrier wave may be modulated by either analog modulation or digital modulation, and any of amplitude modulation, phase modulation, frequency modulation, and spread spectrum modulation may be employed. Preferably, amplitude modulation or frequency modulation is employed.

It is to be noted that, although FIG. 8 shows the example in which the first antenna circuit 704; the antenna circuits 705*a* and 705*b*; the chip 702 including the signal processing circuit, the charging circuit, and the antenna-rectifier circuit group; and the battery 703 are provided over the same substrate 701, the semiconductor device shown in this embodiment mode is not limited to the structure shown in FIG. 8.

Figure 10:
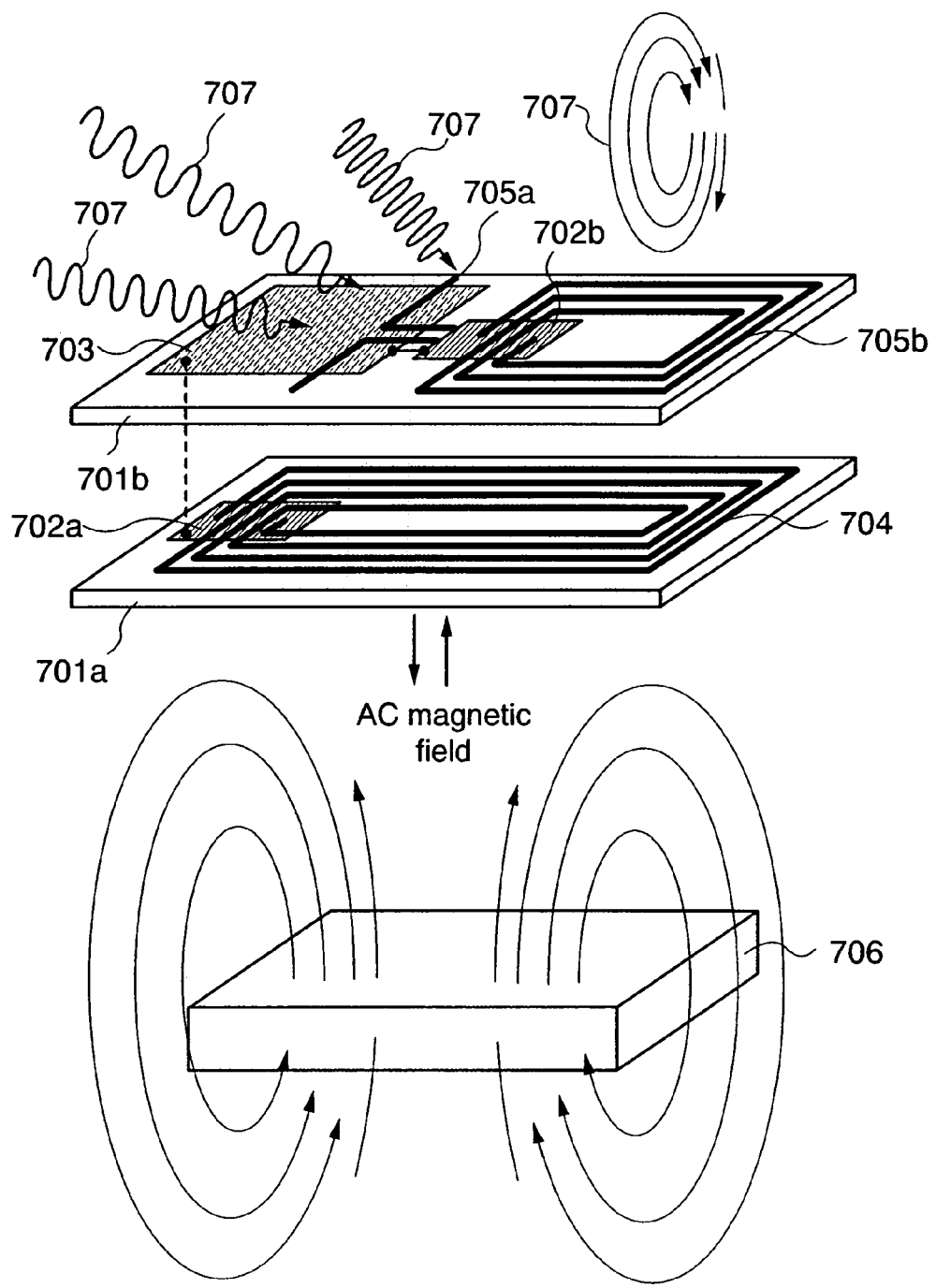
FIG. 10 is a diagram illustrating one structural example of a semiconductor device of the present invention.

For example, as shown in FIG. 10, a superposition structure may be employed in which a substrate 701*a* over which a chip 702*a* and a first antenna circuit 704 are provided and a substrate 701*b* over which a chip 702*b*, antenna circuits 705*a* and 705*b*, and a battery 703 are provided are manufactured and attached to each other. The chip 702*a* is provided with a signal processing circuit and the chip 702*b* is provided with a charging circuit and the antenna-rectifier circuit group.

In FIG. 10, a radio wave received by the first antenna 704 is supplied to a power supply circuit through a first rectifier circuit in the signal processing circuit provided in the chip 702*a* to supply electric power, and a signal included in the radio wave is extracted by a demodulation circuit. In addition, a radio wave received by the antenna circuits 705*a* and 705*b* is inputted to the battery 703 from the charging circuit and each rectifier circuit of the antenna-rectifier circuit group through the charging circuit.

In addition, the first antenna circuit 704 is connected to the signal processing circuit provided in the chip 702*a*, and the antenna circuits 705*a* and 705*b* are connected to each rectifier circuit of the rectifier circuit group 107 and the charging circuit 116 which are provided in the chip 702*b*. The battery 703 is provided so as to be electrically connected to the signal processing circuit provided in the chip 702*a* and each rectifier circuit of the rectifier circuit group and the charging circuit which are provided in the chip 702*b*.

The connection of the battery 703 to the signal processing circuit or each circuit of the rectifier circuit group and the charging circuit is not particularly limited. For example, the battery 703 can be connected to the signal processing circuit or each rectifier circuit of the rectifier circuit group and the charging circuit by wire bonding connection or bump connection. In addition, the first signal processing circuit 103 or each circuit of the antenna-rectifier circuit group and the charging circuit may be attached to a connecting terminal with the battery 703 with part of the first signal processing circuit or the second signal processing circuit functioning as an electrode, and in this case, the attachment can be performed using an anisotropic conductive film or the like.

In this manner, the chip and the antenna used for transmitting and receiving a signal to and from the reader/writer and the chip and the antenna used for charging the battery are formed over different substrates and then the substrates are attached to each other, so that the antenna or the battery can be formed to have a large shape.

Figure 11A:
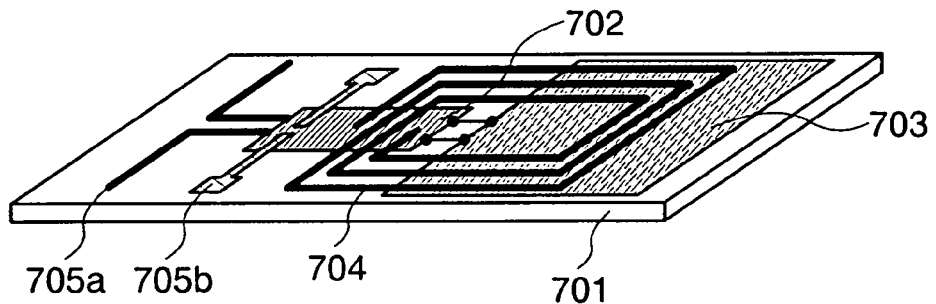
FIGS. 11A to 11C are diagrams each illustrating one structural example of a semiconductor device of the present invention.

It is to be noted that the battery 703 shown in FIGS. 8 and 10 can be provided at the same time as the signal processing circuit or each rectifier circuit of the rectifier circuit group and the charging circuit. For example, a lithium ion secondary battery which is thinned to be approximately 10 to 100 μm may be formed at the same time as the signal processing circuit or each rectifier circuit of the rectifier circuit group and the charging circuit. In addition, at the same time as formation of the signal processing circuit or each rectifier circuit of the rectifier circuit group and the charging circuit, a thin-film capacitor may be formed to serve as the battery 703. Although the battery 703 is provided so as to overlap with the antenna circuit 705*a* in FIGS. 8 and 10, the battery 703 may be provided so as to overlap with the first antenna circuit 704 (FIG. 11A), or the battery 703 may be provided so as not to overlap with any of the first antenna circuit 704 and the antenna circuits 705a and 705b.

Figure 11B:
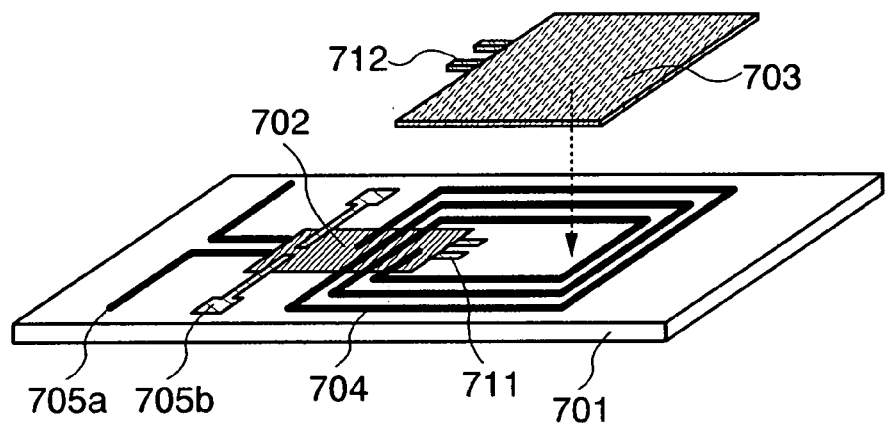
Figure 11C:
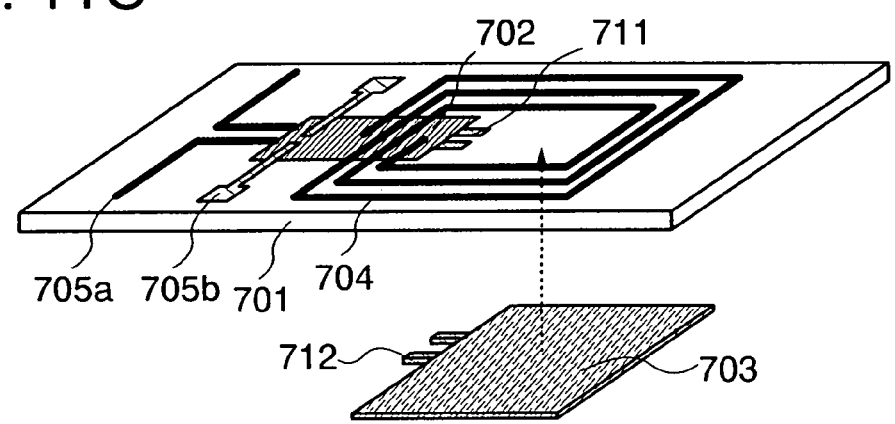

Alternatively, the battery 703 and the signal processing circuit or each rectifier circuit of the rectifier circuit group and the charging circuit may be attached so as to be connected to each other. For example, as shown in FIGS. 11B and 11C, the battery 703 is attached to the chip 702 in which the signal processing circuit, each rectifier circuit of the rectifier circuit group, and the charging circuit are formed. In this case, the battery 703 can be attached to a front side (a side over which the chip 702 is formed) or a back side of a substrate so that the signal processing circuit, each rectifier circuit of the rectifier circuit group, and the charging circuit that are included in the chip 702 are electrically connected to the battery 703. For example, a connecting terminal 711 such as a bump electrically connected to the chip 702 is provided so as to be electrically connected to a connecting terminal 712 of the battery. An anisotropic conductive film or the like can be used for attachment.

Figure 12A:
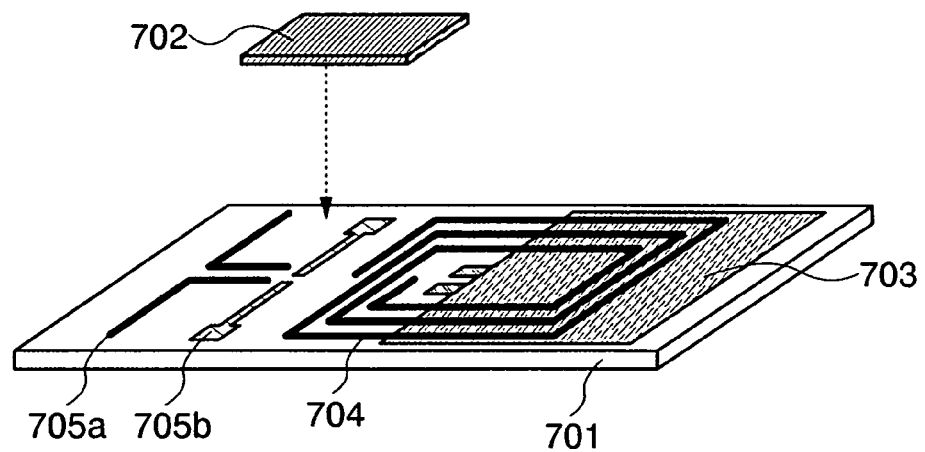
FIGS. 12A and 12B are diagrams each illustrating one structural example of a semiconductor device of the present invention.
Figure 12B:
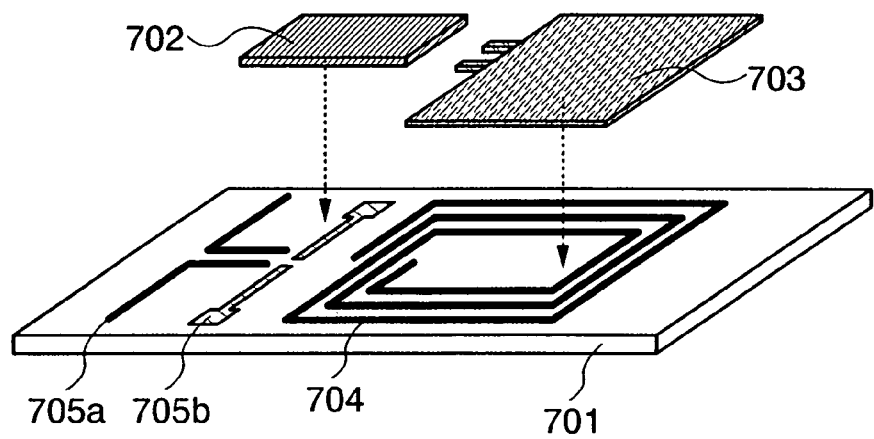

The chip 702 including the signal processing circuit 103, each rectifier circuit of the rectifier circuit group 107, and the charging circuit may be attached to the substrate 701 over which the first antenna circuit 704, the antenna circuits 705a and 705b, and the battery 703 are provided (FIG. 12A). Alternatively, the battery 703 and the chip 702 including the signal processing circuit, each rectifier circuit of the rectifier circuit group 107, and the charging circuit may be attached to the substrate 701 over which the first antenna circuit 704, and the antenna circuits 705a and 705b are provided (FIG. 12B). In this case, attachment is performed so that the battery 703 is electrically connected to the signal processing circuit, each rectifier circuit of the rectifier circuit group, and the charging circuit that are included in the chip 702; the signal processing circuit is electrically connected to the first antenna circuit 704; and each rectifier circuit of the rectifier circuit group and the charging circuit are electrically connected to the antenna circuits 705a and 705b. As described above, attachment is performed with provision of a connecting terminal such as a bump electrically connected to the chip 702 and the battery 703, or the first antenna circuit 704 and the antenna circuits 705a and 705b so as to be electrically connected.

Structures shown in FIGS. 11A to 11C and 12 can be applied to the structure shown in FIG. 10 as well.

As described above, the semiconductor device of the present invention includes the battery. Therefore, shortage of electric power which is necessary for transmitting and receiving individual information, due to deterioration of a battery with time can be prevented.

The semiconductor device of the present invention includes the plurality of antennas for wirelessly supplying electric power to the battery. Therefore, the battery for supplying electric power for driving the semiconductor device can be performed with external electromagnetic waves without directly being connected to a charger. As a result, unlike a conventional active-type RFID tag, it is not necessary to check remaining capacity of a battery or changing batteries, so that the semiconductor device can be continued to be used for long periods of time and over the long term. In addition, power for driving the semiconductor device is constantly held in the battery, so that enough electric power for the semiconductor device to operate can be obtained and a communication distance with the reader/writer can be increased.

Furthermore, the semiconductor device includes one rectifier circuit corresponding to one antenna, and thus, impedance matching corresponding to each antenna can be easily performed. Moreover, return loss is reduced, and thus, the battery can be efficiently charged.

It is to be noted that, although the example in which the battery is used as a power storage portion is explained in this embodiment mode, the semiconductor device can be formed using a capacitor instead of the battery. Although various capacitors can be used as the capacitor, a small and high-capacity double-layer electrolytic capacitor or a small and high-capacity stacked-layer ceramic capacitor can be preferably used. Alternatively, both a battery and a capacitor may also be provided as the power storage portion.

It is to be noted that although only the case of half-wave rectification is described in this embodiment mode, full-wave rectification may be performed.

It is to be noted that this embodiment mode can be implemented in combination with other embodiment modes in this specification.

Embodiment Mode 2

A structure of a movable electronic device having a power receiving device of the present invention will be explained with reference to block diagrams of FIGS. 13 and 14. A power receiving device explained in this embodiment mode is referred to as an RF battery or a wireless battery.

Figure 13:
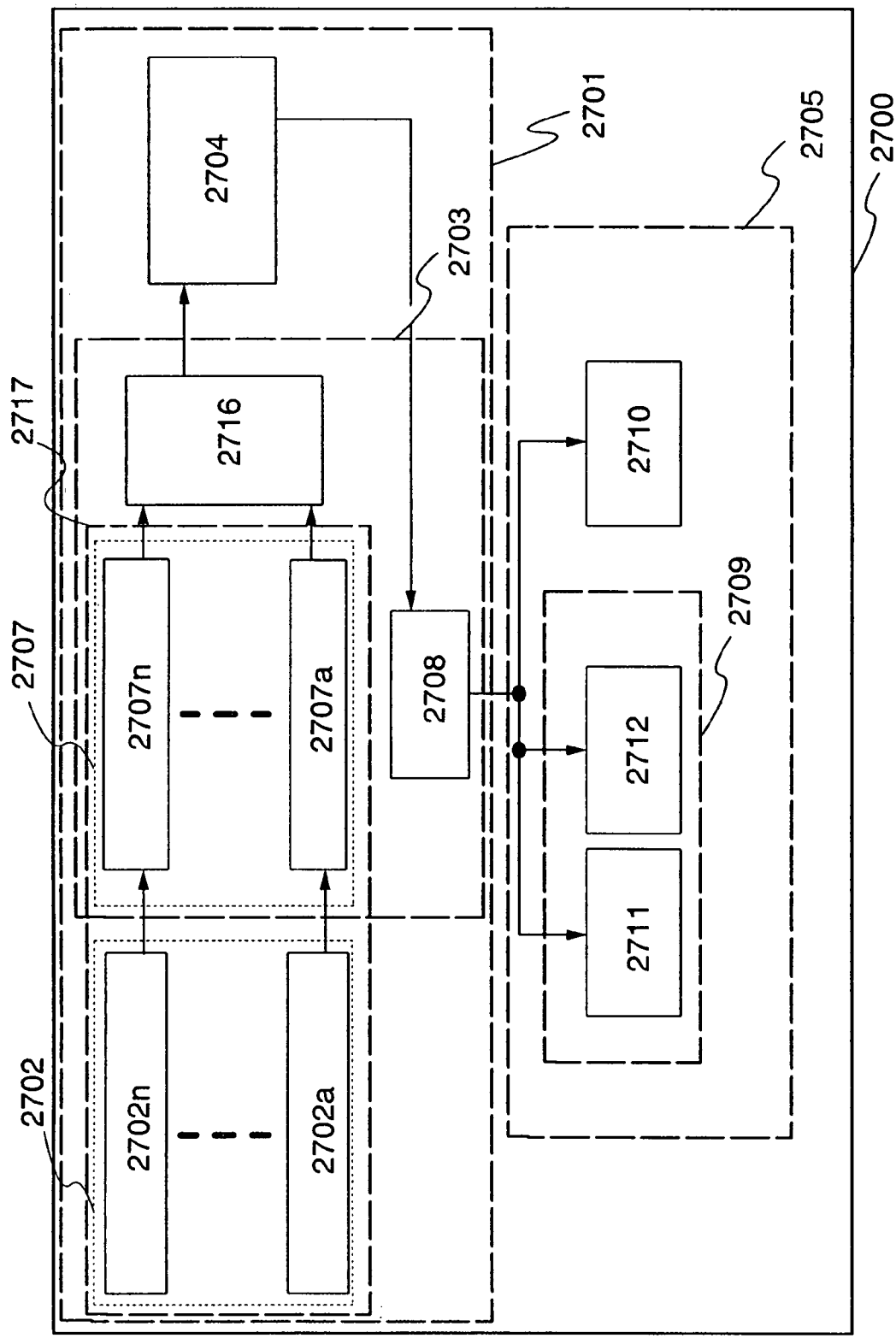
FIG. 13 is a diagram illustrating one structural example of a power receiving device of the present invention.

A movable electronic device 2700 shown in FIG. 13 includes a power receiving portion 2701 and a power supply load portion 2705. The power receiving portion 2701 includes an antenna circuit group 2702 including a plurality of antenna circuits; a signal processing circuit 2703; and a battery 2704. The signal processing circuit 2703 includes a rectifier circuit group 2707 including a plurality of rectifier circuits; a power supply circuit 2708; and a charging circuit 2716. Please note that 2717 denotes an antenna-rectifier circuit group including the rectifier circuit group 2707 and the antenna circuit group 2702.

It is to be noted that although the power supply circuit 2708 in FIG. 13 supplies electric power to the power supply load portion 2705, a structure of the power supply load portion 2705 differs from one movable electronic device to another. Therefore, in this embodiment mode, explanation is given assuming that a structure is that of a mobile phone or a digital video camera. Accordingly, the power supply load portion 2705 includes a display portion 2709 and an integrated circuit portion 2710. Here, the integrated circuit portion 2710 is a circuit portion that processes signals other than those of the display portion, and because the structure of the integrated circuit portion 2710 differs from one movable electronic device to another, it is not explained in detail in this specification. The integrated circuit portion 2710 may be designed in accordance with a function of the movable electronic device 2700. The display portion 2709 includes a pixel portion 2711 and a display control portion 2712 for controlling the pixel portion 2711. Needless to say, the type of display element provided in a pixel of the display portion 2709 is not limited, and an electroluminescence element, a liquid crystal element, or the like is selected in accordance with an intended use of each movable electronic device.

Figure 14:
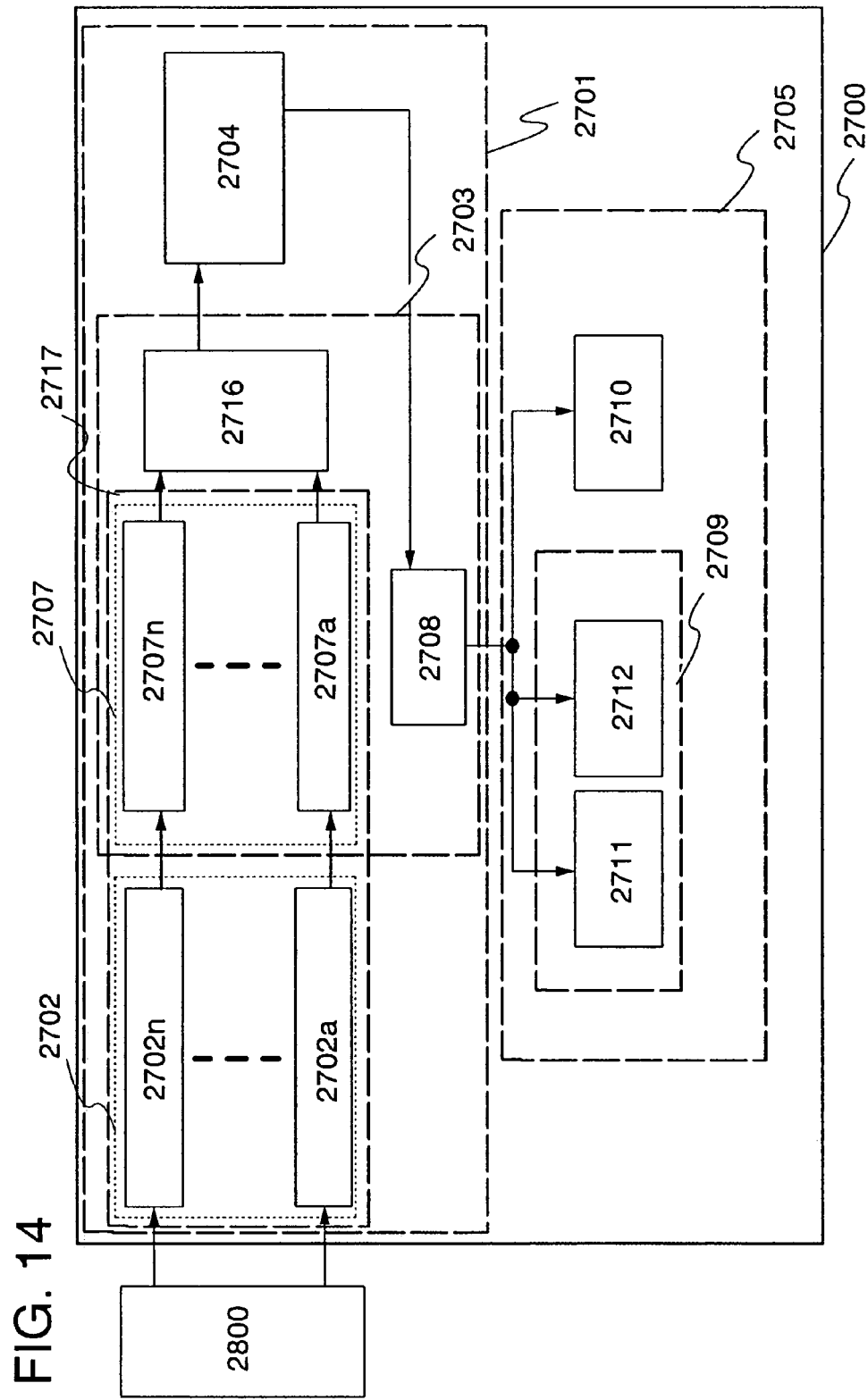
FIG. 14 is a diagram illustrating one structural example of a power receiving device of the present invention.

FIG. 14 is a block diagram illustrating a structure in which the antenna circuit group 2702 receives a signal from a power feeder 2800. In FIG. 14, electric power received by each antenna of the antenna circuit group 2702 is inputted to the battery 2704 through each rectifier circuit of the rectifier circuit group 2707, and electric power is supplied from the battery 2704 to the power supply circuit 2708.

It is to be noted that the shape of antenna of the antenna circuit group 2702 is not particularly limited. For example, as shown in FIG. 6A, a structure in which an antenna circuit is provided all around a signal processing circuit may be employed. As shown in FIG. 6B, a structure in which a thin antenna circuit is provided so as to be around a signal processing circuit may be employed. As shown in FIG. 6C, an antenna circuit with a shape which receives an electromagnetic wave with high frequency with respect to a signal processing circuit may be employed. As shown in FIG. 6D, an antenna circuit with a shape which is 180° omnidirectional (capable of receiving signals in any direction) with respect to a signal processing circuit may be employed. As shown in FIG. 6E, an antenna circuit with a shape which is extended to be long like a stick and folded back may be employed. Alternatively, although not shown, a patch antenna may be employed. In addition, the connection of the signal processing circuit to the antenna in the antenna circuit is not particularly limited to the structure shown in the drawing. For example, the antenna circuit and the signal processing circuit may be arranged with a distance, or arranged being close to each other. The appropriate length which is needed for the antenna depends on a frequency of an electromagnetic wave used for reception. In this embodiment mode, the shape of the antenna circuit shown in FIG. 6B is employed and explanation is given assuming that an electromagnetic wave is received and electric power is obtained by electromagnetic induction of the received electromagnetic wave. An N-th antenna 2702*n* in the antenna circuit group 2702 includes the antenna 401 and the resonance capacitor 402 as shown in FIG. 5A, and a combination of the antenna 401 and the resonance capacitor 402 is referred to as an antenna circuit 403. That is, the N-th antenna circuit 2702*n* corresponds to the antenna circuit 403 in FIG. 5A.

The rectifier circuit group 2707 is acceptable as long as it is a circuit which converts an AC signal which is induced by an electromagnetic wave received by the antenna circuit group 2702 into a DC signal. For example, as shown in FIG. 5B, the rectifier circuit 407 may include the diodes 404 and 405 and the smoothing capacitor 406.

It is to be noted that the power feeder 2800 in FIG. 14 is explained with reference to FIG. 15. The power feeder 2800 in FIG. 15 includes a power transmission control portion 601 and an antenna circuit 602. The power transmission control portion 601 modulates an electric signal for transmitting electric power which is transmitted to the power receiving device portion 2701 in the movable electronic device and outputs an electromagnetic for transmitting electric power from the antenna circuit 602.

Figure 15:
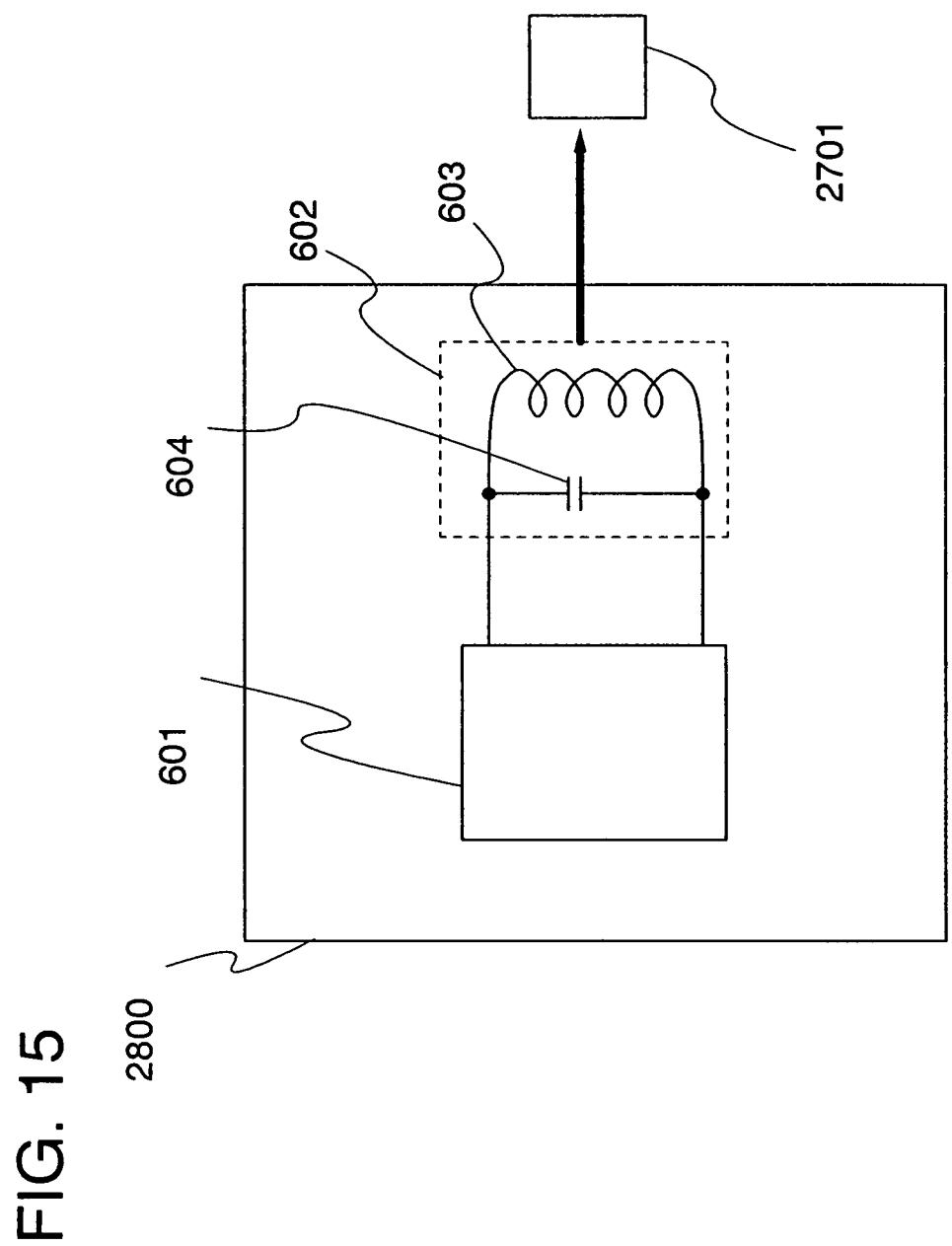
FIG. 15 is a diagram illustrating one structural example of a power receiving device of the present invention.

In this embodiment mode, in a similar manner to the antenna circuit group 2702 in the power receiving device portion 2701, the antenna circuit 602 of the power feeder 2800 shown in FIG. 15 is connected to the power transmission control portion 601 and includes an antenna 603 and a resonance capacitor 604 that forms an LC parallel resonant circuit. The power transmission control portion 601 supplies induction current to the antenna circuit 602 at the time of transmitting electric power, and outputs an electromagnetic wave for transmitting electric power to the power receiving device portion 2701 through the antenna 603.

Figure 16:
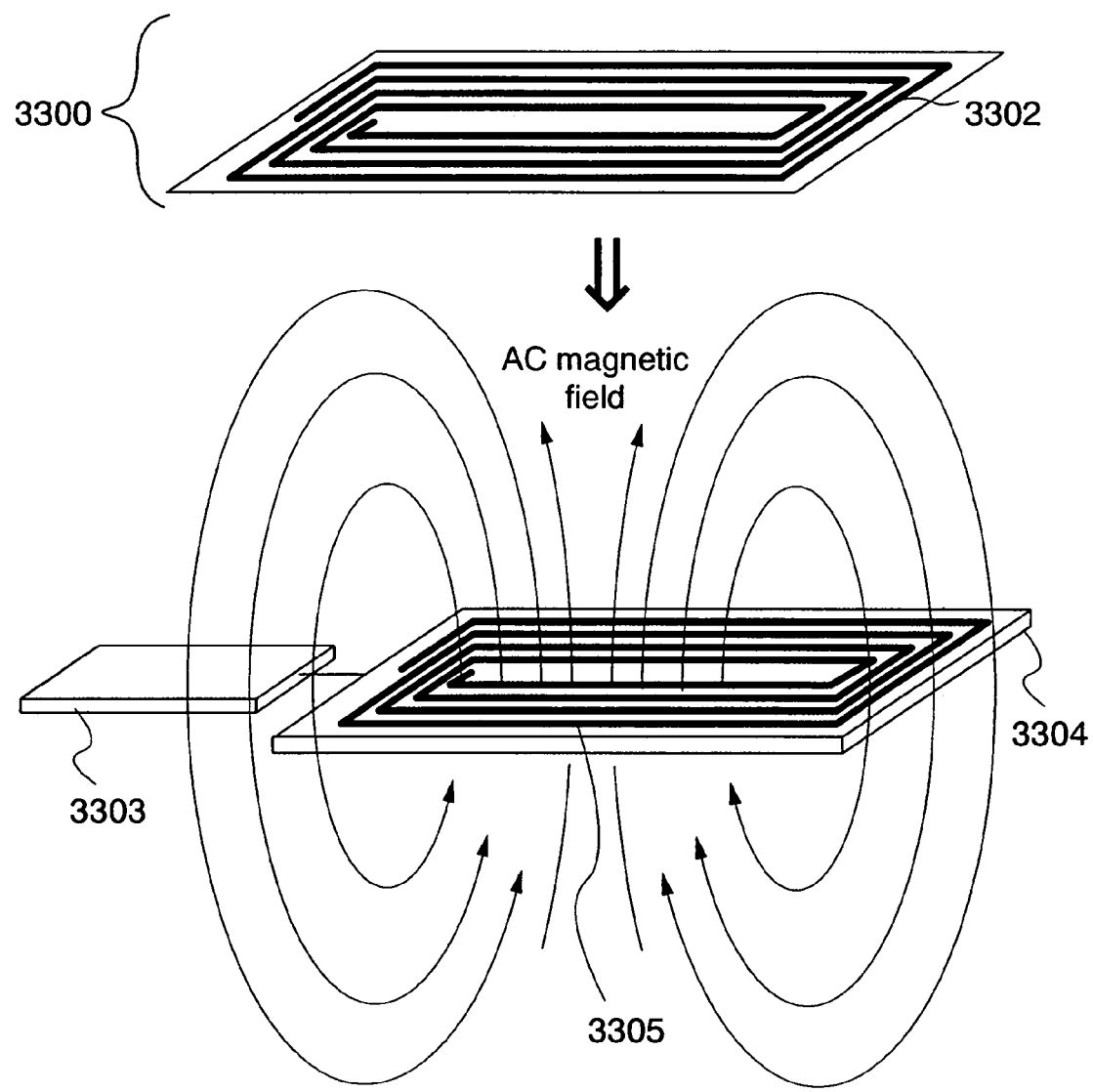
FIG. 16 is a diagram illustrating one structural example of a power receiving device of the present invention.
Figure 17:
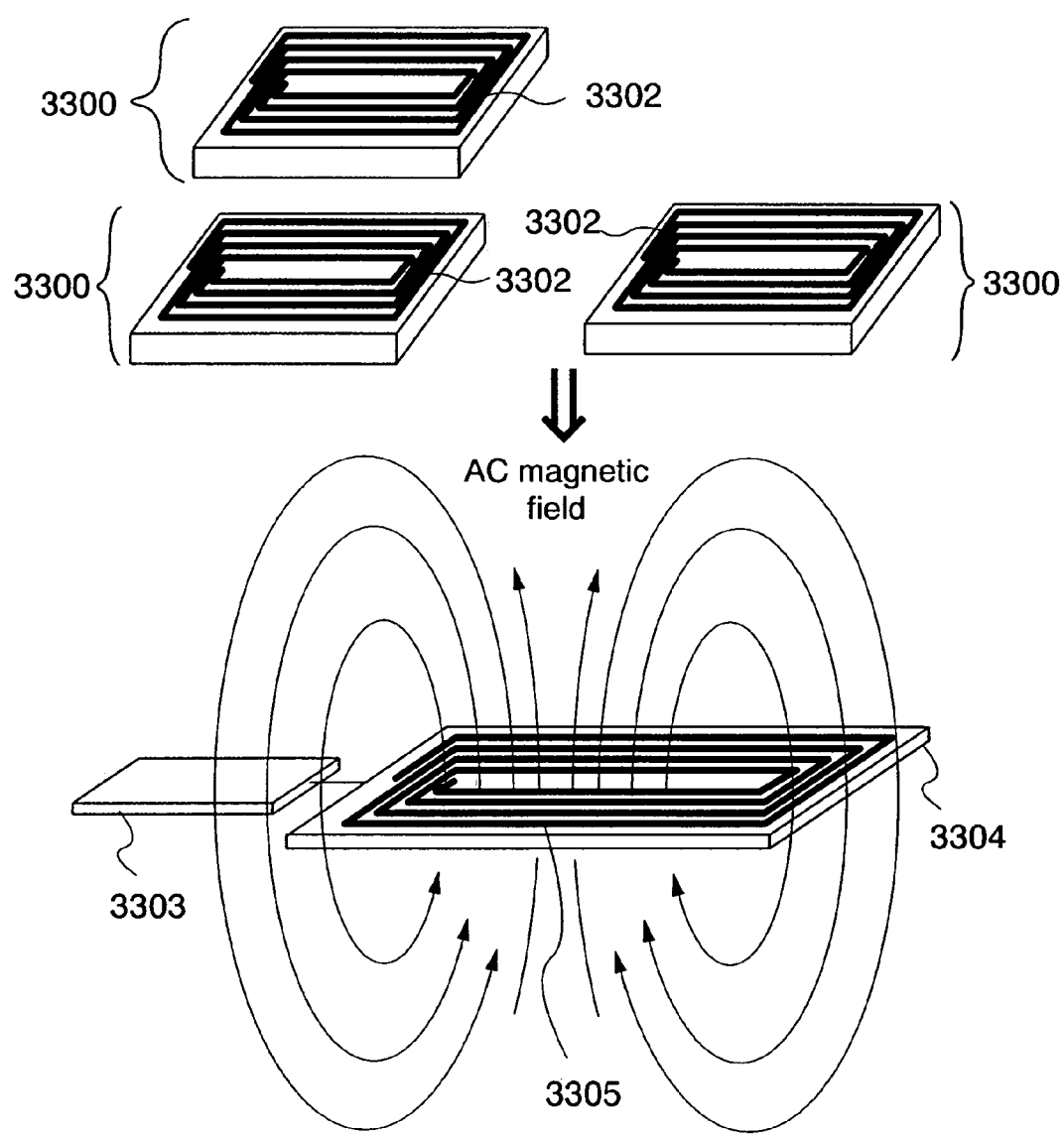
FIG. 17 is a diagram illustrating one structural example of a power receiving device of the present invention.

It is to be noted that, as described above, in this embodiment mode, the antenna circuit group 2702 receives a wireless signal by an electromagnetic induction method according to the shape of the antenna. Therefore, the power receiving device portion 2701 in FIGS. 13 and 14 includes the N-th antenna circuit 2702*n* with a coil shape. FIG. 16 shows, as an example, the positional relationship of an antenna circuit in a movable electronic device including a power receiving device portion and the shape of the antenna. FIG. 16 shows a structure in which the antenna circuit in the power receiving device portion receives electromagnetic waves for being transmitted from the antenna of the power feeder.

In FIG. 16, when a coiled antenna 3305 that is included in an antenna circuit 3304 of the power feeder, which is connected to a power transmission control portion 3303, is brought close to an antenna circuit 3302 of a power receiving device portion 3300, an AC magnetic field is generated from the coiled antenna 3305. The AC magnetic field goes through the coiled antenna circuit 3302 inside the power receiving device portion 3300, and electromotive force is generated between terminals (between one end of the antenna and the other end thereof) of the coiled antenna circuit 3302 inside the power receiving device portion 3300 by electromagnetic induction. A battery included in the power receiving device portion 3300 can be charged by the electromotive force. It is to be noted that charging can be conducted from the power feeder even when antenna circuits 3302 in the power receiving device portion 3300 overlap one another, or when a plurality of antenna circuits 3302 in the power receiving device portion 3300 are in the AC magnetic field.

It is to be noted that a frequency of a signal transmitted to the N-th antenna circuit 2702*n* from the power feeder 2800 can be, for example, any of the following: 300 GHz to 3 THz, which is a submillimeter wave; 30 GHz to 300 GHz, which is a millimeter wave; 3 GHz to 30 GHz, which is a microwave; 300 MHz to 3 GHz, which is an ultrahigh frequency wave; 30 MHz to 300 MHz, which is a very high frequency wave; 3 MHz to 30 MHz, which is a high frequency wave; 300 kHz to 3 MHz, which is a medium frequency wave; 30 kHz to 300 kHz, which is a low frequency wave; and 3 kHz to 30 kHz, which is a very low frequency wave.

The power supply circuit 2708 in FIGS. 13 and 14 corresponds to the power supply circuit 106 in FIGS. 1 and 2.

Next, operation in performing charging of the movable electronic device 2700 shown in FIGS. 13 and 14 with electric power from the power feeder 2800 by a wireless signal is explained below. A wireless signal received by each antenna circuit in the antenna circuit group is half-wave rectified and smoothed by each rectifier circuit of the rectifier circuit group 2707. The voltage half-wave rectified and smoothed by each rectifier circuit of the rectifier circuit group 2707 is held once in the battery 2704. The electric power held in the battery 2704 is used as electric power to be supplied to the electric power supply circuit 2708.

Figure 18:
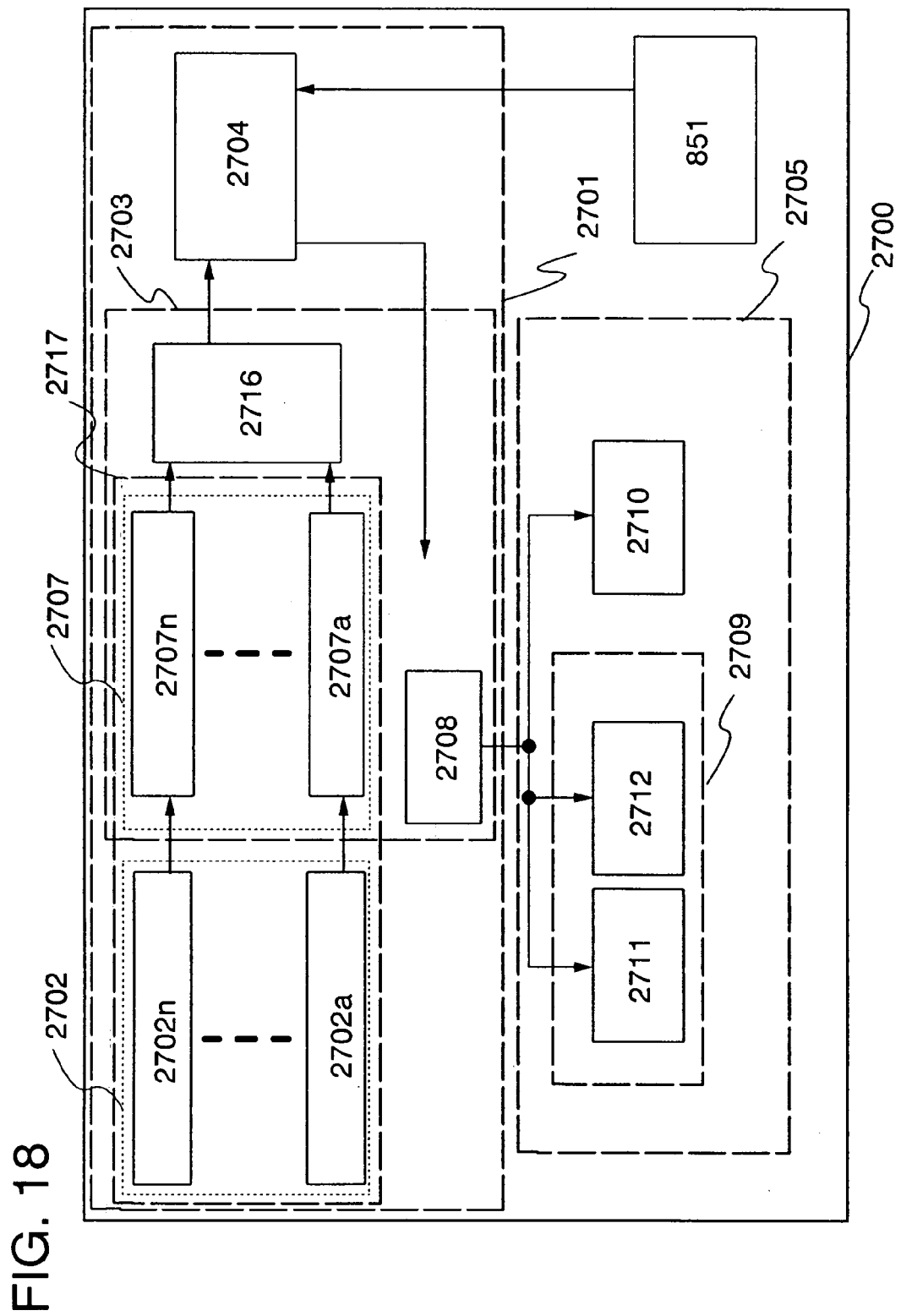
FIG. 18 is a diagram illustrating one structural example of a power receiving device of the present invention.

It is to be noted that, in this embodiment mode, electric power stored in the battery may be supplied by not only a wireless signal outputted from the power feeder 2800, but also by additional provision of a power generation element for part of the movable electronic device. FIG. 18 shows a structure provided with a power generation element. The structure shown in FIG. 18 differs from the structure shown in FIG. 13 in that a power generation element 851 for supplying electric power to the battery. Provision of the power generation element 851 is preferable because the supply of the electric power stored in the battery 2704 can be increased and charging rate can be increased.

It is to be noted that, as the power generation element 851 in FIG. 18, for example, a power generation element employing a solar battery, a power generation element employing a piezoelectric element, or a power generation element employing a micro electro mechanical system (MEMS) may be used. Needless to say, electric power may be supplied from a large power generator employing motive power of a combustion engine such as a motor vehicle engine may be used instead of supplying electric power from the power generation element. It is to be noted that the power generation element 851 in FIG. 18 is not limited to the above-described structure.

Next, electric power supplied from the battery 2704 to the power supply circuit 2708 is supplied to the pixel portion 2711 and the display control portion 2712 of the display portion 2709, and the integrated circuit portion 2710, in the power supply load portion 2705 in the structures shown in FIGS. 13 and 14. In this manner, the movable electronic device 2700 can be operated.

As described above, the power receiving device of the present invention includes the antenna circuit. Therefore, it is not necessary to provide a relay terminal as a conductive portion to the battery in the movable electronic device, malfunction due to breakage of the relay terminal or defects of the relay terminal does not occur, and electric power can be supplied to the battery by a wireless signal. In addition, electric power is supplied to the movable electronic device including the battery, which is the power receiving device, by a wireless power supply means, so that it becomes possible to constantly perform charging without carrying a charger or a primary battery for charging, if the wireless reception condition is good.

Also, the power receiving device of the present invention is provided with a plurality of antennas which receives different frequency bands. These antennas are connected to the battery, so that charging of electric power is possible. Accordingly, electromagnetic waves with various frequency bands can be used as electric power and charging can be performed utilizing radio waves efficiently.

Furthermore, the semiconductor device includes one rectifier circuit corresponding to one antenna, and thus, impedance matching corresponding to each antenna can be easily performed. Moreover, return loss is reduced, and thus, the battery can be efficiently charged.

It is to be noted that although the example in which the battery is used as a power storage portion is explained in this embodiment mode, the semiconductor device can be formed using a capacitor instead of the battery, as the power storage device. Although various capacitors can be used as the capacitor, a small and high-capacity double-layer electrolytic capacitor or a small and high-capacity stacked-layer ceramic capacitor can be preferably used. Alternatively, both a battery and a capacitor may be provided as the power storage portion.

It is to be noted that only the case of half-wave rectification is described in this embodiment mode, full-wave rectification may be performed.

It is to be noted that this embodiment mode can be implemented in combination with other embodiment modes in this specification.

Embodiment Mode 3

In this embodiment mode, an example of a method for manufacturing the semiconductor device described in Embodiment Modes 1 and 2 will be explained.

First, as shown in FIG. 19A, a peeling layer 1903 is formed over one surface of a substrate 1901 with an insulating film 1902 interposed therebetween, and then an insulating film 1904 functioning as a base film and a semiconductor film 1905 (e.g., a film containing amorphous silicon) are formed thereover. It is to be noted that the insulating film 1902, the peeling layer 1903, the insulating film 1904, and the semiconductor film 1905 can be formed consecutively.

The substrate 1901 is selected from a glass substrate, a quartz substrate, a metal substrate (e.g., a stainless steel substrate), a ceramic substrate, a semiconductor substrate such as a Si substrate, or the like. Alternatively, a plastic substrate made of polyethylene terephthalate (PET), polyethylene naphthalate (PEN), polyether sulfone (PES), acrylic, or the like can be used. In the step shown in FIG. 18A, although the peeling layer 1903 is provided over the entire surface of the substrate 1301 with the insulating film 1902 interposed therebetween, the peeling layer can also be selectively provided by photolithography after being provided over the entire surface of the substrate 1901.

The insulating films 1902 and 1904 are formed using an insulating material such as silicon oxide, silicon nitride, silicon oxynitride ($SiO_xN_y$, where x>y>0), or silicon nitride oxide ($SiN_xO_y$, where x>y>0) by a CVD method, a sputtering method, or the like. For example, when each of the insulating films 1902 and 1904 is formed to have a two-layer structure, a silicon nitride oxide film as a first insulating film may be formed and a silicon oxynitride film may be formed as a second insulating film. In addition, a silicon nitride film may also be formed as a first insulating film and a silicon oxide film may also be formed as a second insulating film. The insulating film 1902 functions as a blocking layer which prevents an impurity element contained in the substrate 1901 from being mixed into the peeling layer 1903 or elements formed thereover. The insulating film 1904 functions as a blocking layer which prevents an impurity element contained in the substrate 1901 or the peeling layer 1903 from being mixed into elements formed over the insulating film 1904. In this manner, providing the insulating films 1902 and 1904 which function as the blocking layers can prevent adverse effects on the elements formed over the peeling layer 1903 or the insulating film 1904, which would otherwise be caused by an alkali metal such as Na or an alkaline earth metal contained in the substrate 1901 or by the impurity element contained in the peeling layer 1903. It is to be noted that when quartz is used for the substrate 1901, for example, the insulating films 1902 and 1904 may be omitted.

The peeling layer 1903 may be formed using a metal film, a stacked structure of a metal film and a metal oxide film, or the like. As a metal film, either a single layer or stacked layers are formed using an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), and iridium (Ir), or an alloy material or a compound material containing the element as its main component. In addition, such materials can be formed by a sputtering method, various CVD methods such as a plasma CVD method, or the like. A stacked structure or a metal film and a metal oxide film can be obtained by the steps of forming the above-described metal film, applying plasma treatment thereto under an oxygen atmosphere or an $N_2O$ atmosphere or applying heat treatment thereto under an oxygen atmosphere or an $N_2O$ atmosphere, and thereby forming oxide or oxynitride of the metal film on the metal film. For example, when a tungsten film is provided as a metal film by a sputtering method, a CVD method, or the like, a metal oxide film made of tungsten oxide can be formed on the surface of the tungsten film. In that case, the tungsten oxide can be represented by $WO_x$ where x is in the range of 2 to 3. For example, there are cases where x is 2 ($WO_2$), x is 2.5 ($W_2O_5$), x is 2.75 ($W_4O_{11}$), x is 3 ($WO_3$), and the like. When forming tungsten oxide, there is no particular limitation on the value of x, and thus which of the above oxides is to be formed may be determined base on the etching rate of the like. In addition, after a metal film (e.g., tungsten) is formed, an insulating film formed of silicon oxide ($SiO2$) or the like may be formed over the metal film by a sputtering method, and also metal oxide (e.g., tungsten, tungsten oxide over tungsten)

may be formed over the metal film. Moreover, high-density-plasma treatment may be applied as the plasma treatment, for example. Besides, metal nitride or metal oxynitride may also be formed. In that case, plasma treatment or heat treatment may be applied to the metal film under a nitrogen atmosphere or an atmosphere containing nitrogen and oxygen.

The semiconductor film 1905 is formed to a thickness of 25 to 200 nm (preferably 30 to 150 nm) by a sputtering method, an LPCVD method, or a plasma CVD method.

Next, as shown in FIG. 19B, the amorphous semiconductor film 1905 is crystallized by laser light irradiation. It is to be noted that the crystallization of the amorphous semiconductor film 1905 may also be conducted by a method combining the laser crystallization with a thermal crystallization method using RTA or an annealing furnace or with a thermal crystallization method using a metal element that promotes the crystallization. After that, the crystallized semiconductor film is etched into desired shapes, whereby crystalline semiconductor films 1905a to 1905f are formed. Then, a gate insulating film 1906 is formed so as to cover the semiconductor films 1905a to 1905f.

The gate insulating film 1906 is formed using an insulating material such as silicon oxide, silicon nitride, silicon oxynitride ($SiO_xN_y$, where x>y>0), or silicon nitride oxide ($SiN_xO_y$, where x>y>0) by a CVD method, a sputtering method, or the like. For example, when the gate insulating film 1906 is formed to have a two-layer structure, it is preferable to form a silicon oxynitride film as a first insulating film and form a silicon nitride oxide film as a second insulating film. Alternatively, it is also preferable to form a silicon oxide film as a first insulating film and form a silicon nitride film as a second insulating film. It is to be noted that the first insulating film is formed over the second insulating film here.

An example of a manufacturing process of the crystalline semiconductor films 1905a to 1905f is briefly described below. First, an amorphous semiconductor film with a thickness of 50 to 60 nm is formed by a plasma CVD method. Then, a solution containing nickel (Ni) which is a metal element for promoting crystallization is retained on the amorphous semiconductor film, which is followed by dehydrogenation treatment (500° C. for one hour) and thermal crystallization treatment (550° C. for four hours). Thus, a crystalline semiconductor film is formed. Then, the crystalline semiconductor film is irradiated with laser light by a photolithography method and etched, so that the crystalline semiconductor films 1905a to 1905f are formed. It is to be noted that crystallization of the amorphous semiconductor film may be conducted only by laser light irradiation, not by thermal crystallization which uses a metal element that promotes crystallization.

As a laser oscillator used for crystallization, either a continuous wave laser (a CW laser) or a pulsed laser can be used. As a laser that can be used here, there are gas lasers such as an Ar laser, a Kr laser, and an excimer laser; a laser in which single-crystalline YAG, $YVO_4$, forsterite ($Mg_2SiO_4$), $YAlO_3$, or $GdVO_4$ or polycrystalline (ceramic) YAG, $Y_2O_3$, $YVO_4$, $YAlO_3$, or $GdVO_4$ is doped with one or more laser media selected from among Nd, Yb, Cr, Ti, Ho, Er, Tm, and Ta as dopant; a glass laser; a ruby laser; an alexandrite laser; a Ti:sapphire laser; a copper vapor laser; and a metal vapor laser. When irradiation is conducted with the fundamental wave of such a laser beam or the second to fourth harmonics of the fundamental wave, crystals with a large grain size can be obtained. For example, the second harmonic (532 nm) or the third harmonic (355 nm) of an Nd:$YVO_4$ laser (the fundamental wave of 1064 nm) can be used. In this case, a laser power density of about 0.01 to 100 MW/cm$^2$ (preferably, 0.1 to 10 MW/cm$^2$) is required, and irradiation is conducted with a scanning rate of about 10 to 2000 cm/sec. It is to be noted that the laser in which single-crystalline YAG, $YVO_4$, forsterite ($Mg_2SiO_4$), $YAlO_3$, or $GdVO_4$ or polycrystalline (ceramic) YAG, $Y_2O_3$, $YVO_4$, $YAlO_3$, or $GdVO_4$ is doped with one or more laser media selected from among Nd, Yb, Cr, Ti, Ho, Er, Tm, and Ta as dopant; an Ar laser, or a Ti:sapphire laser can be used as a CW laser, whereas they can also be used as pulsed laser with a repetition rate of 10 MHz or more by being combined with a Q-switch operation or mode locking. When a laser beam with a repetition rate of 10 MHz or more is used, it is possible for a semiconductor film to be irradiated with the next pulse after during the period in which the semiconductor film is melted by the previous laser and solidified. Therefore, unlike the case of using a pulsed laser with a low repetition rate, a solid-liquid interface in the semiconductor film can be continuously moved. Thus, crystal grains which have grown continuously in the scanning direction can be obtained.

The gate insulating film 1906 may be formed by oxidization or nitridation of the surfaces of the semiconductor films 1905a to 1905f by the above-described high-density-plasma treatment. For example, plasma treatment with a mixed gas of a rare gas such as He, Ar, Kr, or Xe, and oxygen, nitrogen oxide ($NO_2$), ammonia, nitrogen, or hydrogen is used. When plasma is excited by the introduction of microwaves, plasma with a low electron temperature and high electron density can be generated. With oxygen radicals (which may include OH radicals) or nitrogen radicals (which may include NH radicals) which are generated by the high-density plasma, the surfaces of the semiconductor films can be oxidized or nitrided.

By such high-density-plasma treatment, an insulating film with a thickness of 1 to 20 nm, typically 5 to 10 nm, is formed on the semiconductor films. Since the reaction in this case is a solid-phase reaction, interface state density between the insulating film and the semiconductor films can be quite low. Since such high-density-plasma treatment directly oxidizes (or nitrides) the semiconductor films (crystalline silicon or polycrystalline silicon), the insulating film can be formed to have a thickness with extremely little unevenness, which is ideal. In addition, since crystal grain boundaries of crystalline silicon are not strongly oxidized, an excellent state results. That is, by the solid-phase oxidation of the surfaces of the semiconductor films by high-density-plasma treatment which is described in this embodiment mode, an insulating film with a uniform thickness and low interface state density can be formed without excessive oxidation reaction at the crystal grain boundaries.

As the gate insulating film 1906, only an insulating film formed by high-density-plasma treatment may be used, or a stacked layer which is obtained by depositing an insulating film such as silicon oxide, silicon oxynitride, or silicon nitride on the insulating film by a CVD method using plasma or thermal reaction. In either case, a transistor which includes an insulating film formed by high-density-plasma treatment in a part or the whole of its gate insulating film can have small characteristic variations.

In addition, the semiconductor films 1905a to 1905f, which are obtained by irradiation of a semiconductor film with a continuous wave laser beam or a laser beam oscillated with a repetition rate of 10 MHz or more and scanning of the semiconductor film in one direction to crystallize the semiconductor film, have a characteristic in that their crystals grows in the beam scanning direction. A transistor is arranged so that its channel length direction (direction in which carriers move when a channel formation region is formed) is aligned with the scanning direction, and the above-described gate insulating film is combined with the semiconductor film, so that a thin film transistor (TFTs) with high electron field-effect mobility and few variations in characteristics can be obtained.

Next, conductive films are stacked over the gate insulating film 1906. Here, a first conductive film is formed to have a thickness of 20 to 100 nm by a CVD method, a sputtering method, or the like. A second conductive film is formed to have a thickness of 100 to 400 nm. The first conductive film and the second conductive film are formed with an element selected from among tantalum (Ta), tungsten (W), titanium (Ti), molybdenum (Mo), aluminum (Al), copper (Cu), chromium (Cr), niobium (Nb), and the like, or an alloy material or a compound material containing the element as its main component. Alternatively, the first conductive film and the second conductive film are formed of a semiconductor material typified by polycrystalline silicon doped with an impurity element such as phosphorus. As a combination example of the first conductive film and the second conductive film, a tantalum nitride film and a tungsten film; a tungsten nitride film and a tungsten film; a molybdenum nitride film and a molybdenum film; and the like can be given. Tungsten and tantalum nitride have high heat resistance. Therefore, after forming the first conductive film and the second conductive film, thermal treatment can be applied thereto for the purpose of heat activation. In addition, in the case where a two-layer structure is not employed, but a three-layer structure is employed, it is preferable to employ a stacked structure in which Next, a resist mask is formed by a photolithography method, and etching treatment for forming gate electrodes and gate lines is performed. Thus, gate electrodes 1907 are formed above the semiconductor films 1905a to 1905f. Here, a stacked structure of a first conductive film 1907a and a second conductive film 1907b is shown as an example of the gate electrode 1907.

Next, as shown in FIG. 19C, the semiconductor films 1905a, 1905b, 1905d, and 1905f are doped with an n-type impurity element at a low concentration, using the gate electrodes 1907 as masks by an ion doping method or an ion implantation method. Then, a resist mask is selectively formed by a photolithography method, and the semiconductor films 1905c and 1905e are doped with a p-type impurity element at high concentration. As an n-type impurity element, phosphorus (P), arsenic (As), or the like can be used. As a p-type impurity element, boron (B), aluminum (Al), gallium (Ga), or the like can be used. Here, phosphorus (P) is used as an n-type impurity element and is selectively introduced into the semiconductor films 1905a, 1905b, 1905d, and 1905f so that phosphorus is contained at concentrations of $1 \times 10^{15}$ to $1 \times 10^{19}/cm^3$. Thus, n-type impurity regions 1908 are formed. In addition, boron (B) is used as a p-type impurity element, and is selectively introduced into the semiconductor films 1905c and 1905e so as to be contained at concentrations of $1 \times 10^{19}$ to $1 \times 10^{20}/cm^3$. Thus, n-type impurity regions 1909 are formed.

Subsequently, an insulating film is formed so as to cover the gate insulating film 1906 and the gate electrodes 1907. The insulating film is formed to have either a single layer or a stacked layer of a film containing an inorganic material such as silicon, silicon oxide, or silicon nitride, or a film containing an organic material such as an organic resin by a plasma CVD method, a sputtering method, or the like. Next, the insulating film is selectively etched by anisotropic etching (mainly in the perpendicular direction), so that insulating films 1910 (also referred to as sidewalls) which is in contact with the side surfaces of the gate electrodes 1907 are formed. The insulating films 1910 are used as doping masks for forming LDD (Lightly Doped Drain) regions.

Next, the semiconductor films 1905a, 1905b, 1905d, and 1905f are doped with an n-type impurity element at high concentration, using the resist mask formed by photolithography, the gate electrodes 1307, and the insulating films 1910 as masks. Thus, n-type impurity regions 1311 are formed. Here, phosphorus (P) is used as an n-type impurity element, and is selectively introduced into the semiconductor films 1905a, 1905b, 1905d, and 1905f so as to be contained at concentrations of $1 \times 10^{19}$ to $1 \times 10^{20}/cm^3$. Thus, the n-type impurity regions 1911 with a higher concentration of impurity than that of the impurity regions 1908 are formed.

Through the above-described steps, as shown in FIG. 19D, n-channel thin film transistors 1900a, 1900b, 1900d, and 1900f; and p-channel thin film transistors 1900c and 1900e are formed.

In the n-channel thin film transistor 1900a, a channel formation region is formed in a region of the semiconductor film 1905a which overlaps with the gate electrode 1907; the impurity region 1911 which forms a source or drain region is formed in a region of the semiconductor film 1905a which does not overlap with the gate electrode 1907 and the insulating film 1910; and a low concentration impurity region (LDD region) is formed in a region which overlaps with the insulating film 1910 and between the channel formation region and the impurity region 1911. In addition, channel formation regions, low concentration impurity regions, and the impurity regions 1911 are formed in the n-channel thin film transistors 1900b, 1900d, and 1900f.

In the p-channel thin film transistor 1900c, a channel formation region is formed in a region of the semiconductor film 1905c which overlaps with the gate electrode 1907, and the impurity region 1909 which forms a source or drain region is formed in a region which does not overlap with the gate electrode 1907. Similarly, a channel formation region and the impurity region 1909 are formed in the p-channel thin film transistor 1900e. Here, although LDD regions are not formed in the p-channel thin film transistors 1900c and 1900e, LDD regions may be provided in the p-channel thin film transistors or a structure without LDD regions may be applied to the n-channel thin film transistors.

Next, as shown in FIG. 20A, an insulating film with a single layer or stacked layers is formed so as to cover the semiconductor films 1905a to 1905f, the gate electrodes 1907, and the like. Then, conductive films 1913 electrically connected to the impurity regions 1909 and 1911 which form the source and drain regions of the thin film transistors 1900a to 1900f are formed over the insulating film. The insulating film is formed either in a single layer or in stacked layers, using an inorganic material such as silicon oxide or silicon nitride, an organic material such as polyimide, polyamide, benzocyclobutene, acrylic, or epoxy, a siloxane material, or the like by a CVD method, a sputtering method, an SOG method, a droplet discharging method, a screen printing method, or the like. Here, the insulating film is formed to have two layers such that a silicon nitride oxide film is formed as a first insulating film 1912a and a silicon oxynitride film is formed as a second insulating film 1912b. In addition, the conductive films 1913 can form the source and drain electrodes of the thin film transistors 1900a to 1900f.

It is to be noted that before the insulating films 1912a and 1912b are formed or after one or both of them is/are formed, heat treatment is preferably applied for recovery of the crystallinity of the semiconductor films, activation of the impurity element which has been added into the semiconductor films, or hydrogenation of the semiconductor films. As the heat treatment, thermal annealing, laser annealing, RTA, or the like is preferably applied.

The conductive films 1913 are formed of either a single layer or a stacked layer of an element selected from among aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a compound material containing the element as its main component. An alloy material containing aluminum as its main component corresponds to, for example, a material which contains aluminum as its main component and also contains nickel, or a material which contains aluminum as its main component and also contains nickel and one or both of carbon and silicon. The conductive films 1913 are preferably formed to have a stacked structure of a barrier film, an aluminum-silicon (Al—Si) film, and a barrier film or a stacked structure of a barrier film, an aluminum silicon (Al—Si) film, a titanium nitride (TiN) film, and a barrier film. It is to be noted that the "barrier film" corresponds to a thin film formed of titanium, titanium nitride, molybdenum, or molybdenum nitride. Aluminum and aluminum silicon are the most suitable material for forming the conductive films 1913 because they have low resistance value and are inexpensive. When barrier layers are provided in the top layer and the bottom layer, generation of hillocks of aluminum or aluminum silicon can be prevented. In addition, when a barrier film formed of titanium which is an element having a high reducing property is formed, even when there is a thin natural oxide film formed on the crystalline semiconductor film, the natural oxide film can be chemically reduced, and a favorable contact between the conductive film 1913 and the crystalline semiconductor film can be obtained.

Next, an insulating film 1914 is formed so as to cover the conductive films 1913, and conductive films 1915a and 1915b electrically connected to the conductive films 1913 which forms the source electrode or the drain electrode of the thin film transistors 1900a and 1900f are formed. In addition, conductive films 1916a and 1916b electrically connected to the conductive film 1313 which forms the source electrode or drain electrode of the thin film transistor 1900b are formed. It is to be noted that the conductive films 1915a and 1915b and the conductive films 1916a and 1916b may be formed using the same material. The conductive films 1915a and 1915b and the conductive films 1916a and 1916b may be formed using any of the above-described material which has been described for the conductive film 1913.

Subsequently, as shown in FIG. 20B, conductive films 1917a and 1917b functioning as antennas are formed so as to be electrically connected to the conductive films 1916a and 1916b, respectively. Here, one of the conductive films 1917a and 1917b functioning as antennas corresponds to the antenna of the first antenna circuit described in the above-described embodiment mode and the other corresponds to the antenna of the second antenna circuit, the N-th antenna circuit, or the like. For example, if the conductive film 1917a is the antenna of the first antenna circuit and the conductive film 1917b is the antenna of the second antenna circuit, each of the n-channel thin film transistors 1900a, 1900b, and the p-channel thin film transistor 1900c functions as an element included in the first signal processing circuit described in the above-described embodiment mode, and each of the thin film transistors 1900d to 1900f functions as an element included in the second signal processing circuit described in the above-described embodiment mode.

The insulating film 1914 can be formed of either a single layer or a stacked layer of an insulating film containing oxygen or nitrogen such as silicon oxide ($SiO_x$), silicon nitride ($SiN_x$), silicon oxynitride ($SiO_xN_y$, where x>y), or silicon nitride oxide ($SiN_xO_y$, where x>y); a film containing carbon such as DLC (Diamond-Like Carbon); an organic material such as epoxy, polyimide, polyamide, polyvinyl phenol, benzocyclobutene, or acrylic; a siloxane material containing a siloxane resin; or the like. It is to be noted that a siloxane material corresponds to a material having a bond of Si—O—Si. Siloxane has a skeleton structure with the bond of silicon (Si) and oxygen (O). As a substituent of siloxane, an organic group containing at least hydrogen (e.g., an alkyl group or aromatic hydrocarbon) is used. Alternatively, a fluoro group may be used as the substituent. Further alternatively, both a fluoro group and an organic group containing at least hydrogen may be used as the substituent.

The conductive films 1917a and 1917b can be formed of a conductive material by a CVD method, a sputtering method, a printing method such as screen printing or gravure printing, a droplet discharging method, a dispensing method, a plating method, or the like. The conductive films 1917a and 1917b are formed of a single layer or a stacked layer of an element selected from among aluminum (Al), titanium (Ti), silver (Ag), copper (Cu), gold (Au), platinum (Pt), nickel (Ni), palladium (Pd), tantalum (Ta), and molybdenum (Mo), or an alloy material or a compound material containing the element as its main component.

For example, when the conductive films 1917a and 1917b functioning as antennas are formed by a screen printing method, the antenna can be provided by selective printing of a conductive paste in which conductive particles with a grain diameter of several nm to several tens of μm are dissolved or dispersed in an organic resin. The conductive particles can be at least one of metal particles selected from among silver (Ag), gold (Au), copper (Cu), nickel (Ni), platinum (Pt), palladium (Pd), tantalum (Ta), molybdenum (Mo), and titanium (Ti); fine particles of silver halide; and dispersive nanoparticles. In addition, the organic resin included in the conductive paste can be one or more of organic resins which function as a binder, a solvent, a dispersing agent, and a coating material for the metal particles. Typically, an organic resin such as an epoxy resin and a silicone resin can be given as examples. In addition, when forming a conductive film, baking is preferably performed after the paste is applied. For example, in the case of using fine particles (e.g., a grain diameter of 1 to 100 nm) containing silver as a main component as a material of the conductive paste, the conductive paste is baked and hardened at temperatures in the range of 150 to 300° C., so that the conductive film can be obtained. Alternatively, it is also possible to use fine particles containing solder or lead-free solder as its main component. In that case, fine particles with a grain diameter of 20 μm or less are preferably used. Solder and lead-free solder have the advantage of low cost.

The conductive films 1915a and 1915b can function as wirings which are electrically connected to the battery included in the power storage device of the present invention in a later step. In addition, in forming the conductive films 1917a and 1917b which function as antennas, another set of conductive films may be separately formed so as to be electrically connected to the conductive films 1915a and 1915b, so that the conductive films can be utilized as the wirings connected to the battery included in the power storage device of the present invention.

Next, as shown in FIG. 20C, after forming an insulating film 1918 so as to cover the conductive films 1917a and 1917b, layers including the thin film transistors 1900a to 1900f, the conductive films 1917a and 1917b, and the like (hereinafter referred to as an "element formation layer 1919") are peeled from the substrate 1901. Here, after forming openings in the element formation layer 1919 excluding the region of the thin film transistors 1900a to 1900f by laser light irradiation (e.g., UV light), the element formation layer 1919 can be peeled from the substrate 1901 with physical force. The peeling layer 1903 may be selectively removed by introduction of etchant into the openings before peeling the element formation layer 1919 from the substrate 1901. As the etchant, a gas or a liquid containing halogen fluoride or an interhalogen compound is used. For example, when chlorine trifluoride ($ClF_3$) is used as the gas containing halogen fluoride, the element formation layer 1919 can be peeled from the substrate 1901. It is to be noted that the whole peeling layer 1903 is not removed but part thereof may be left. Accordingly, the consumption of the etchant can be suppressed and process time for removing the peeling layer can be shortened. In addition, even after removing the peeling layer 1301, the element formation layer 1919 can be held over the substrate 1901. In addition, by reuse of the substrate 1901 from which the element formation layer 1919 has been peeled, cost reduction can be achieved.

The insulating film 1918 can be formed of either a single layer or a stacked layer of an insulating film containing oxygen or nitrogen such as silicon oxide ($SiO_x$), silicon nitride ($SiN_x$), silicon oxynitride ($SiO_xN_y$ where x>y), or silicon nitride oxide ($SiN_xO_y$ where x>y); a film containing carbon such as DLC (Diamond-Like Carbon); an organic material such as epoxy, polyimide, polyamide, polyvinyl phenol, benzocyclobutene, or acrylic; a siloxane material containing a siloxane resin; or the like by a CVD method, a sputtering method, or the like.

In this embodiment, as shown in FIG. 21A, after forming the openings in the element formation layer 1919 by laser light irradiation, a first seat material 1920 is attached to one surface of the element formation layer 1919 (the surface where the insulating film 1918 is exposed), and then the element formation layer 1919 is peeled from the substrate 1901.

Next, as shown in FIG. 21B, a second seat material 1919 is attached to the other surface of the element formation layer 1921 (the surface exposed by peeling), followed by one or both of heat treatment and pressurization treatment. As the first seat material 1920 and the second seat material 1921, hot-melt films and the like can be used.

As the first sheet material 1920 and the second sheet material 1921, a film on which antistatic treatment for preventing static electricity or the like has been applied (hereinafter referred to as an antistatic film) can be used. As examples of the antistatic film, a film in which an antistatic material is dispersed in a resin, a film to which an antistatic material is attached, and the like can be given. The film provided with an antistatic material can be a film with an antistatic material provided over one of its surfaces, or a film with an antistatic material provided over each of its surfaces. In addition, the film with an antistatic material provided over one of its surfaces may be attached so that the antistatic material is placed on the inner side of the film or the outer side of the film. The antistatic material may be provided over the entire surface of the film, or over a part of the film. As an antistatic material, a metal, indium tin oxide (ITO), or a surfactant such as an amphoteric surfactant, a cationic surfactant, or a nonionic surfactant can be used. In addition, as an antistatic material, a resin material which contains a cross-linked copolymer having a carboxyl group and a quaternary ammonium base on its side chain, or the like can be used. Such a material is attached, mixed, or applied to a film, so that an antistatic film can be formed. By sealing with the antistatic film, the semiconductor element can be prevented from adverse effects such as external static electricity when being dealt with as a commercial product.

It is to be noted that the thin-film secondary battery described in Embodiment 1 is connected to the conductive films 1915a and 1915b, so that the battery is formed. Connection between the battery and the conductive films 1915a and 1915b may be conducted before the element formation layer 1919 is peeled from the substrate 1901 (at the stage shown in FIG. 20B or 20C), after the element formation layer 1919 is peeled from the substrate 1901 (at the stage shown in FIG. 21A), or after the element formation layer 1919 is sealed with the first sheet material and the second sheet material (at the stage shown in FIG. 21B). An example where the element formation layer 1919 and the battery are formed to be connected is explained below with reference to FIGS. 22A and 22B and FIGS. 23A and 23B.

In FIG. 20B, conductive films 1931a and 1931b which are electrically connected to the conductive films 1915a and 1915b, respectively are formed at the same time as the conductive films 1917a and 1917b which function as antennas. Then, the insulating film 1918 is formed so as to cover the conductive films 1917a, 1917b, 1931a, and 1931b, followed by formation of openings 1932a and 1932b so that the surfaces of the conductive films 1931a and 1931b are exposed. After that, as shown in FIG. 22A, openings are formed in the element formation layer 1919 by laser light irradiation, and the first seat material 1932 is attached to one surface of the element formation layer 1919 (the surface where the insulating film 1918 is exposed), so that the element formation layer 1919 is peeled from the substrate 1901.

Next, as shown in FIG. 22B, the second seat material 1921 is attached to the other surface of the element formation layer 1919 (the surface exposed by peeling), and the element formation layer 1919 is peeled from the first seat material 1920. Therefore, a material with low viscosity is used as the first seat material 1920. Then, conductive films 1934a and 1934b which are electrically connected to the conductive films 1931a and 1931b respectively through the openings 1932a and 1932b are selectively formed.

The conductive films 1934a and 1934b are formed with a conductive material by a CVD method, a sputtering method, a printing method such as screen printing or gravure printing, a droplet discharging method, a dispenser method, a plating method, or the like. The conductive films 1934a and 1934b are formed of a single layer or a stacked layer of an element selected from among aluminum (Al), titanium (Ti), silver (Ag), copper (Cu), gold (Au), platinum (Pt), nickel (Ni), palladium (Pd), tantalum (Ta), and molybdenum (Mo), or an alloy material or a compound material containing the element as its main component.

It is to be noted that although the example shown here is the case where the conductive films 1934a and 1934b are formed after peeling the element formation layer 1919 from the substrate 1901, the element formation layer 1919 may be peeled from the substrate 1901 after the formation of the conductive films 1934a and 1934b.

Figure 23A:
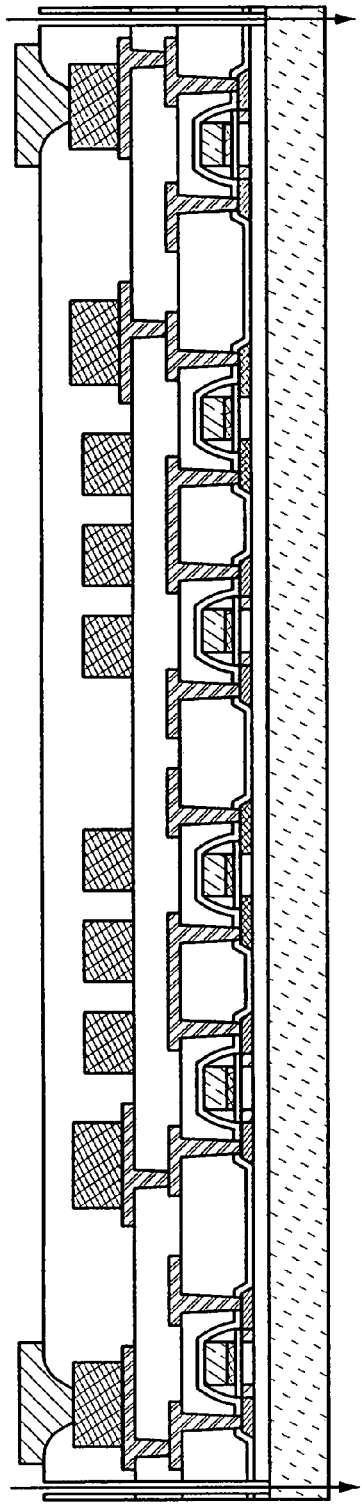
FIGS. 23A and 23B are diagrams illustrating an example of a method for manufacturing a semiconductor device of the present invention.

Next, as shown in FIG. 23A, in the case where a plurality of elements is formed over the substrate, the element formation layer 1919 is cut into individual elements. A laser irradiation apparatus, a dicing apparatus, a scribing apparatus, or the like can be used for cutting. Here, the plurality of elements formed over one substrate is separated from one another by laser light irradiation.

Figure 23B:
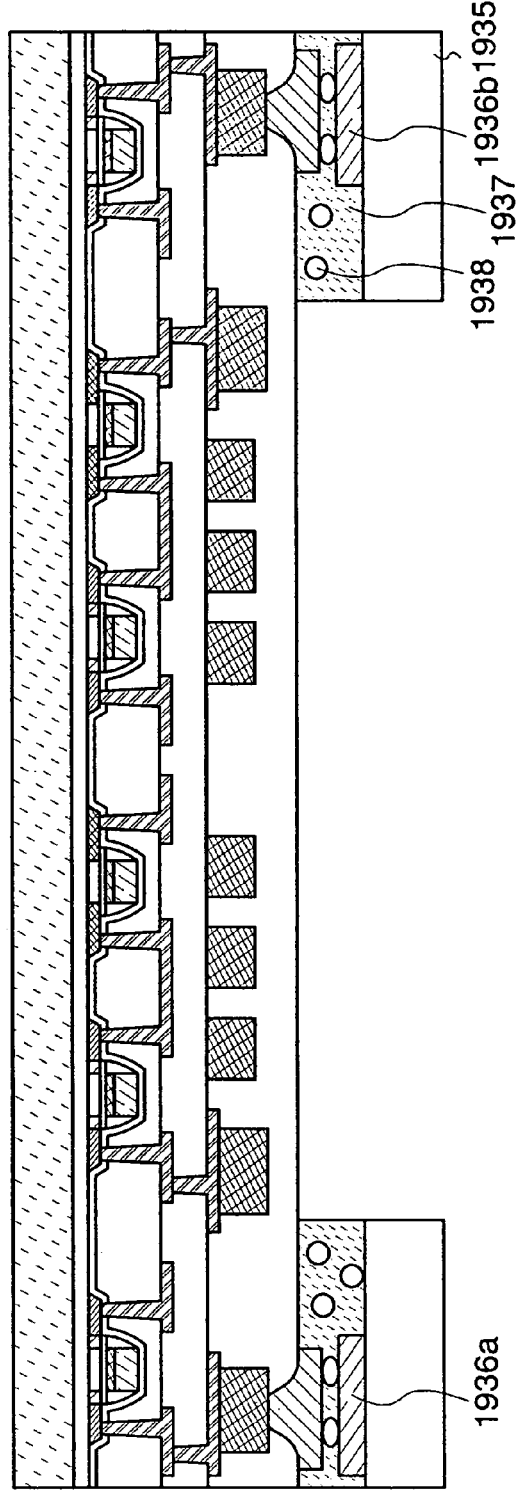

Next, as shown in FIG. 23B, the separated elements are electrically connected to a connection terminal of the battery. Here, the conductive films 1934a and 1934b provided in the element formation layer 1919 are respectively connected to conductive films 1936a and 1936b each of which is a connection terminal of the battery, which are provided over a substrate 1935. Here, connection between the conductive films 1934a and 1936a or connection between the conductive films 1934b and 1936b is performed by pressure bonding with an adhesive material such as an anisotropic conductive film (ACF) or an anisotropic conductive paste (ACP). Here, the example in which connection is performed using conductive particles 1938 included in an adhesive resin 1937. Alternatively, a conductive adhesive such as a silver paste, a copper paste, or a carbon paste; solder bonding; or the like can be used.

Figure 37:
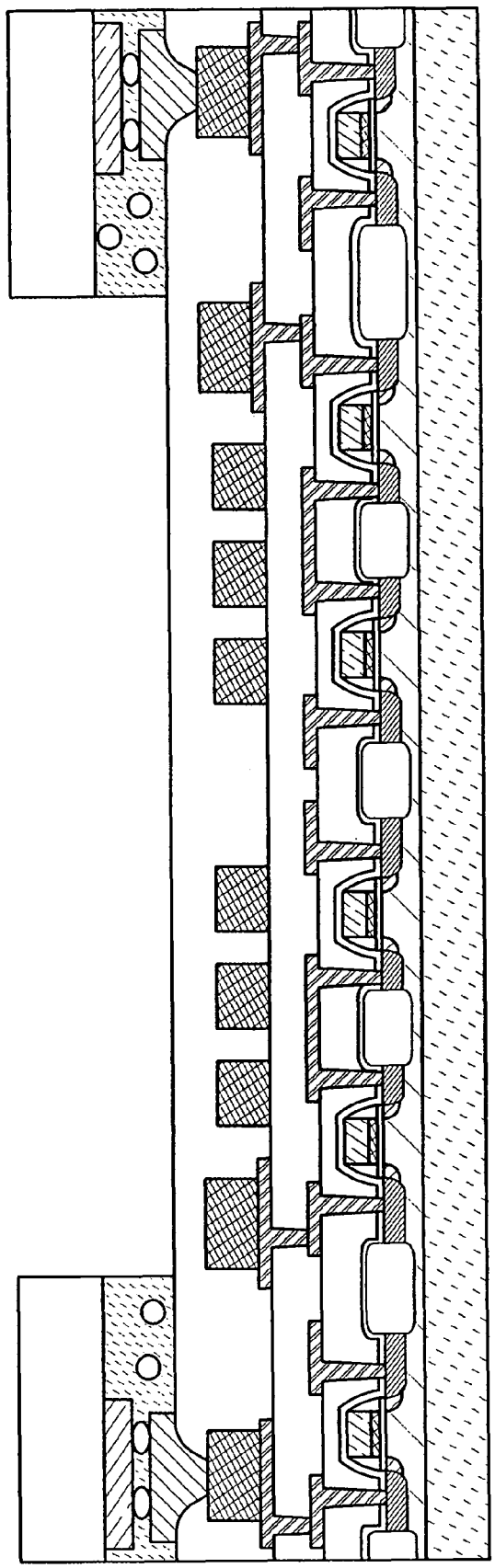
FIG. 37 is a diagram illustrating an example of a method for manufacturing a semiconductor device of the present invention.

In the case where, the battery is bigger than the element, the number of elements which can be formed over one substrate can be increased by formation of a plurality of elements over one substrate and connection of the elements to the battery after separation of the elements; thus, the semiconductor device can be manufactured at lower cost. It is to be noted that although the case of forming a thin film transistor is shown in this embodiment mode, a MOS (Metal Oxide Semiconductor) transistor may be employed. An example in which a MOS transistor is formed is shown in FIG. 37. The MOS transistor shown in FIG. 37 is formed using a semiconductor substrate. Typically, a single crystal silicon substrate is employed as a semiconductor substrate. Although a thickness of the semiconductor substrate is 100 to 300 μm, the thickness may be thinned to be 10 to 100 μm by polishing. In addition, transistors are separated from each other by an element separation insulating layer. The element separation insulating layer can be formed using a LOCOS (Local Oxidation of Silicon) technique in which a mask such as a nitride film is formed over the semiconductor substrate and an oxide film for element separation is formed by thermal oxidation. Alternatively, the element separation insulating layer may be formed in such a manner, by an STI (Shallow Trench Isolation) technique, that a trench is formed in the semiconductor substrate, the trench is filled with an insulating film, and planarization is performed to the insulating film. With an STI technique, sidewalls of the element separation insulating layer can be precipitous, so that an element separation width can be reduced. An n well and a p well are formed in the semiconductor substrate, and an n-channel transistor and a p-channel transistor can be formed as a so-called double well structure. Alternatively, a single well structure may be employed. It is to be noted that FIG. 37 illustrates the MOS transistor replaced with the thin film transistor in the semiconductor device shown in FIG. 23B, and thus, detailed explanation of each layer is omitted.

Through the above steps, the semiconductor device can be manufactured. It is to be noted that although the step of peeling the element such as the thin film transistor from the substrate after forming the element over the substrate is shown in this embodiment mode, the element formed over the substrate may be used as a product without being peeled from the substrate. In addition, after an element such as a thin film transistor is formed over a glass substrate, the glass substrate may be polished from an opposite side of a surface over which the element is formed, or after a MOS transistor is formed using a semiconductor substrate made of silicon or the like, the semiconductor substrate may be polished, so that reduction in film thickness and size of the semiconductor device can be achieved.

It is to be noted that this embodiment mode can be implemented in combination with other embodiment modes in this specification.

Embodiment Mode 4

In this embodiment mode, an example of a charging method of a semiconductor device of the present invention will be explained.

Figure 24:
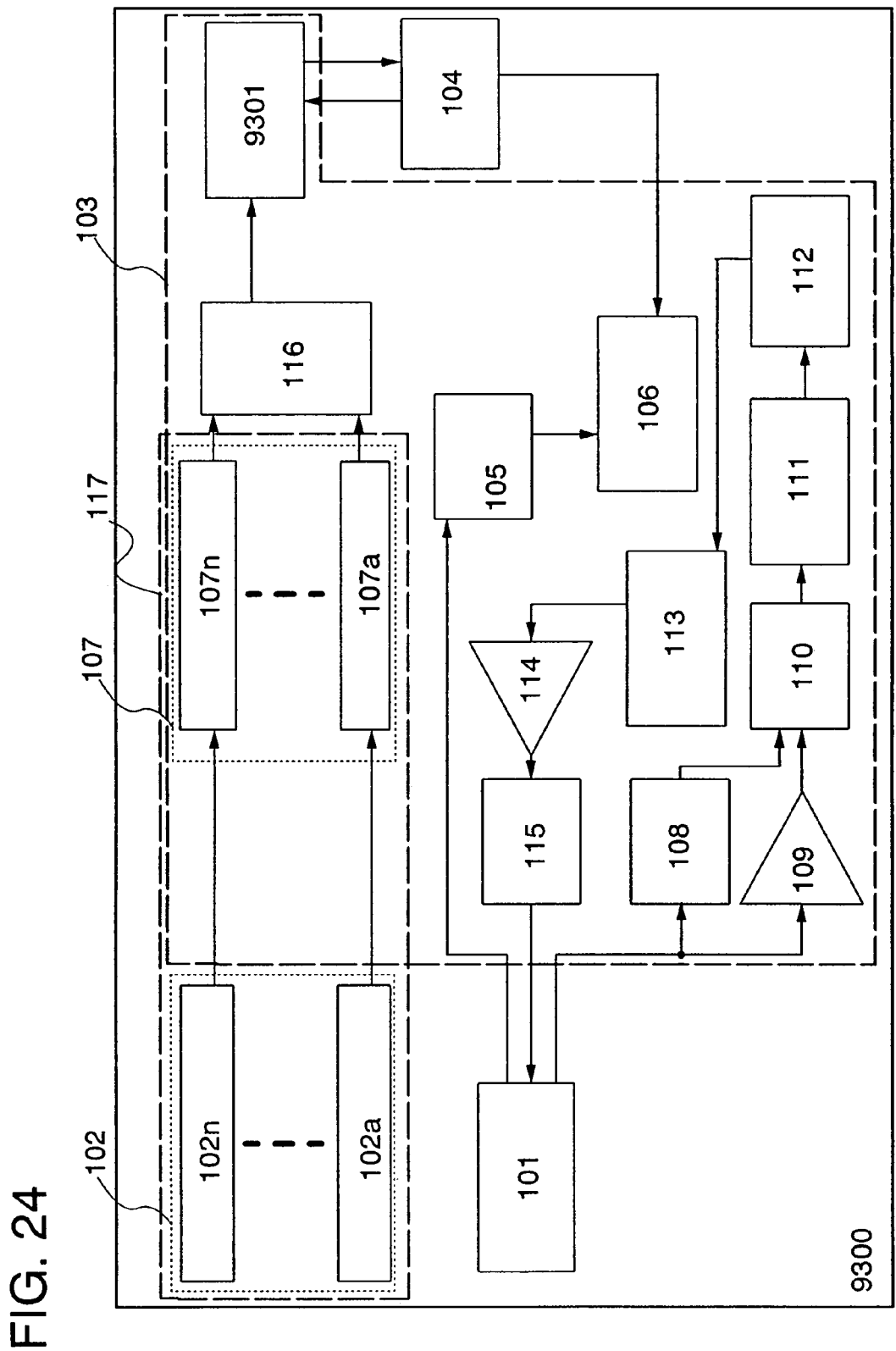
FIG. 24 is a diagram illustrating one structural example of a semiconductor device of the present invention.

A semiconductor device 9300 of this embodiment mode, which is shown in FIG. 24, has a structure of the semiconductor device 100 shown in FIG. 1, to which a charging/discharging control circuit 9301 is added. The charging/discharging control circuit 9301 controls timing of charging and discharging of the battery 104.

For example, charging and discharging of the battery 104 may be performed at the same time by the charging/discharging control circuit 9301. In other words, electric power outputted from the N-th rectifier circuit 107n can be supplied to the battery 104 for charging regardless of whether the battery 104 is used for a power supply of the signal processing circuit 103.

Furthermore, the charging/discharging control circuit 9301 may have a function of stopping charging the battery 104 when a voltage of the battery 104 reaches a specified voltage, in order not to overcharge the battery 104.

Figure 25:
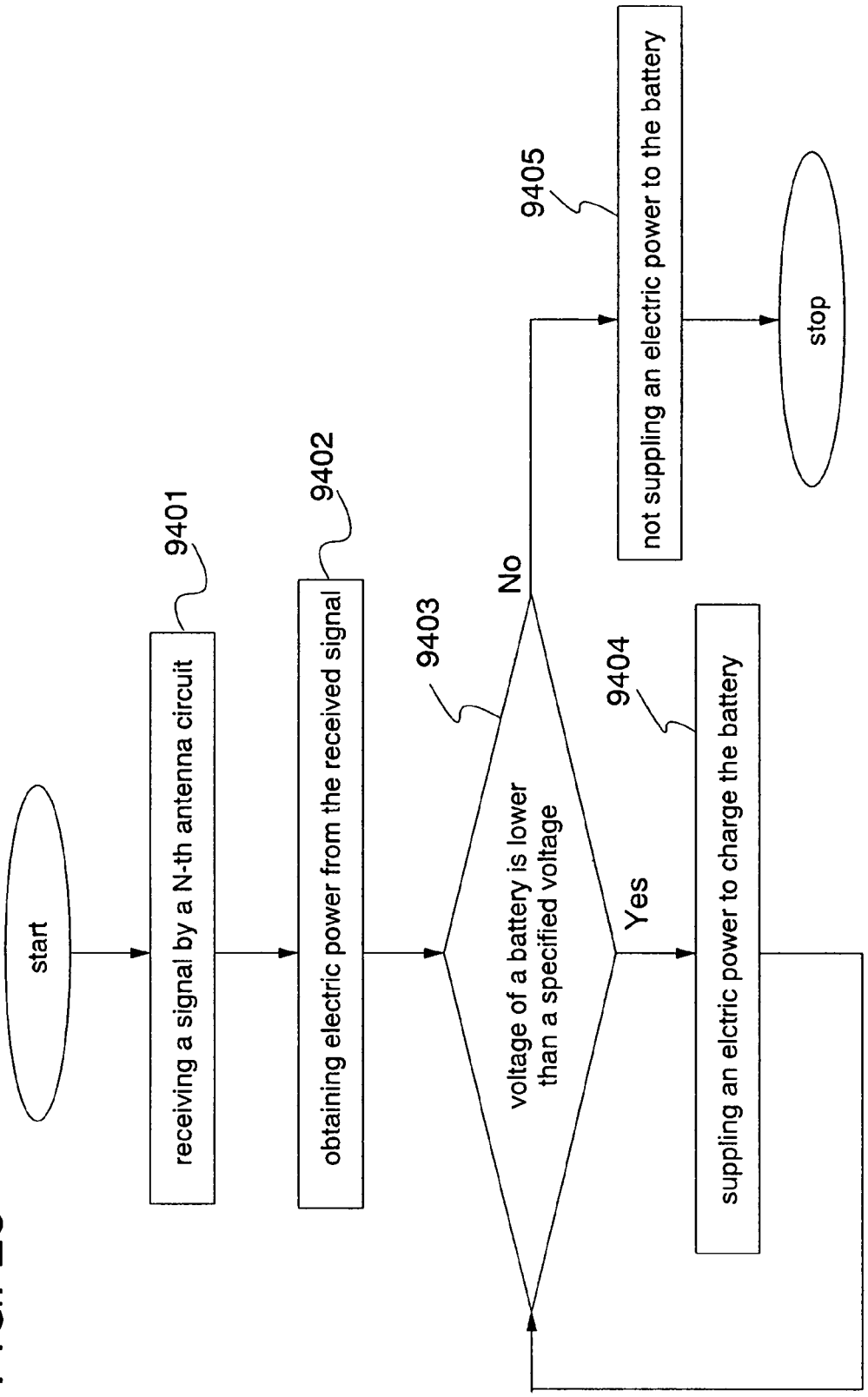
FIG. 25 is a diagram illustrating an example of a method for operating a semiconductor device of the present invention.

An example of a flow chart in this case is shown in FIG. 25. The flow chart shown in FIG. 25 is briefly explained. First, the N-th antenna circuit 102n receives a signal (STEP 9401). Then, the signal received by the N-th antenna circuit 102n is rectified by the N-th rectifier circuit 107n to obtain electric power (STEP 9402). Electric power outputted from the N-th rectifier circuit 107n is supplied to the charging/discharging control circuit 9301 through the charging circuit 116. Then, the charging/discharging control circuit 9301 determines whether a voltage of the battery 104 is lower than a specified voltage (STEP 9403). When the voltage is lower than the specified voltage, the charging/discharging control circuit 9301 supplies the electric power outputted from the N-th rectifier circuit 107n for a certain period of time to charge the battery 104 (STEP 9404). When the voltage is the specified voltage or higher (the case where STEP 9403 and STEP 9404 are repeated, so that the voltage becomes the specified voltage or higher is included), the charging/discharging control circuit 9301 does not supply the electric power outputted from the N-th rectifier circuit 107n to the battery 104 (STEP 9405). The above-described operations are performed each time a signal is received by the N-th antenna circuit 102n.

It is to be noted that the present invention is not limited to the above-described structure. The charging/discharging control circuit 9301 may have a function of charging the battery 104 when the voltage of the battery 104 is lower than the specified voltage, and stopping charging the battery 104 when the voltage of the battery 104 reaches the specified voltage. An example of a flow chart in this case is shown in FIG. 26.

Figure 26:
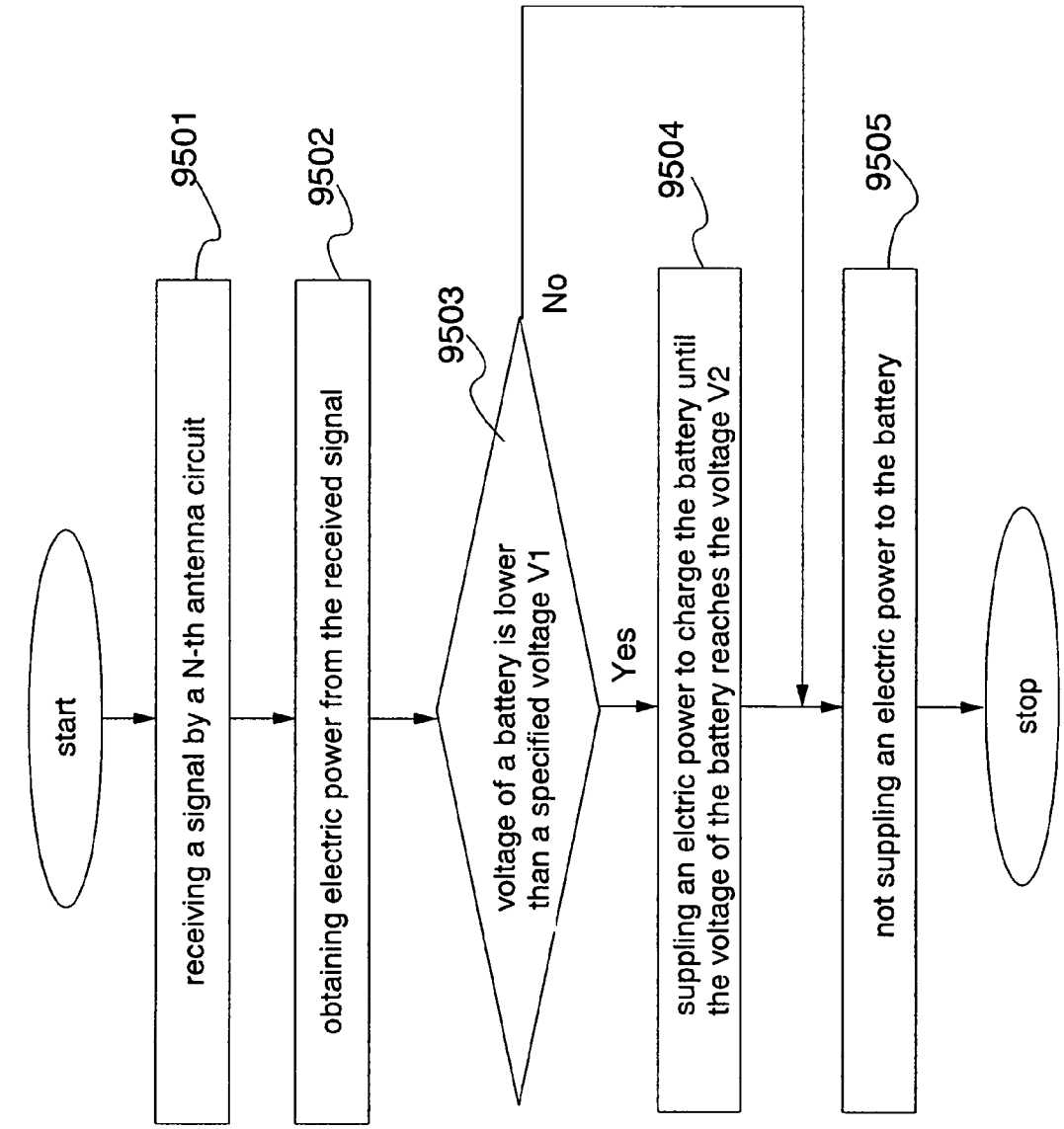
FIG. 26 is a diagram illustrating an example of a method for operating a semiconductor device of the present invention.

FIG. 26 is briefly explained. First, the N-th antenna circuit 102n receives a signal (STEP 9501). Then, the signal received by the N-th antenna circuit 102n is rectified by the N-th rectifier circuit 107n to obtain electric power (STEP 9502). Electric power outputted from the N-th rectifier circuit 107n is supplied to the charging/discharging control circuit 9301 through the charging circuit 116. Then, the charging/discharging control circuit 9301 determines whether a voltage of the battery 104 is lower than a specified voltage V1 (STEP 9503). When the voltage is lower than the specified voltage V1, the charging/discharging control circuit 9301 supplies the electric power outputted from the N-th rectifier circuit 107n for a certain period of time to charge the battery 104 until the voltage of the battery 104 reaches a specified voltage V2 (V2>V1) (STEP 9504). When the voltage of the battery 104 is the specified voltage V1 or higher (the case where the voltage of the battery 104 reaches the voltage V2 or higher according to STEP 9504 is included), the charging/discharging control circuit 9301 does not supply the electric power outputted from the N-th rectifier circuit 107n to the battery 104 (STEP 9505). The above-described operations are performed each time a signal is received by the N-th antenna circuit 102n.

Alternatively, either one of charging or discharging is performed to the battery 104. That is, when a signal is not received by the first antenna circuit 101, the charging/discharging control circuit 9301 enables the battery 104 to be charged, and when a signal is received by the first antenna circuit 101, the charging/discharging control circuit 9301 stops charging the battery 104 and enables electric power to be discharged from the battery 104. In this case, the charging/discharging control circuit 9301 is connected to the power supply circuit. An example of a flow chart in this case is shown in FIG. 27.

Figure 27:
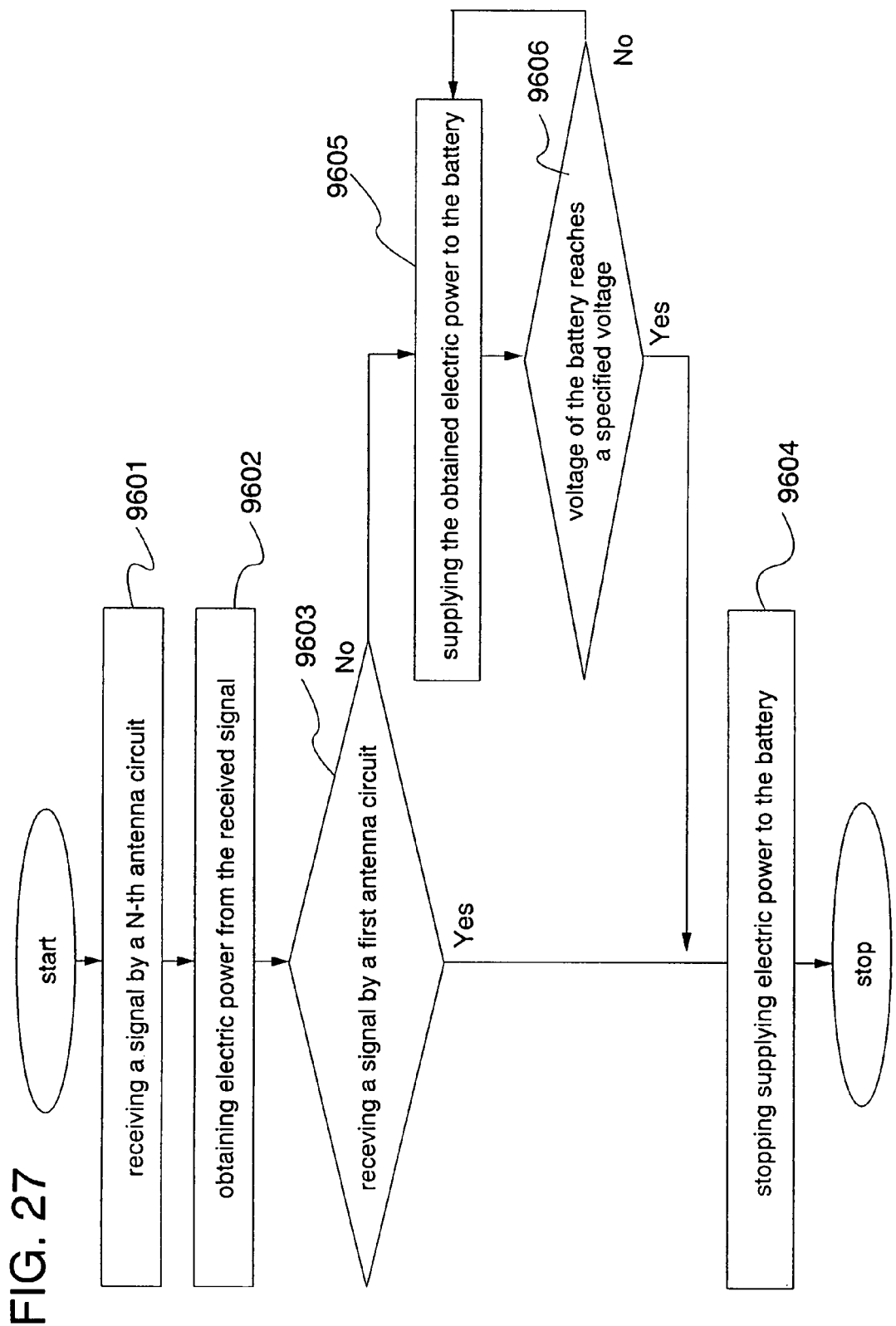
FIG. 27 is a diagram illustrating an example of a method for operating a semiconductor device of the present invention.

FIG. 27 is briefly explained. First, the N-th antenna circuit 102n receives a signal (STEP 9601). Then, the signal received by the N-th antenna circuit 102n is rectified by the N-th rectifier circuit 107n to obtain electric power (STEP 9602). The electric power outputted from the N-th rectifier circuit 107n is supplied to the charging/discharging control circuit 9301 through the charging circuit 116. When the first antenna circuit 101 is receiving a signal, for example, a signal for transmitting information thereof is outputted from the logic circuit 110 to the charging/discharging control circuit 9301 (STEP 9603). Then, the charging/discharging control circuit 9301 stops supplying electric power from the N-th rectifier circuit 107n to the battery 104 (STEP 9604). When the first antenna circuit 101 is not receiving a signal, the charging/discharging control circuit 9301 supplies the electric power outputted from the N-th rectifier circuit 107n to charge the battery 104 so that a voltage of the battery 104 reaches a specified voltage (STEP 9605 and STEP 9606). When the voltage of the battery 104 reaches the specified voltage, the charging/discharging control circuit 9301 stops supplying the electric power outputted from the N-th rectifier circuit 107n to the battery 104 (STEP 9604). The above-described operations are performed each time a signal is received by the second antenna circuit 102.

Alternatively, the charging/discharging control circuit 9301 may have a function of charging the battery 104 with electric power corresponding to consumed power of the battery 104 after a signal is received by the first antenna circuit 101, processed by the signal processing circuit 103, and then transmitted from the first antenna circuit 101. An example of a flow chart in this case is shown in FIG. 28.

Figure 28:
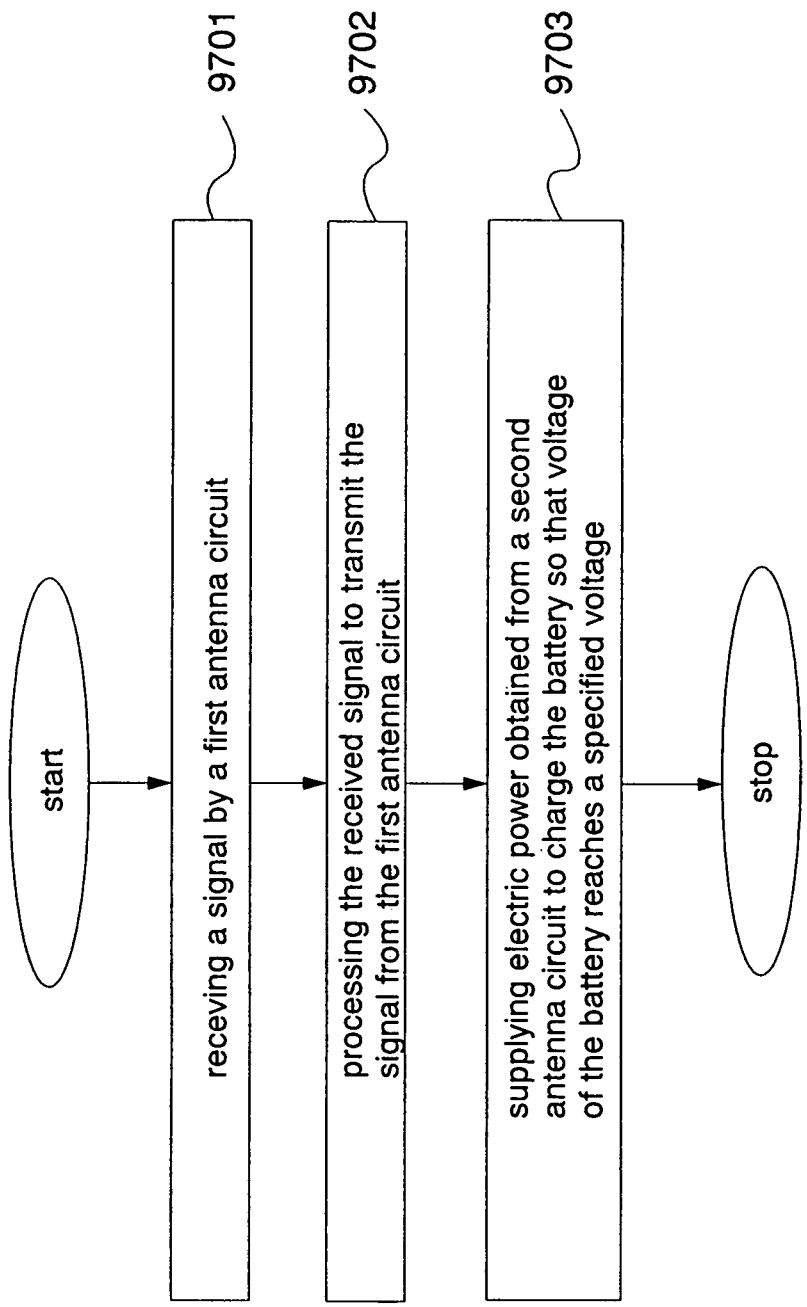
FIG. 28 is a diagram illustrating an example of a method for operating a semiconductor device of the present invention.

FIG. 28 is briefly explained. First, the first antenna circuit 101 receives a signal (STEP 9701). Then, the signal received by the first antenna circuit 101 is processed by the signal processing circuit 103, and then the signal is transmitted from the first antenna circuit 101 (STEP 9702). After that, the charging/discharging control circuit 9301 supplies electric power obtained from a signal received by the N-th antenna circuit 102n to charge the battery 104 so that a voltage of the battery reaches a specified voltage (STEP 9703). Specifically, the battery 104 is charged to the specified voltage each time a signal is transmitted by the first antenna circuit 101, so that electric power corresponding to consumed electric power can be charged.

It is to be noted that the charging/discharging control circuit 9301 may have not only a function of preventing overcharging but also a function of preventing over discharging.

It is to be noted that this embodiment mode can be implemented in combination with other embodiment modes in this specification.

Embodiment Mode 5

In this embodiment mode, a structure of a semiconductor device of this embodiment mode, which boosts a voltage outputted from a battery by synchronizing the voltage with a signal received by an antenna circuit in order to generate a power supply voltage.

Figure 29:
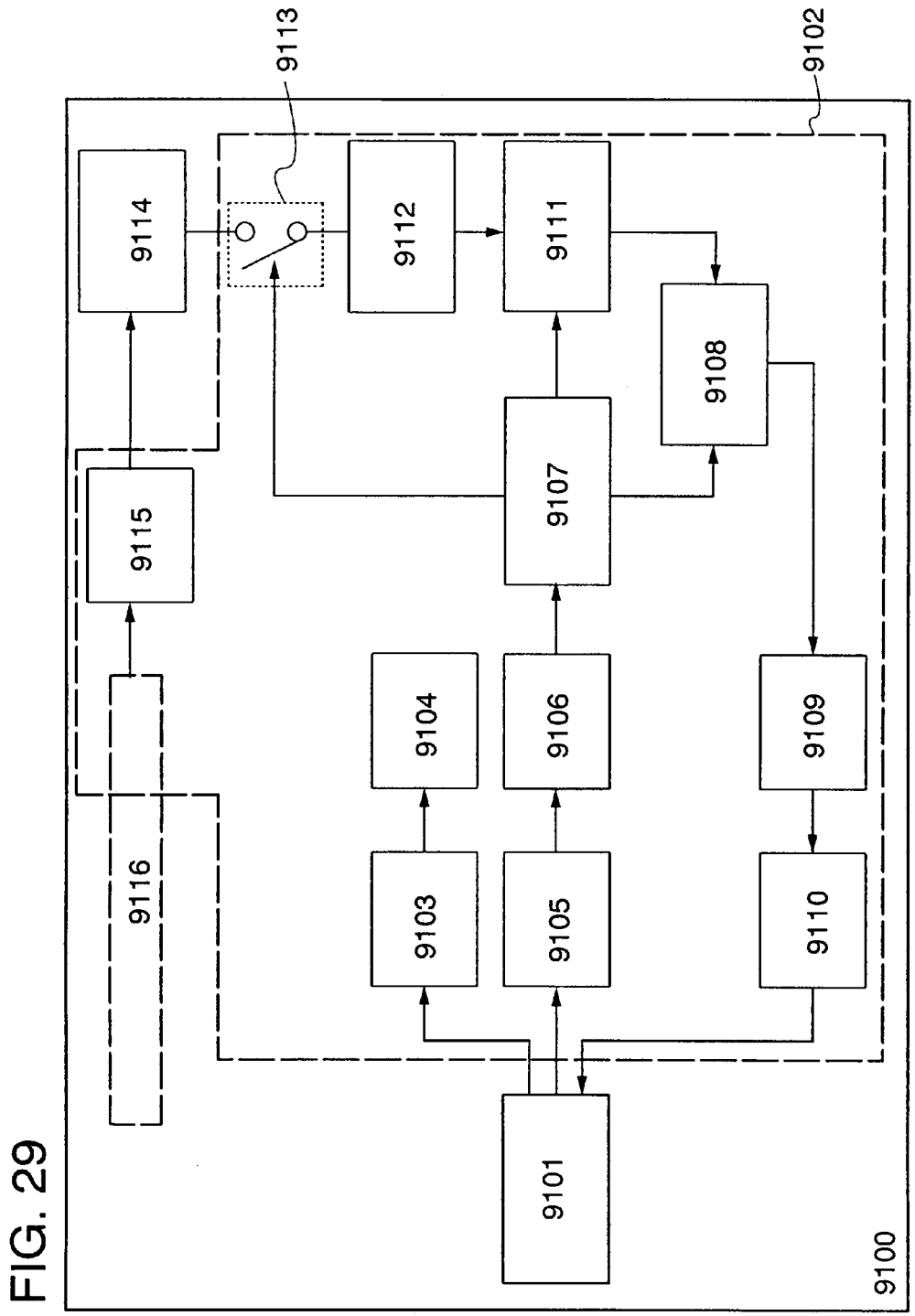
FIG. 29 is a diagram illustrating one structural example of a semiconductor device of the present invention.

FIG. 29 is a block diagram illustrating a structural example of a semiconductor device 9100 of this embodiment mode.

The semiconductor device 9100 shown in FIG. 29 boosts a voltage outputted from the battery by synchronizing the voltage with a received signal. Then, the boosted voltage is used for power supply voltage of a level shifter circuit 9111 for increasing amplitude of data to be written to nonvolatile memory.

The semiconductor device 9100 of this embodiment mode includes an antenna circuit 9101, a signal processing circuit 9102, a battery 9114, a charging circuit 9115, and an antenna-rectifier circuit group 9116.

In the antenna-rectifier circuit group 9116, a plurality of pairs of antenna and rectifier circuit is gathered. The antenna-rectifier circuit group 9116 is connected to the battery 9114 through the charging circuit 9115. The battery 9114 is charged by a radio wave received by the antennas included in the antenna-rectifier circuit group 9116 through the charging circuit 9115.

Various modes can be employed for the shape of each antennas included in the antenna circuit 9101 and the antenna-rectifier circuit group 9116. For example, the shapes described in Embodiment Mode 1, which are shown in FIGS. 6A to 6E, can be employed. In addition, a so-called dipole antenna, loop antenna, Yagi antenna, patch antenna, micro antenna, or the like can be used. In the case of forming an antenna over a substrate over which a transistor included in the signal processing circuit 9102 is formed, a micro loop antenna, a micro dipole antenna, or the like is preferably used.

In addition, the antenna circuit 9101 and each antenna included in the antenna-rectifier circuit group 9116 may include a means of changing frequency of a received signal. For example, when a loop antenna is used for the antenna, a resonant circuit may be formed by an antenna coil included in the antenna and a capacitor, and the capacitance of the capacitor may be made variable, so that the frequency of a corresponding signal can be changed.

As the battery 9114, following secondary batteries can be used: a lithium ion battery, a lithium secondary battery, a nickel hydride battery, a nickel cadmium battery, an organic radical battery, a lead-acid battery, an air secondary battery, a nickel zinc battery, a silver zinc battery, and the like. The battery is not limited to them, and a high-capacity capacitor may be used. In particular, a lithium ion battery and a lithium secondary battery have high charging and discharging capacity. Therefore, it is used as a battery provided for a semiconductor device of this embodiment mode, and thus miniaturization of the semiconductor device can be achieved. It is to be noted that an active material or an electrolyte of a lithium ion battery is formed by a sputtering method; therefore, the battery 9114 may be formed over a substrate over which the signal processing circuit 9102 is formed or a substrate over which the antenna circuit 9101 is formed. The battery 9114 is formed over the substrate over which the signal processing circuit 9102 or the antenna circuit 9101 is formed, and thus yield is improved. In a metal lithium battery, a transition metal oxide including lithium ions, a metal oxide, a metal sulfide, an iron compound, a conductive polymer, an organic sulfur compound, or the like is used for an anode active material; lithium (alloy) is used for a cathode active material; and an organic electrolyte solution, a polymer electrolyte, or the like is used for an electrolyte. Therefore, the battery 9114 can have higher charging and discharging capacity.

The signal processing circuit 9102 includes a rectifier circuit 9103, a power supply circuit 9104, a demodulation circuit 9105, a logic circuit 9106, a memory control circuit 9107, a memory circuit 9108, a logic circuit 9109, a modulation circuit 9110, a level shifter circuit 9111, a booster circuit 9112, and a switch 9113. For example, nonvolatile memory can be used for the memory circuit 9108.

The rectifier circuit 9103 rectifies and smoothes an AC signal received by the antenna circuit 9101. A voltage outputted from the rectifier circuit 9103 is supplied to the power supply circuit 9104. In the power supply circuit 9104, desired voltage is generated. Then, a power supply voltage is supplied from the power supply circuit 9104 to various circuits of the signal processing circuit 9102.

The semiconductor device of this embodiment mode processes a signal as described below. A communication signal received by the antenna circuit 9101 is inputted to the demodulation circuit 9105. The communication signal is usually transmitted after carrier waves with 13.56 MHz, 915 MHz, or the like are processed by ASK modulation or PSK modulation.

FIG. 29 shows an example of a case where a communication signal of 13.56 MHz is used. The communication signal subjected to ASK modulation or PSK modulation is demodulated in the demodulation circuit 9105. The demodulated signal is transmitted to the logic circuit 9106 to be analyzed. The signal analyzed by the logic circuit 9106 is transmitted to a memory control circuit 9107, and accordingly, a memory circuit 9108 is controlled by the memory control circuit 9107.

In the case where the signal transmitted to the memory control circuit 9107 includes a read instruction of data from the memory circuit 9108, the memory control circuit 9107 retrieves data stored in the memory circuit 9108, and then the data is transmitted to a logic circuit 9109. The data transmitted to a logic circuit 9109 is encoded in the logic circuit 9109. After that, the modulation circuit 9110 modulates a carrier by the signal.

Next, in a case where the signal transmitted to the memory control circuit 9107 includes a write instruction of data to the memory circuit 9108, the memory control circuit 9107 turns on the switch 9113. Then, a voltage is supplied from the battery 9114 to the booster circuit 9112, and the supplied voltage is boosted. Furthermore, the level shifter circuit 9111 level-shifts data to be written to the memory circuit 9108, which is inputted from the memory control circuit 9107, with the voltage boosted by the booster circuit 9112. The data which has been level-shifted and thus has a large amplitude is written to the memory circuit 9108.

As described above, the semiconductor device 9100 of this embodiment mode is operated.

In addition, the power supply circuit 9104 is not connected to the battery 9114 in FIG. 29. However, needless to say, the battery 9114 may be connected to the power supply circuit 9104 and the power supply circuit 9104 may be driven using the battery 9114.

Although a communication signal of 13.56 MHz is described in this embodiment mode, the present invention is not limited to this. For example, with a communication signal of 125 kHz, UHF band frequency, 2.45 GHz, or the like can be used. It is to be noted that this embodiment mode is not limited to the structure shown in FIG. 29.

It is to be noted that this embodiment mode can be implemented in combination with other embodiment modes in this specification.

Embodiment Mode 6

In this embodiment mode, a structure of a semiconductor device of this embodiment mode will be explained, which enables transmission to a distance by using a voltage outputted from a battery by synchronizing the voltage with a signal received by an antenna circuit.

Figure 30:
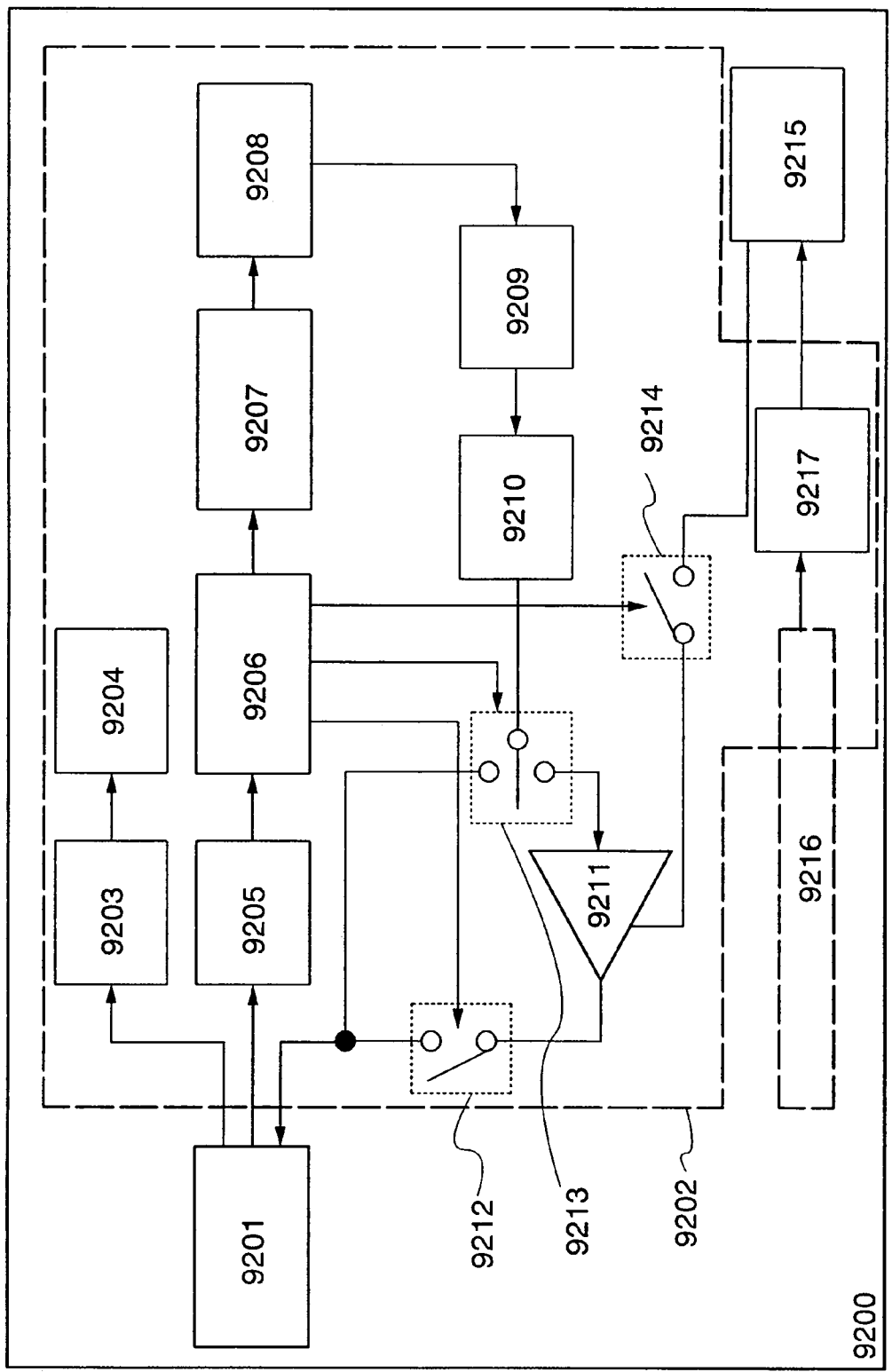
FIG. 30 is a diagram illustrating one structural example of a semiconductor device of the present invention.

FIG. 30 is a block diagram illustrating an example of a structure of a semiconductor device 9200 of this embodiment mode.

The semiconductor device 9200 shown in FIG. 30 determines a transmission distance depending on a received signal. When a transmission distance is short, a signal modulated by a modulation circuit 9210 is supplied to an antenna circuit 9201, whereas when a transmission distance is long, a signal modulated by the modulation circuit 9210 is amplified by an amplifier 9211, and then supplied to the antenna circuit 9201. Furthermore, the amplifier 9211 is operated by a voltage of a battery 9215.

It is to be noted that an antenna-rectifier circuit group 9216 in which a plurality of pairs of antenna and rectifier circuit is gathered is connected to the battery 9215. The battery 9215 is charged through a charging circuit 9217 by a radio wave received by the antennas included in the antenna-rectifier circuit group 9216.

The semiconductor device of this embodiment mode includes an antenna circuit 9201, a signal processing circuit 9202, and the battery 9215.

Various modes can be employed for the shape of the antenna of the antenna circuit 9201. For example, the shapes described in Embodiment Mode 1, which is shown in FIG. 6, can be employed. In addition, a so-called dipole antenna, loop antenna, Yagi antenna, patch antenna, or micro antenna can be used. In the case of forming an antenna over a substrate over which a transistor included in the signal processing circuit is formed, a micro loop antenna, a micro dipole antenna, or the like is preferably used.

In addition, the antenna circuit 9201 may include a means of changing frequency of a received signal. For example, when a loop antenna is used for the antenna circuit 9201, a resonant circuit may be formed by an antenna coil forming an antenna and a capacitor.

As the battery 9215, following secondary batteries can be used: a lithium ion battery, a lithium secondary battery, a nickel hydride battery, a nickel cadmium battery, an organic radical battery, a lead-acid battery, an air secondary battery, a nickel zinc battery, a silver zinc battery, and the like. The battery is not limited to them, and a high-capacity capacitor may be used. In particular, a lithium ion battery and a lithium secondary battery have high charging and discharging capacity. Therefore, it is used as a battery provided for a semiconductor device of Embodiment Mode 2, and thus, reduction in size of the semiconductor device can be achieved. It is to be noted that an active material or an electrolyte of a lithium ion battery is formed by a sputtering method; therefore, the battery 9215 may be formed over a substrate over which the signal processing circuit 9202 is formed or a substrate over which the antenna circuit 9201 is formed. The battery 9215 is formed over the substrate over which the signal processing circuit 9202 or the antenna circuit 9201 is formed, and thus yield is improved. In a metal lithium battery, a transition metal oxide including lithium ions, a metal oxide, a metal sulfide, an iron compound, a conductive polymer, an organic sulfur compound, or the like is used for an anode active material; lithium (alloy) is used for a cathode active material; and an organic electrolyte solution, a polymer electrolyte, or the like is used for an electrolyte. Therefore, the battery 9215 can have higher charging and discharging capacity.

The signal processing circuit 9202 includes a rectifier circuit 9203, a power supply circuit 9204, a demodulation circuit 9205, a logic circuit 9206, a memory control circuit 9207, a memory circuit 9208, a logic circuit 9209, a modulation circuit 9210, an amplifier 9211, a switch 9212, a switch 9213, and a switch 9214. Various memory can be used for the memory circuit 9208. For example, mask ROM or nonvolatile memory can be used.

The rectifier circuit 9203 rectifies and smoothes an AC signal received by the antenna circuit 9201. A voltage outputted from the rectifier circuit 9203 is supplied to the power supply circuit 9204. In the power supply circuit 9204, a desired voltage is generated. Then, a voltage to be power supply of various circuits of the signal processing circuit 9202 is supplied from the power supply circuit 9204.

The semiconductor device of Embodiment Mode 2 of the present invention processes a signal as described below. A communication signal received by the antenna circuit 9201 is inputted to the demodulation circuit 9205. The communication signal is usually transmitted after carrier waves with 13.56 MHz, 915 MHz, or the like are processed by ASK modulation or PSK modulation.

FIG. 30 is an example of the case where a communication signal of 13.56 MHz is used. The communication signal subjected to ASK modulation or PSK modulation is received by the antenna circuit 9201 and demodulated in the demodulation circuit 9205. The demodulated signal is transmitted to the logic circuit 9206 to be analyzed. The signal analyzed by the logic circuit 9206 is transmitted to a memory control circuit 9207 by which a memory circuit 9208 is controlled. Then, the memory control circuit 9207 transmits data stored in the memory circuit 9208 to a logic circuit 9209. After the data is encoded by the logic circuit 9209, the modulation circuit 9210 modulates the carrier by the signal. When a transmission distance is short, the modulated signal is transmitted to the antenna circuit 9101, whereas when a transmission distance is long, the modulated signal is transmitted to the amplifier 9211 to be amplified, and then transmitted to the antenna circuit 9101.

In other words, whether a transmission distance is long or short is determined depending on a signal transmitted to the logic circuit 9206, and the logic circuit 9206 controls the switches 9212 to 9214. When the transmission distance is determined to be short, the switch 9213 connects the modulation circuit 9210 to the antenna circuit 9201, and the switches 9212 and 9214 are turned off. When the transmission distance is determined to be long, the switch 9213 connects the modulation circuit 9210 to the amplifier 9211, and the switches 9212 and 9214 are turned on. That is to say, when the transmission distance is determined to be long, the amplifier 9211 amplifies the signal outputted from the modulation circuit 9210 by using as a power supply voltage outputted from the battery 9215, and then transmits the signal to the antenna circuit 9201.

It is to be noted that, as for a method for determining a transmission distance, a control signal for determining a transmission distance may be transmitted to the logic circuit 9206 in advance, or a transmission distance may be determined depending on intensity of a signal demodulated in the demodulation circuit 9205.

Moreover, the power supply circuit 9204 is not connected to the battery 9215 in FIG. 30. However, needless to say, the battery 9215 may be connected to the power supply circuit 9204 and the power supply circuit 9204 may be driven using the battery 9215.

It is to be noted that this embodiment mode can be implemented in combination with other embodiment mode in this specification.

Embodiment Mode 7

An application example of the semiconductor device of the present invention will be explained.

In this embodiment, description is made of applications of a semiconductor device which communicates data by wireless communication in the present invention. A semiconductor device of the present invention can be used as a so-called ID label, ID tag, and ID card provided in, for example, bills, coins, securities, bearer bonds, documents (such as driver's licenses or resident's cards), packaging containers (such as wrapping paper or bottles), storage media (such as DVD software or video tapes), vehicles (such as bicycles), personal belongings (such as bags or glasses), foods, plants, animals, human bodies, clothing, everyday articles, tags on goods such as an electronic device or on packs. An electronic device refers to a liquid crystal display device, an EL display device, a television set (also simply called a TV set, a TV receiver, or a television receiver), a mobile phone, and the like.

In this embodiment, an application of the present invention and an example of a product with the RFID are described with reference to FIGS. 31A to 31E.

Figure 31A:
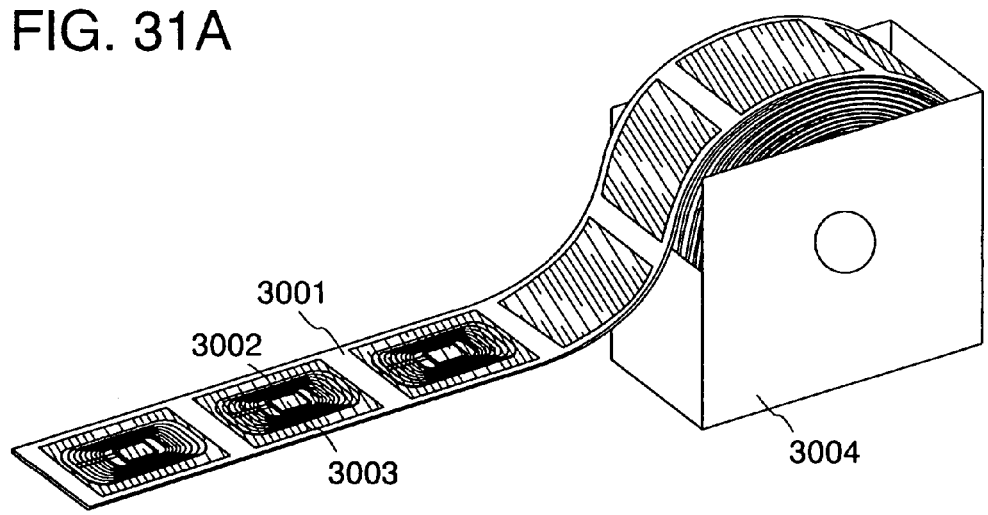
FIGS. 31A to 31E are diagrams each illustrating an example of a usage pattern of a semiconductor device of the present invention.

FIG. 31A shows an example of a state of completed products of semiconductor devices having RFIDs of the present invention. On a label board (separate paper) 3001, a plurality of ID labels 3003 each incorporating an RFID 3002 are formed. The ID labels 3003 are held in a box 3004. In addition, on the ID label 3003, information on a product or service (a name of the product, a brand, a trademark, a trademark owner, a seller, a manufacturer, and the like) is written, while an ID number that is unique to the product (or the kind of the product) is assigned to the incorporated RFID to make it possible to easily figure out forgery, infringement of intellectual property rights such as a patent right and a trademark right, and illegality such as unfair competition. In addition, a lot of information that is too much to write clearly on a container of the product or the label, for example, the production area, selling area, quality, raw material, efficacy, use, quantity, shape, price, production method, usage, time of the production, time of the use, use-by date, expiration date, instructions of the product, information on the intellectual property of the product and the like can be input in the RFID so that a transactor and a consumer can access the information by using a simple reader.

Figure 31B:
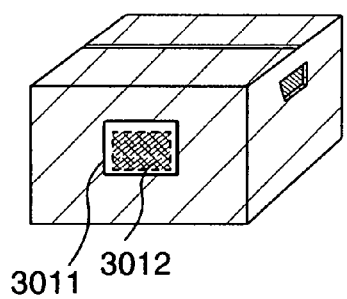

FIG. 31B shows a label-shaped ID tag 3011 incorporating an RFID 3012. By being provided with the ID tag 3011, the products can be managed easily. For example, in the case where the product is stolen, the pathway of the product is traced so that where the product is stolen in the distribution pathway can be figured out quickly. Thus, by being provided with the ID tag, products that are superior in so-called traceability can be distributed.

Figure 31C:
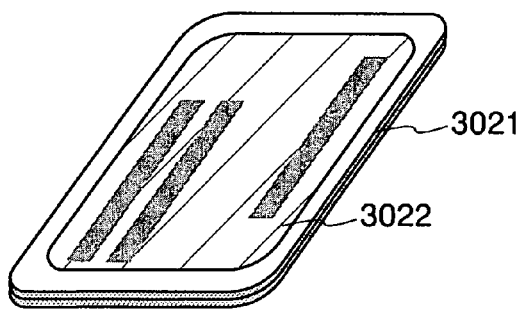

FIG. 31C shows an example of a state of a completed product of an ID card 3021 including an RFID 3022 of the present invention. The ID card 3021 includes all kinds of cards such as a cash card, a credit card, a prepaid card, an electronic ticket, electronic money, a telephone card, and a membership card.

Figure 31D:
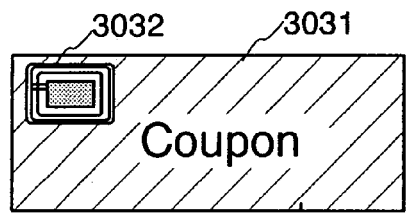

FIG. 31D shows an example of a state of a completed product of a bearer bond 3031. An RFID 3032 is embedded in the bearer bond 3031 and is protected by a resin formed in the periphery thereof. Here, the resin is filled with a filler. The bearer bond 3031 can be formed in the same manner as an ID label, an ID tag, and an ID card of the present invention. It is to be noted that the aforementioned bearer bond includes stamps, tickets, admission tickets, merchandise coupons, book coupons, stationery coupons, beer coupons, rice coupons, various gift coupons, various service coupons, and the like. Needless to say, it is not limited thereto. In addition, when the RFID 3032 of the present invention is provided in bills, coins, securities, bearer bonds, documents, or the like, an authentication function can be provided; therefore, forgery can be prevented by use of the authentication function.

Figure 31E:
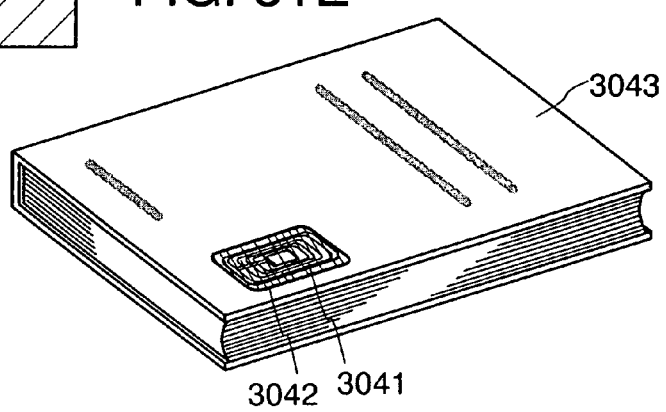

FIG. 31E shows a book 3043 to which an ID label 3041 including a semiconductor device 3042 of the present invention is attached. The semiconductor device 3042 of the present invention is attached to a surface or embedded therein, whereby the semiconductor device 3042 is fixed on goods. As shown in FIG. 31E, the semiconductor device 3042 can be embedded in paper in the case of a book, or embedded in an organic resin in the case of a package made of an organic resin, whereby the semiconductor device 3042 is fixed on goods.

In addition, although not shown here, the efficiency of a system such as an inspection system can be improved by provision of the semiconductor device of the present invention in, for example, packaging containers, storage media, personal belongings, foods, clothing, everyday articles, electronic devices, or the like. In addition, counterfeits and theft can be prevented by provision of the semiconductor device on vehicles. Individual creatures such as animals can be easily identified by being implanted with the semiconductor device. For example, year of birth, sex, breed, or the like can be easily identified by implantation of the semiconductor device in creatures such as domestic animals.

Figure 32A:
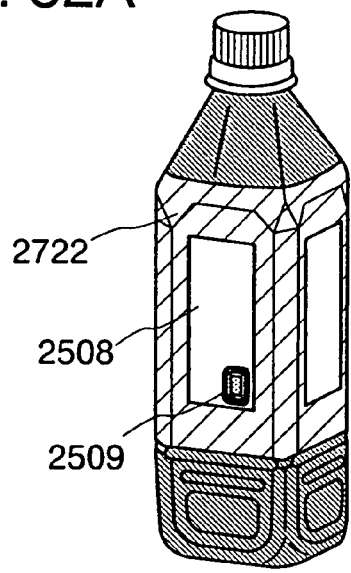
FIG. 32A to 32C are diagrams each illustrating an example of a usage pattern of a semiconductor device of the present invention.

FIG. 32A shows a plastic bottle 2722 to which an ID label 2508 of the present invention is attached. Furthermore, in the case of a non-contact type thin-film integrated circuit device, an antenna and a chip can be formed over the same substrate to make it easier to transfer the non-contact type thin-film integrated circuit device directly to a product with a curved surface.

Figure 32B:
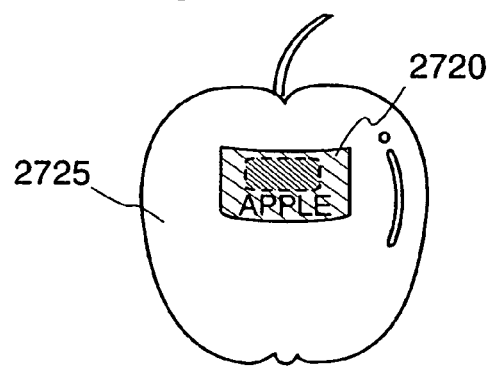
Figure 32C:
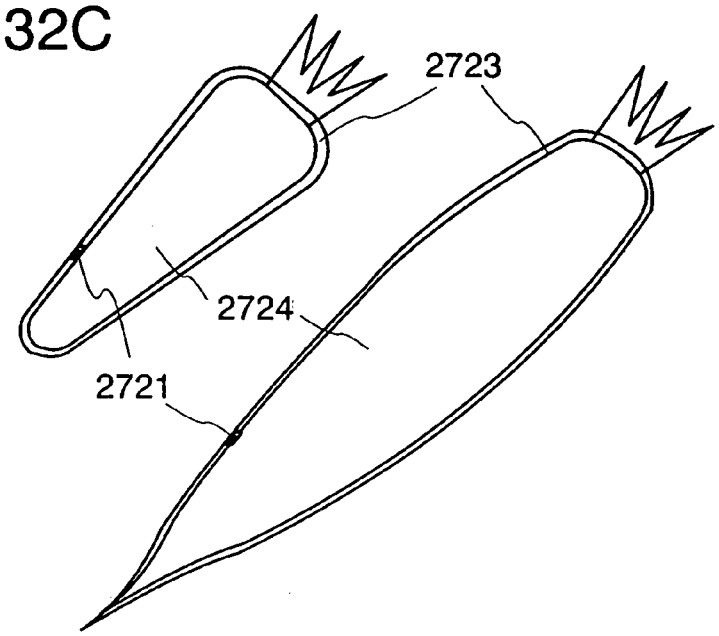

FIG. 32B shows a state in which an ID label 2720 is directly attached to fruits 2705. In addition, FIG. 32C shows an example in which vegetables 2724 are each wrapped in a wrapping film 2723. When an IC chip 2721 is attached to a product, there is a possibility that the IC chip is peeled off. However, when the product is wrapped in the wrapping film, it is difficult to peel off the wrapping film 2723, which brings some merit for security. In addition, harvested date, manufacturing date, or the like of fresh foods may be recorded in the ID label, so that management of the product can be easily performed.

The semiconductor device of the present invention can be used for all products without being limited to the above-described products.

An intended use of a movable electronic device provided with the power receiving device of the present invention is explained. As examples of the movable electronic device provided with the power receiving device of the present invention, the following can be given: a mobile phone, a digital video camera, a computer, a portable information terminal (such as a mobile computer, a mobile phone, a portable game machine, or an e-book reader), an image reproduction device including a recording medium (specifically, a digital versatile disc (DVD)), and the like. Hereinafter, an example thereof is explained with reference to drawings.

It is to be noted that, in this embodiment, concerning the antenna circuit described in Embodiment Mode 2, only its form and mounting position are described, and thus, it is simply referred to as an antenna.

Figure 33A:
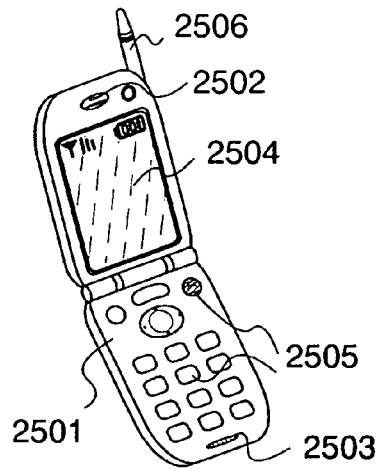
FIG. 33A to 33F are diagrams each illustrating an example of a usage pattern of a power receiving device of the present invention.

FIG. 33A shows an example of a mobile phone that includes a main body 2501, an audio output portion 2502, an audio input portion 2503, a display portion 2504, operation switches 2505, an antenna 2506, and the like. The power receiving device of the present invention includes a signal processing circuit and a battery inside the main body 2501, and receives electric power transmitted by a wireless signal from outside the device through the antenna 2506, so that the battery can be charged. Accordingly, when charging the battery, electric power can be supplied to display of the display portion 2504, and the like without using a battery charger.

Figure 33B:
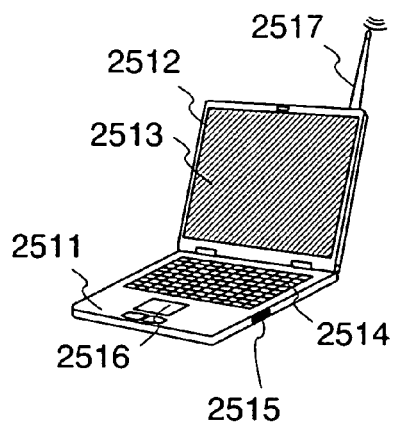

FIG. 33B shows an example of a mobile computer (also known as a laptop computer) that includes a main body 2511, a housing 2512, a display portion 2513, a keyboard 2514, an external connection port 2515, a pointing device 2516, an antenna 2517, and the like. A power receiving device of the present invention includes inside the main body 2511a signal processing circuit and a battery, and receives electric power transmitted by a wireless signal from outside the device through the antenna 2517, so that a battery can be charged. Accordingly, when charging the battery, electric power can be supplied to the display of the display portion 2513, and the like without using a battery charger.

Figure 33C:
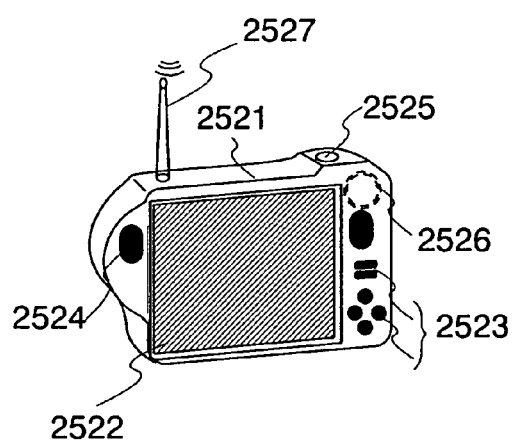

FIG. 33C shows an example of a digital camera that includes a main body 2521, a display portion 2522, operation keys 2523, a speaker 2524, a shutter button 2525, an image receiving portion 2526, an antenna 2527, and the like. The power receiving device of the present invention includes a signal processing circuit and the battery inside the main body 2521, and receives electric power transmitted by a wireless signal from outside the device through the antenna 2527, so that a battery can be charged. Accordingly, when charging the battery, electric power can be supplied to the display of display portion 2522, and the like without using a battery charger.

Figure 33D:
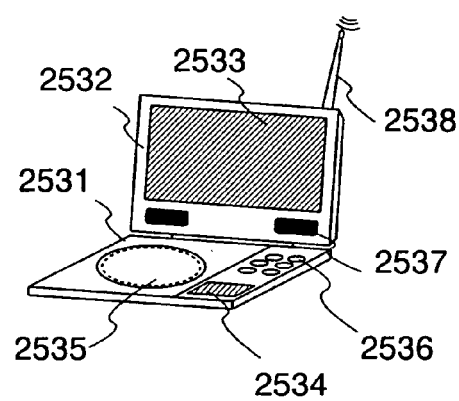

FIG. 33D shows an example of a portable image reproduction device (specifically, a DVD reproduction device) including a recording medium. The portable image reproduction device includes a main body 2531, a housing 2532, a first display portion 2533, a second display portion 2534, a recording medium (e.g., a DVD) reading portion 2535, operation keys 2536, a speaker portion 2537, an antenna 2538, and the like. A power receiving device of the present invention includes a signal processing circuit and a battery inside the main body 2531, and receives electric power transmitted by a wireless signal from outside the device through the antenna 2538, so that the battery can be charged. Accordingly, when charging the battery, electric power can be supplied to display of the first display portion 2533 and the second display portion 2534, and the like without using a battery charger.

Figure 33E:
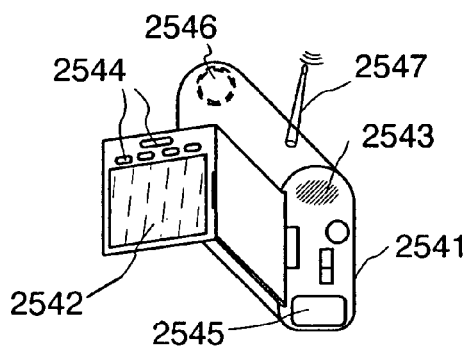

FIG. 33E shows a digital video camera that includes a main body 2541, a display portion 2542, an audio input portion 2543, operation switches 2544, a battery 2545, an image receiving portion 2546, an antenna 2547, and the like. A power receiving device of the present invention includes a signal processing circuit and a battery inside the main body 2541, and receives electric power by a wireless signal from outside the device through the antenna 2547, so that a battery can be charged. Accordingly, when charging the battery, electric power can be supplied to display of the display portion 2542, and the like without using a battery charger.

Figure 33F:
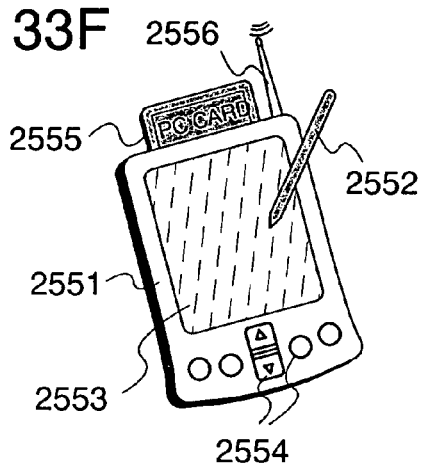

FIG. 33F shows a portable information terminal that includes a main body 2551, a stylus 2552, a display portion 2553, operation buttons 2554, an external interface 2555, an antenna 2556, and the like. A power receiving device of the present invention includes a signal processing circuit and a battery inside the main body 2551, and receives electric power transmitted by a wireless signal from outside the device through the antenna 2556, so that a battery can be charged. Accordingly, when charging the battery, electric power can be supplied to display of the display portion 2553, and the like without using a battery charger.

Figure 34A:
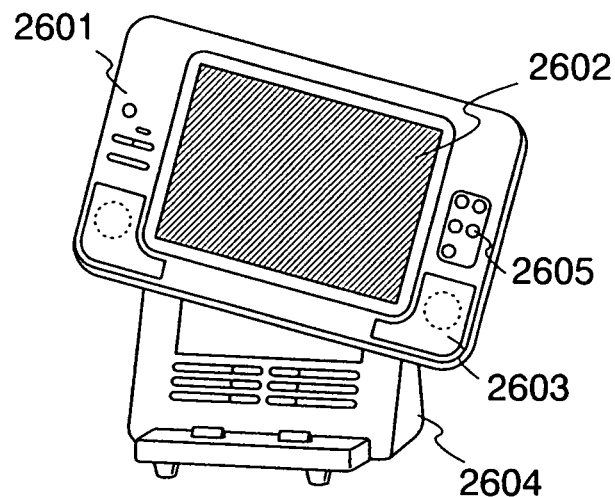
FIGS. 34A and 34B are diagrams each illustrating an example of a usage pattern of a power receiving device of the present invention.

FIG. 34A shows a wireless television receiver having a portable display. An image signal receiver and the power receiving device of the present invention are built into a housing 2601. The battery inside the power receiving device drives a display portion 2602 and speaker portions 2603. The battery can be charged by a signal which is transmitted from a power feeder 2604 wirelessly. The signal transmitted wirelessly is transmitted/received between an antenna 2606A provided on the display side and an antenna 2606B provided on the power feeder side, so that electric power can be supplied.

Figure 34B:
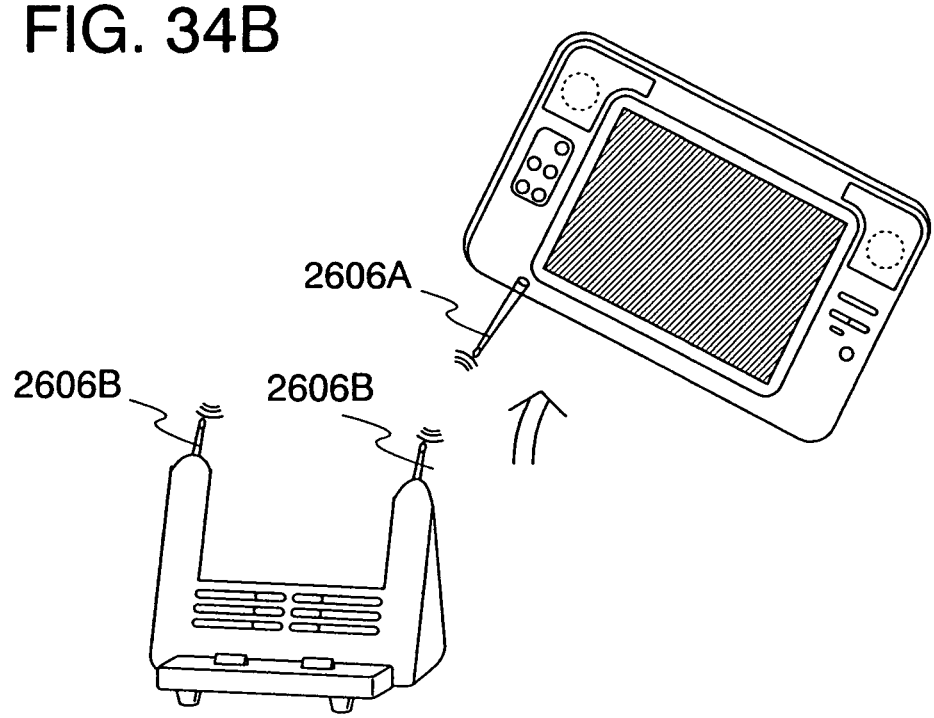

In addition, the power feeder 2604 can transmit and receive image signals. Therefore, even if the display is detached from the power feeder, as shown in FIG. 34B, image signals can be transmitted to the signal receiver of the display. The housing 2601 is controlled by the operation keys 2605. In addition, in the device shown in FIGS. 34A and 34B, when the operation keys 2605 are operated, a signal can be transmitted from the housing 2601 to the power feeder 2604, and thus, the device can also be referred to as an audio-visual two-way transmission device. Moreover, when the operation keys 2605 are operated, a signal can be transmitted from the housing 2601 to the power feeder 2604, and furthermore, when another electronic device is made to receive a signal that can be transmitted from the power feeder 2604, communication control of another electronic device is possible. Therefore, the power feeder 2604 can also be referred to as a general-purpose remote control device.

It is to be noted that the power feeder 2604 is provided with the display portion 2602 and the speaker portions 2603, so that the device can be used as a stationary television. When the device has the form of a stationary television, it may have a structure in which the power feeder 2604 is directly connected to and supplies electric power to the display portion 2602 and the speaker portions 2603.

Figure 35A:
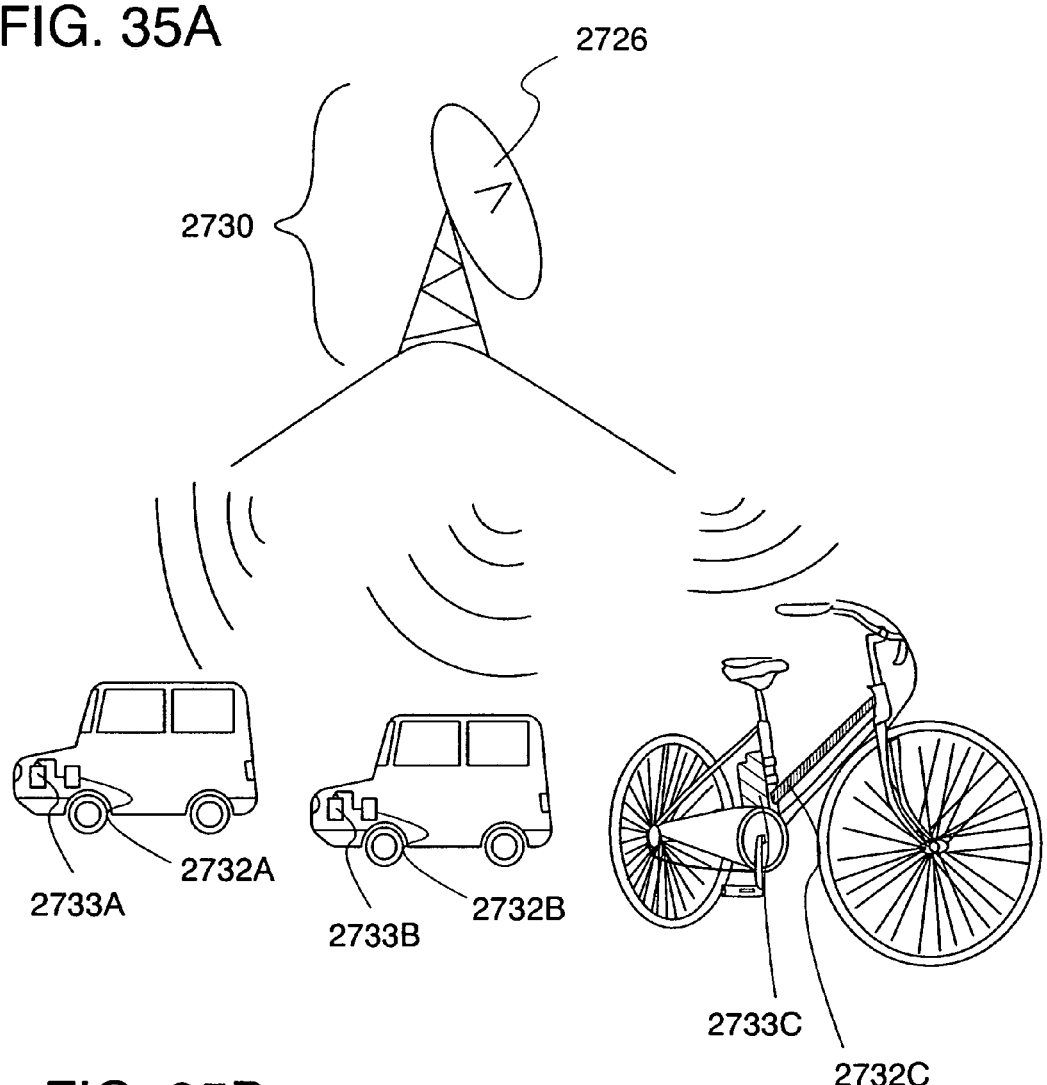
FIGS. 35A and 35B are diagrams each illustrating an example of a usage pattern of a power receiving device of the present invention.

In addition, an electric power supply system for a movable electronic device such as a motor vehicle or a bicycle having a battery using a large-size power feeder, shown in FIG. 35A, is explained.

A power feeder 2730 shown in FIG. 35A employs a parabolic antenna 2726 having a reflective surface that is parabolically curved, and transmits electric power to a motor vehicle or a bicycle provided with a power receiving device including an antenna and a battery (antennas 2732A, 2732B, 2732C and batteries 2733A, 2733B, 2733C). Thus, this is usually particularly advantageous when electric power generation of a motor vehicle by a generator utilizing motive power of a combustion engine is difficult, that is, when a battery is dead. Moreover, even if a battery runs out of power in a bicycle utilizing motive power by electric power, with a so-called bicycle with an assist facility, on hills or the like where traveling by human power is difficult, charging of the battery can be completed by electric power supplied to the battery for a certain period of time. This structure is advantageous for a bicycle with a battery because the battery can be charged without using a household alternating current power supply, and thus, the bicycle user is relieved of the burden of charging the battery using a cable.

Figure 35B:
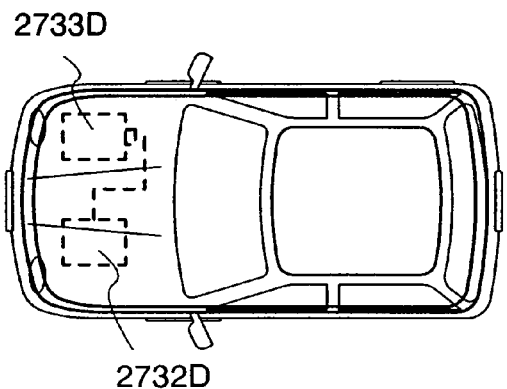

A structure of a motor vehicle provided with a power receiving device is shown in FIG. 35B. The motor vehicle includes an antenna 2732D and a battery 2733D. As shown in FIG. 35B, the antenna may be provided along outermost circumstance of the motor vehicle, or may be provided in a plurality of places, such as a windshield and a rear windshield.

In addition, the structure of the power feeder and the power receiving device provided in a movable electronic device can take wide variety of forms. An example thereof is explained with reference to FIGS. 36A and 36B.

Figure 36A:
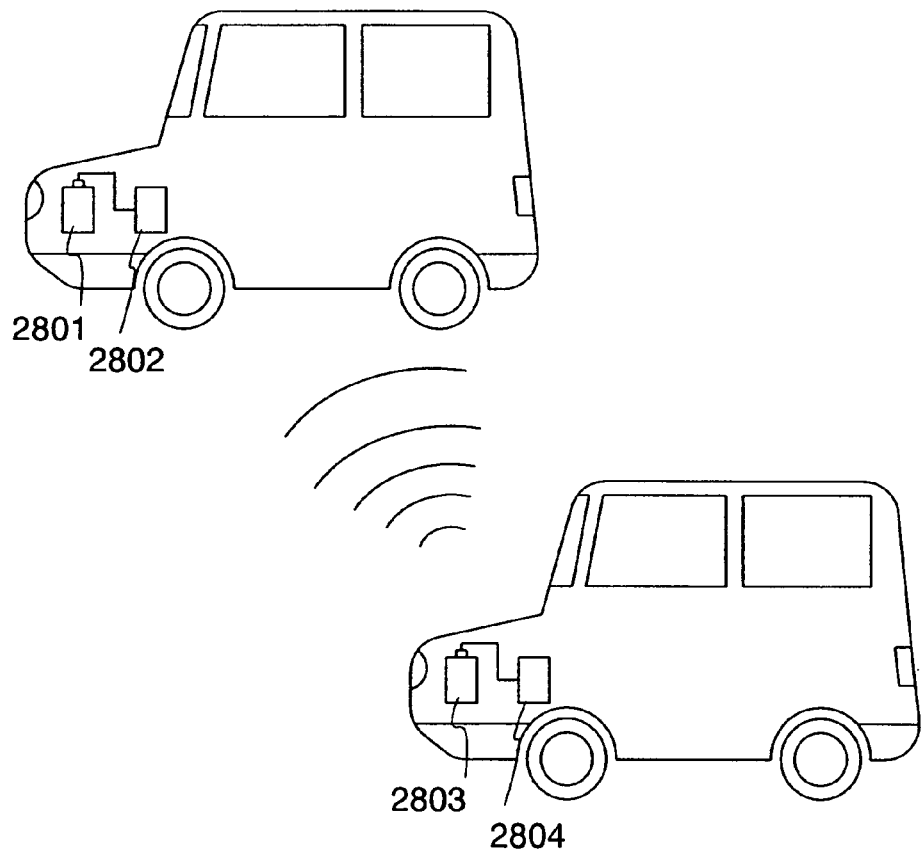
FIGS. 36A and 36B are diagrams each illustrating an example of a usage pattern of a power receiving device of the present invention.

FIG. 36A shows a structure of an electric power supply system that includes a power receiving device including a moving means and a power feeder, for motor vehicles. In FIG. 36A, the structure of each motor vehicle includes a battery and an antenna. Here, one of the motor vehicles includes an antenna and a battery 2801, and the antenna functions as a power receiving antenna 2802. Meanwhile, the other motor vehicle includes an antenna and a battery 2803, and the antenna functions as a power supplying antenna 2804.

In the structure shown in FIG. 36A, even if the battery 2801 of one motor vehicle runs out of power, the battery 2801 can be charged by output of charged electric power to the battery 2803 of the other motor vehicle from the power-supplying antenna 2804 to the power-receiving antenna 2802 as a wireless signal. It is to be noted that a distance between the power-receiving antenna 2802 and the power-supplying antenna 2804 is decreased and a wireless signal for supplying electric power is outputted, charging time can be reduced by electromagnetic induction which occurs due to magnetic coupling. In the structure shown in FIG. 36A, there is no need to connect the batteries of the motor vehicles by a cable in order to supply electric power, and thus, charging can be performed by electric power received through the antenna even if a user is waiting in the motor vehicles.

A different structure to the one shown in 36A is explained with reference to FIG. 36B. The structure shown in FIG. 36B is particularly advantageous for a so-called electric automobile, which obtains motive power from electric power.

Figure 36B:
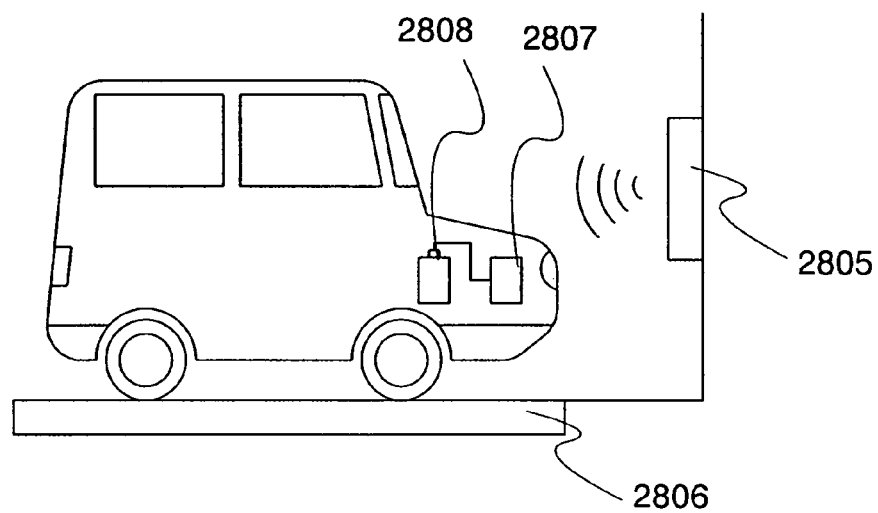

In the structure shown in FIG. 36B, when the motor vehicle comes above a piezoelectric sensor 2806, supply of electric power by a wireless signal from a power feeder 2805 is performed. When electric power is supplied by a wireless signal from the power feeder 2805, an antenna 2807 included in a power receiving device in the motor vehicle receives electric power, and a battery 2808 is charged. Accordingly, there is no need for a connection with a household AC power supply by a cable for the purpose of charging the battery 2808. The battery can be charged while a user is in the car, so that convenience can be improved.

The power receiving device of the present invention can be provided and used in any product as long as it is driven by electric power.

It is to be noted that, in each mode of the movable electronic device shown in this embodiment, the form of the antenna is not limited to that shown in the drawing. The antenna can appropriately have the form shown in the above-described embodiment mode.

This embodiment mode can be freely combined with the above-described embodiment modes.

This application is based on Japanese Patent Application serial no. 2006-237047 filed in Japan Patent Office on Aug. 31, in 2006, the entire contents of which are hereby incorporated by reference.

What is claimed is:

1. A semiconductor device comprising:
a first antenna circuit and a first chip including a signal processing circuit over a first substrate; and
a second antenna circuit, a third antenna circuit, a battery, and a second chip including a rectifier circuit and a charging circuit over a second substrate,
wherein the first substrate and the second substrate are spaced apart from each other,
wherein the first antenna circuit and the first chip are interposed between the first substrate and the second substrate, and
wherein the battery overlaps with the first chip, the first antenna circuit and the second antenna circuit.

2. A semiconductor device according to claim 1,
wherein the first antenna circuit transmits a signal including data stored in the signal processing circuit and receives a signal including data to be stored in the signal processing circuit, and
wherein the second antenna circuit and the third antenna circuit receive electric power for charging the battery.

3. A semiconductor device according to claim 1, further comprising:
a power supply circuit included in the signal processing circuit,
wherein the battery supplies electric power to the power supply circuit.

4. A semiconductor device according to claim 1, wherein the battery is one selected from the group consisting of a lithium battery, a nickel metal hydride battery, a nickel cadmium battery, and an organic radical battery.

5. A semiconductor device according to claim 4, wherein the lithium battery has a thickness of 10 to 100 μm.

6. A semiconductor device according to claim 1, wherein the first antenna circuit and the third antenna circuit have a coil shape.

7. A semiconductor device comprising:
a first antenna circuit and a first chip including a signal processing circuit over a first substrate; and
a second antenna circuit, a third antenna circuit, a battery, and a second chip including a rectifier circuit and a charging circuit over a second substrate,
wherein the first substrate and the second substrate are spaced apart from each other,
wherein the first antenna circuit and the first chip are interposed between the first substrate and the second substrate,
wherein the battery is electrically connected to the first chip and the second chip, and
wherein the battery overlaps with the first chip, the first antenna circuit and the second antenna circuit.

8. A semiconductor device according to claim 7,
wherein the first antenna circuit transmits a signal including data stored in the signal processing circuit and receives a signal including data to be stored in the signal processing circuit, and
wherein the second antenna circuit and the third antenna circuit receive electric power for charging the battery.

9. A semiconductor device according to claim 7, further comprising:
a power supply circuit included in the signal processing circuit,
wherein the battery supplies electric power to the power supply circuit.

10. A semiconductor device according to claim 7, wherein the battery is one selected from the group consisting of a lithium battery, a nickel metal hydride battery, a nickel cadmium battery, and an organic radical battery.

11. A semiconductor device according to claim 10, wherein the lithium battery has a thickness of 10 to 100 μm.

12. A semiconductor device according to claim 7, wherein the first antenna circuit and the third antenna circuit have a coil shape.

* * * * *